US011039048B2

(12) United States Patent
Jeong et al.

(10) Patent No.: US 11,039,048 B2
(45) Date of Patent: *Jun. 15, 2021

(54) DOORBELL CAMERA

(71) Applicant: GOOGLE LLC, Mountain View, CA (US)

(72) Inventors: Hae Rim Jeong, San Francisco, CA (US); Rengarajan Aravamudhan, Sunnyvale, CA (US); Jacobi Grillo, San Francisco, CA (US); Michael Dixon, Sunnyvale, CA (US); Yu-An Lien, Mountain View, CA (US); Minjung Kim, Sunnyvale, CA (US); Etienne Bérubé, San Francisco, CA (US); Rochus Jacob, San Francisco, CA (US); Brian Conner, San Jose, CA (US); Scott Mullins, San Francisco, CA (US)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/814,573

(22) Filed: Mar. 10, 2020

(65) Prior Publication Data
US 2020/0213484 A1 Jul. 2, 2020

Related U.S. Application Data

(63) Continuation of application No. 15/710,783, filed on Sep. 20, 2017, now Pat. No. 10,708,472, and a (Continued)

(30) Foreign Application Priority Data

Jan. 4, 2017 (EP) .......................... 003569169-0003

(51) Int. Cl.
H04N 7/18 (2006.01)
H04N 5/225 (2006.01)
(Continued)

(52) U.S. Cl.
CPC ............. *H04N 5/2252* (2013.01); *G08B 3/10* (2013.01); *H04N 7/186* (2013.01); *H05K 1/144* (2013.01); *H04N 5/2256* (2013.01)

(58) Field of Classification Search
CPC .... H04N 5/2252; H04N 7/186; H04N 5/2256; G08B 3/10; H05K 1/144
See application file for complete search history.

(56) References Cited

U.S. PATENT DOCUMENTS 4,967,046 A  10/1990 Priesemuth
D339,543 S    9/1993 Martin
(Continued)

FOREIGN PATENT DOCUMENTS

EP        3445046 A1      2/2019
JP       2010-198755      9/2010
WO   WO 2017/117137 A1   7/2017

OTHER PUBLICATIONS

Google, Notification of Registration, EU 004086437, Jul. 13, 2017, 6pgs.
(Continued)

*Primary Examiner* — John R Schnurr
(74) *Attorney, Agent, or Firm* — Shumaker & Sieffert, P.A

(57) ABSTRACT

This application is directed to a doorbell camera for illuminating and capturing scenes. The doorbell camera includes at least a subset of processors for operating a camera module, an image sensor having a field of view of a scene and configured to capture video of a portion of the scene, one or more infrared (IR) illuminators for providing illumination, a
(Continued)

waterproof button assembly, and a microphone and a speaker for enabling a real-time conversation between a visitor located at the doorbell camera and a user of a remote client device. The waterproof button assembly is configured to receive a user press on a button top, block water from entering the electronic device, and display a visual pattern uniformly at a peripheral region of the button assembly using LEDs and light guide component that are disposed under the button top.

19 Claims, 23 Drawing Sheets
(1 of 23 Drawing Sheet(s) Filed in Color)

Related U.S. Application Data continuation-in-part of application No. 29/609,547, filed on Jun. 30, 2017, now Pat. No. Des. 830,872.

(60) Provisional application No. 62/545,401, filed on Aug. 14, 2017.

(51) Int. Cl.
    *G08B 3/10*     (2006.01)
    *H05K 1/14*     (2006.01)

(56) References Cited

U.S. PATENT DOCUMENTS

| | | |
|---|---|---|
| D483,281 S | 12/2003 | Cobigo |
| D510,584 S | 10/2005 | Tierney |
| D548,749 S | 8/2007 | Schmidt et al. |
| D690,757 S | 10/2013 | Bart et al. |
| 8,937,659 B1 | 1/2015 | Scalisi et al. |
| D764,958 S | 8/2016 | Scalisi |
| D765,530 S | 9/2016 | Scalisi |
| D789,363 S | 6/2017 | Jentz et al. |
| D789,364 S | 6/2017 | Jentz et al. |
| D789,365 S | 6/2017 | Jentz et al. |
| D789,366 S | 6/2017 | Jentz et al. |
| D789,367 S | 6/2017 | Jentz et al. |
| D793,268 S | 8/2017 | Ye |
| D795,109 S | 8/2017 | Olodort et al. |
| D800,201 S | 10/2017 | Song |
| D805,570 S | 12/2017 | Shi |
| D806,154 S | 12/2017 | Shi |
| D828,201 S * | 9/2018 | Jeong ..................... D10/118.2 |
| 10,522,027 B1 | 12/2019 | Conner et al. |
| 2012/0056746 A1 | 3/2012 | Kaigler et al. |
| 2015/0341603 A1 | 11/2015 | Kasmir et al. |
| 2016/0191864 A1 | 6/2016 | Siminoff et al. |
| 2016/0219254 A1 * | 7/2016 | Hu ........................ H04N 7/186 |
| 2017/0272706 A1 * | 9/2017 | Jeong ...................... G08B 3/10 |
| 2018/0249134 A1 * | 8/2018 | Siminoff ............... H04N 7/188 |
| 2018/0261060 A1 * | 9/2018 | Siminoff .......... G08B 13/19684 |
| 2018/0322743 A1 | 11/2018 | Chen et al. |

OTHER PUBLICATIONS

Google, Patent Certificate for Design, Certificate No. 4493940, Patent No. ZL201730288012.3, Jan. 30, 2018, 1 pg.
Google, European Search Report, EP 18172481.6, dated Feb. 28, 2019, 82 pgs.
Prosecution History from U.S. Appl. No. 15/710,783 dated Feb. 26, 2019 through May 14, 2020, 92 pp.
Prosecution History from U.S. Appl. No. 16/883,296 dated May 26, 2020 through Jan. 13, 2021, 29 pp.
Response to Communication pursuant to Rule 69 EPC and invitation pursuant to Rule 70(a)1 EPC dated Feb. 25, 2019 from counterpart European Application No. 18172481.6, filed Aug. 20, 2019, 20 pp.
Response to Office Action dated Jan. 13, 2021, from U.S. Appl. No. 16/883,296, filed Mar. 23, 2021, 10 pp.
Final Office Action from U.S. Appl. No. 16/883,296, dated Apr. 16, 2021, 17 pp.
Communication from counterpart European Application No. 18172481.6, dated Mar. 22, 2021, 14 pp.

\* cited by examiner

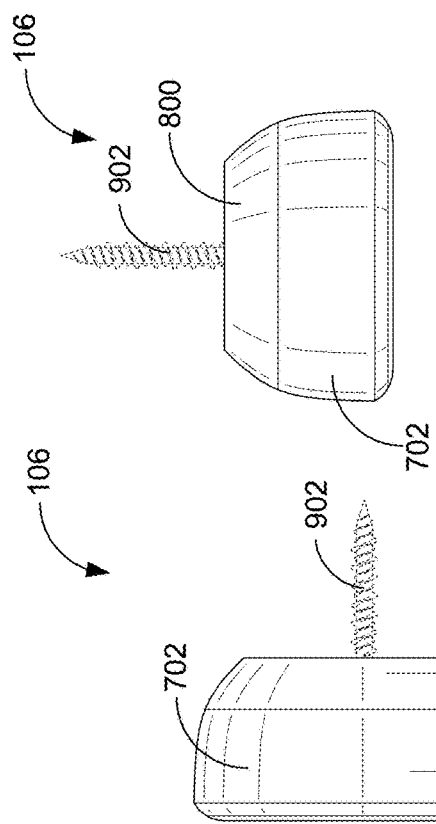
Figure 9D
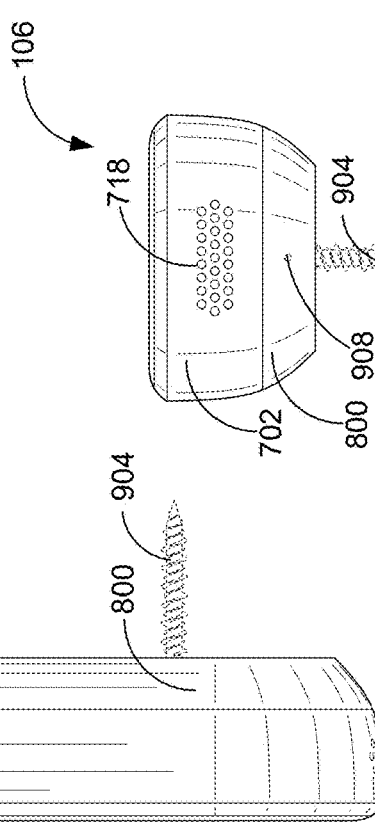
Figure 9E
Figure 9C
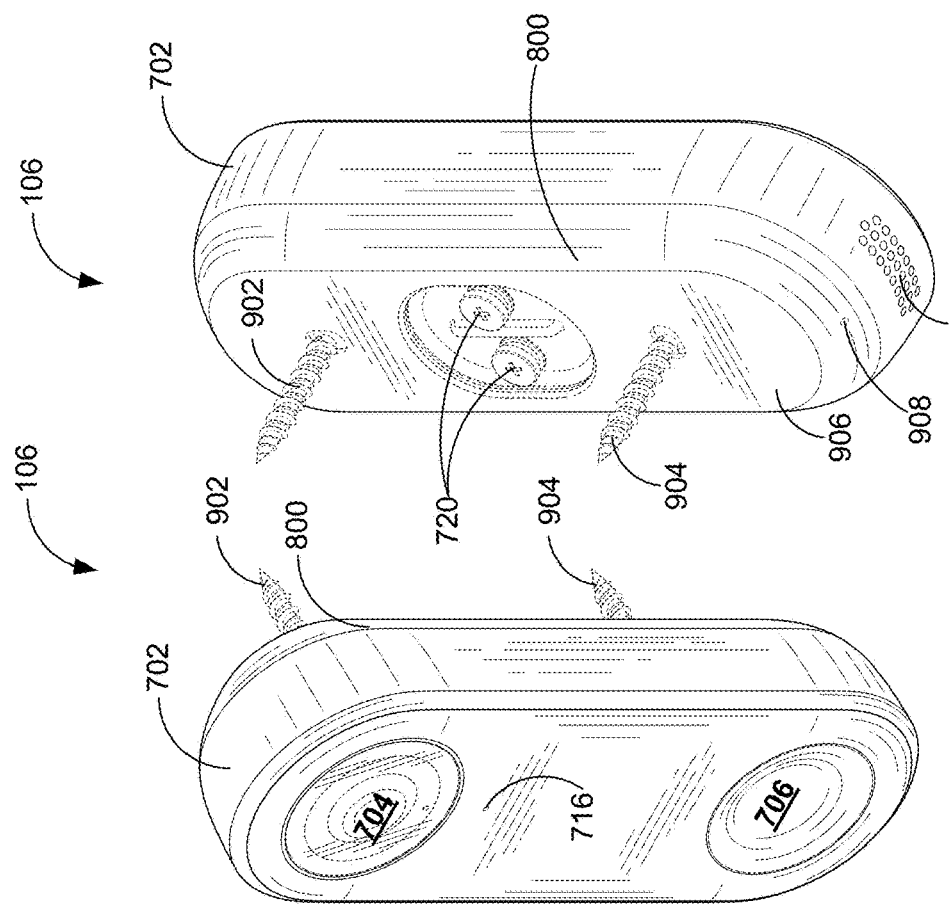
Figure 9B
Figure 9A

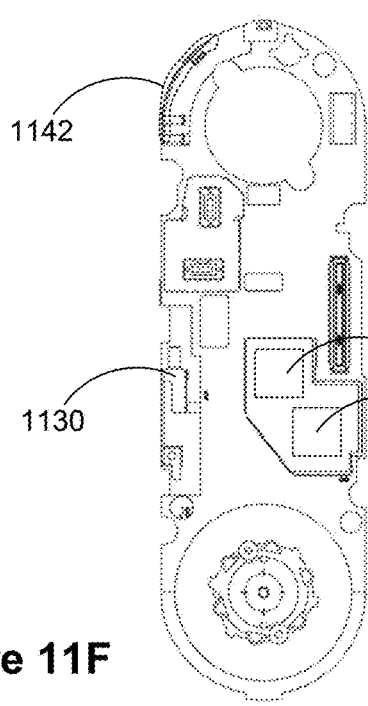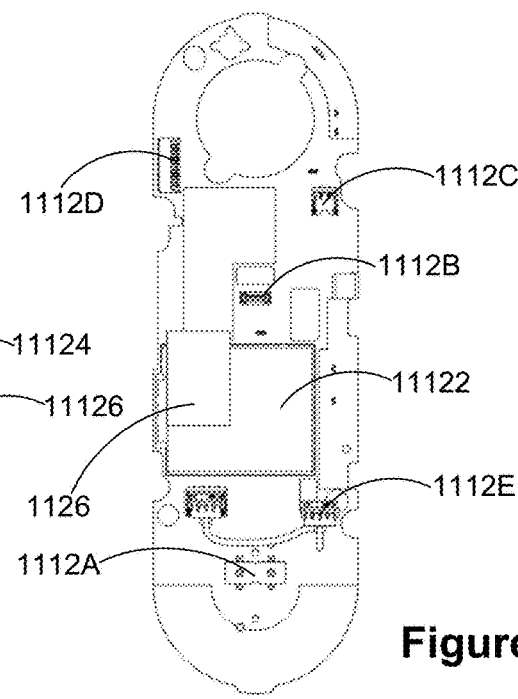
Figure 11F  Figure 11G
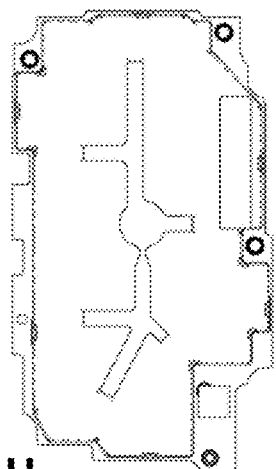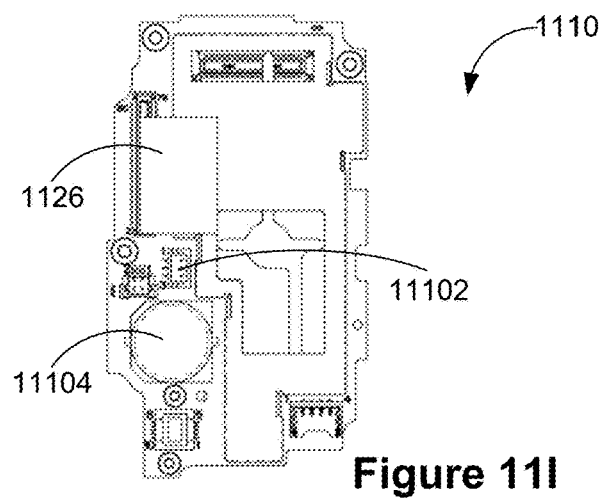
Figure 11H  Figure 11I
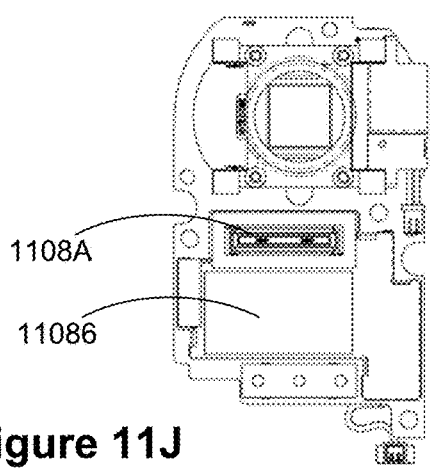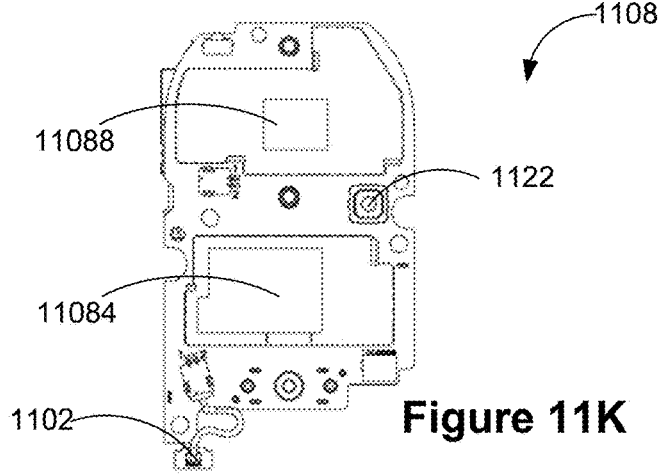
Figure 11J  Figure 11K

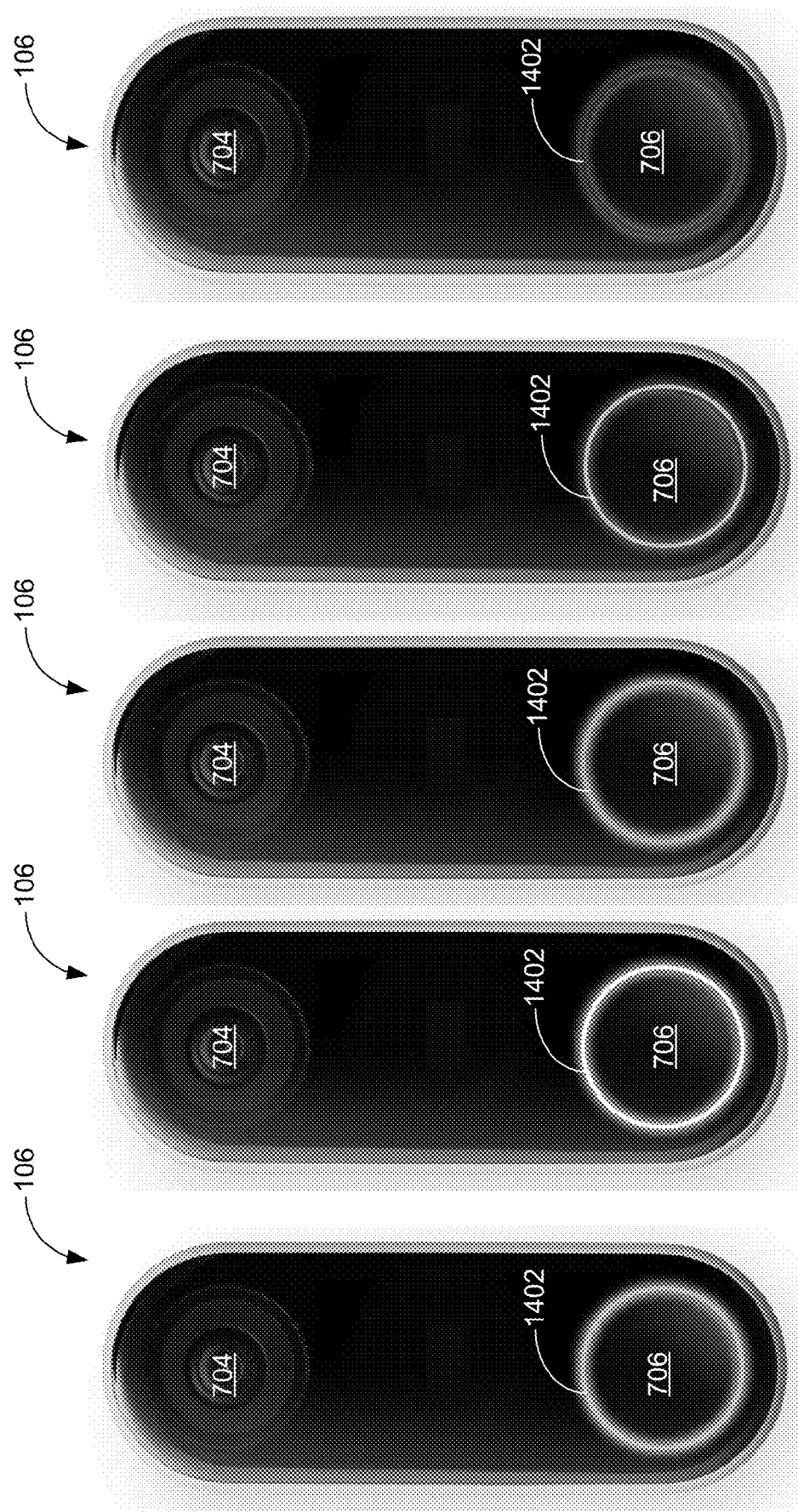

DOORBELL CAMERA

RELATED APPLICATIONS

This application is a continuation of U.S. patent application Ser. No. 15/710,783, filed Sep. 20, 2017, entitled "Doorbell Camera," which claims priority to U.S. Provisional Patent Application No. 62/545,401, titled "Doorbell Camera," filed on Aug. 14, 2017, which is hereby incorporated by reference in its entirety. U.S. patent application Ser. No. 15/710,783 is also a continuation-in-part of U.S. Design application Ser. No. 29/609,547, entitled "Doorbell," filed Jun. 30, 2017, now U.S. Pat. D830,872, which claims priority to European Community Design Application No. 003569169-0003 filed on Jan. 4, 2017, each of which is hereby incorporated by reference in its entirety.

This application is related to U.S. patent application Ser. No. 15/809,924, filed Nov. 10, 2017, entitled "Systems and Methods of Detecting and Responding to a Visitor to a Smart Home Environment," which claims priority to U.S. Provisional Application No. 62/561,132, filed Sep. 20, 2017, entitled "Systems and Methods of Presenting Appropriate Actions for Responding to a Visitor to a Smart Home Environment," which is hereby incorporated by reference in its entirety. This application is also related to U.S. patent application Ser. No. 15/809,900, filed Nov. 10, 2017, entitled "Systems and Methods of Presenting Appropriate Actions for Responding to a Visitor to a Smart Home Environment," each of which is hereby incorporated by reference in its entirety. U.S. patent application Ser. No. 15/809,900 claims priority to U.S. Provisional Application No. 62/561,132, filed Sep. 20, 2017, entitled "Systems and Methods of Presenting Appropriate Action for Responding to a Visitor to a Smart Home Environment."

TECHNICAL FIELD

This relates generally to electronic devices, including but not limited to methods and systems for mechanically supporting an electronic device that integrates a camera module with a doorbell, and protecting the electronic device from severe weather conditions in an outdoor environment.

BACKGROUND

A smart home environment is created at a venue by integrating a plurality of smart devices, including intelligent, multi-sensing, network-connected electronic devices, seamlessly with each other in a local area network and/or with a central server or a cloud-computing system to provide a variety of useful smart home functions. Nowadays, network-connected video surveillance cameras have been extensively used in the smart home environment to provide video monitoring and security. Such extensive usage of video cameras in residential and commercial environments has increased substantially, in part due to lower prices and simplicity of deployment.

Sometimes, one or more of the smart devices are located in an outdoor environment (e.g., in a porch or a backyard of a house). For example, one or more network-connected cameras are often installed on an outer wall of a house, and configured to provide video monitoring and security in the outdoor environment. These smart devices (e.g., the network-connected outdoor cameras) are exposed to severe weather conditions (e.g., a rainfall, a snowstorm and direct sun exposure), and require additional power supplies being physically routed to them even though these smart device normally can communicate data with a remote server or a client device wirelessly via one or more communication networks. Each outdoor smart device must be configured to attach firmly to a surface in the outdoor environment, have an access to a power supply source, function reliably under various severe weather conditions (e.g., water intrusion from a rainfall or snowstorm) that could happen, and last for a long duration in the outdoor environment. As such, there is a need to mechanically mount a smart device to an outdoor surface in a compact and robust manner and with a convenient access to a power supply source, while incorporating into the smart device some resistance mechanisms against potential severe weather conditions.

SUMMARY

Accordingly, there is a need for systems and/or devices with more efficient, accurate, and effective methods for mounting, powering and operating a smart electronic device in an outdoor environment. A convenient and efficient approach is to integrate the smart electronic device into an existing outdoor electronic device, such that the smart electronic device can take advantage of existing infrastructures of the outdoor electronic device for mounting, powering and operating the smart electronic device. For example, a camera module can be integrated with a doorbell device, providing its functions of illuminating, capturing, and analyzing scenes, among other things in addition to doorbell functions. Such systems, devices, and methods optionally complement or replace conventional systems, devices, and methods for illuminating, capturing, and analyzing scenes.

The present disclosure describes compact doorbell camera implementations having capabilities of high-power on-camera processing, low-light (e.g., night-time) illumination, concurrent transmission of multiple HD video streams, and wirelessly communication with other devices over multiple protocols (e.g., Wi-Fi, Bluetooth, and IEEE 802.15.4). Such a doorbell camera also complements, replaces and/or expands conventional doorbell functions based on these processing and communication capabilities. The doorbell camera is mounted on or in proximity to a doorframe where a conventional doorbell may be mounted, and is electrically coupled to a power supply that may have been used to power the conventional doorbell. Specifically, the doorbell camera has one or more of a speaker, a microphone, a lens assembly, an image sensor, a waterproof device housing, a waterproof button assembly, light emitting diodes (LEDs), infrared (IR) illuminators, a rechargeable battery and corresponding compensation circuit, an adjustable mounting plate, antennas and transceivers, a processor, and memory storing programs executed by the processor.

In one aspect, a method is implemented for controlling a doorbell camera having a doorbell housing and a doorbell button mounted on a front cover plate of the doorbell housing. The doorbell housing contains a camera module, an LED indicator, a processor and memory including programs executed by the processor. The doorbell camera is electrically coupled to a remote chime via a bypass unit powered by a transformer that provides an input AC voltage. The remote chime is configured to ring in response to a user press on the doorbell button. A supply monitoring signal is generated based on the input AC voltage to indicate whether the input AC voltage is greater than a supply threshold. In accordance with the supply monitoring signal, the LED indicator displays on a surface of the doorbell housing one of a set of predetermined visual patterns, thereby sending a visual message to a user of the doorbell camera to indicate whether the input AC voltage is low with respect to the supply threshold. In some implementations, the camera module is configured to in accordance with a determination that the input AC voltage is not greater than the supply threshold, disable capturing images and exchanging data with a remote server, and enable communication with a client device via a short range communication link. Alternatively, in some implementations, the camera module is configured to activate a low power mode in accordance with a determination that the input AC voltage is not greater than the supply threshold.

In another aspect of the application, an electronic device includes a device housing and a waterproof button assembly. The device housing encloses at least a plurality of electronic components and includes a front cover plate having an opening. The waterproof button assembly is formed in the opening on the front cover plate of the device housing. The waterproof button assembly further includes a button top, a flexible gasket, a button structure, a plurality of LEDs, and a light guide component. The flexible gasket is mounted below the button top. The button structure, the LEDs and the light guide component are mounted below the flexible gasket. The flexible gasket is configured to deflect in response to a press on the button top of the button assembly. The flexible gasket has a top surface impermeable to water and edges that extend beyond sides of the button top. The edges of the flexible gasket include a first peripheral edge and a peripheral region located in proximity to the first peripheral edge. The first peripheral edge of the flexible gasket makes a water tight seal with a second edge of the opening of the front cover plate, and the peripheral region of the flexible gasket is substantially transparent to visible light. The button structure is configured to be actuated in response to the press on the button top. The LEDs is disposed in proximity to the button structure. The light guide component is further disposed in proximity to the LEDS. The light guide component is configured to distribute light of the LEDs to the peripheral region of the flexible gasket.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of the various described implementations, reference should be made to the Description of Implementations below, in conjunction with the following drawings in which like reference numerals refer to corresponding parts throughout the figures.

FIGS. 9A-9E are a front perspective view, a rear perspective view, a side view, a top view and a bottom view of a doorbell camera mounted onto a mounting plate in accordance with some implementations, respectively.

FIGS. 11F and 11G are a front side and a rear side of a secondary board in accordance with some implementations. FIGS. 11H and 11I are a front side and a rear side of a PMIC board in accordance with some implementations. FIGS. 11J and 11K are a front side and a rear side of a main board in accordance with some implementations.

FIGS. 14A-14E are front views of a doorbell camera 106 that displays a light ring having a color of white, yellow, green, blue and red in accordance with some implementations, respectively.

Like reference numerals refer to corresponding parts throughout the several views of the drawings.

DESCRIPTION OF IMPLEMENTATIONS

Figure 1:
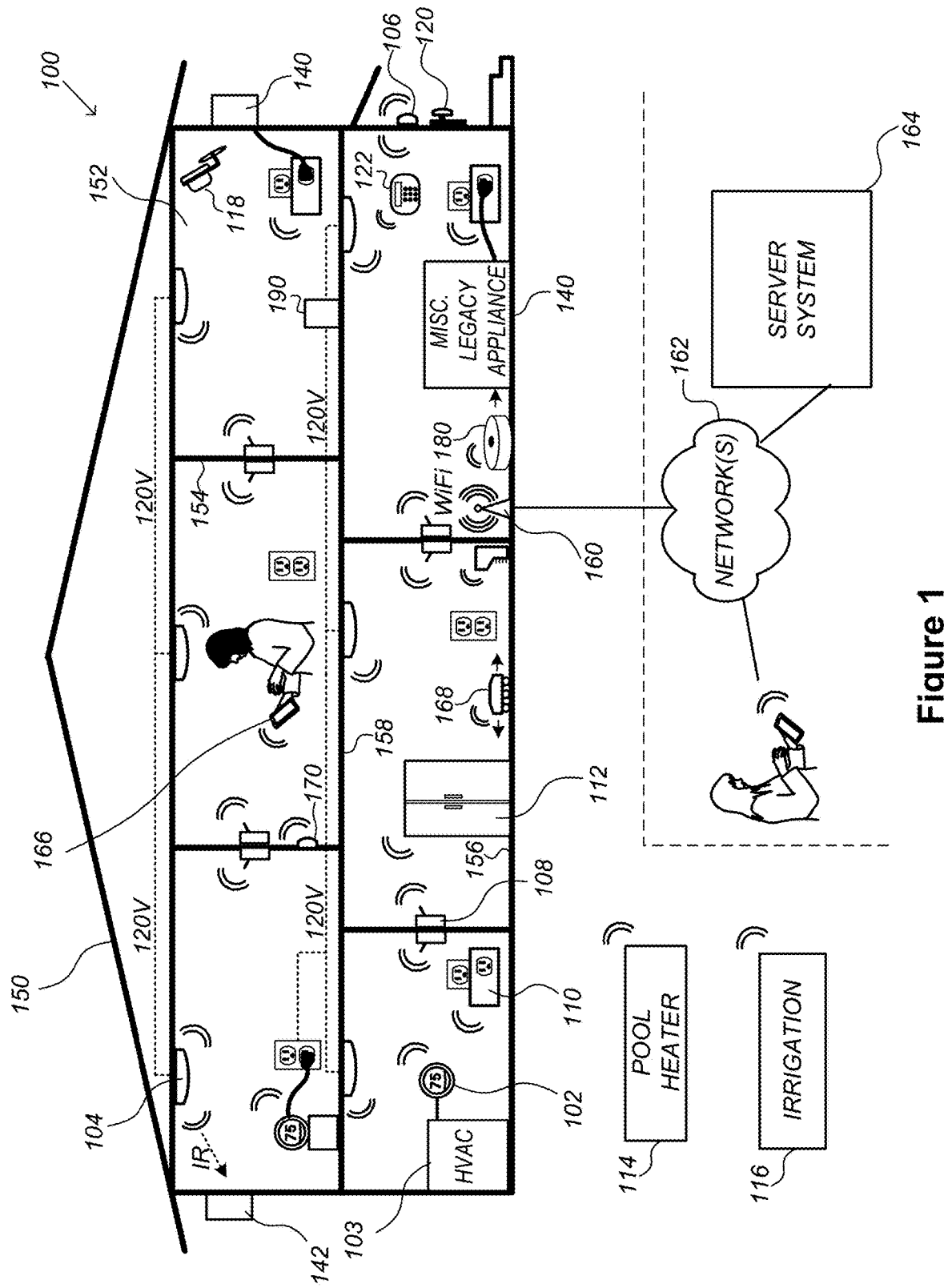
FIG. 1 is an example smart home environment in accordance with some implementations.

FIG. 1 is an example smart home environment 100 in accordance with some implementations. The smart home environment 100 includes a structure 150 (e.g., a house, office building, garage, or mobile home) with various integrated devices. It will be appreciated that devices may also be integrated into a smart home environment 100 that does not include an entire structure 150, such as an apartment, condominium, or office space. Further, the smart home environment 100 may control and/or be coupled to devices outside of the actual structure 150. Indeed, several devices in the smart home environment 100 need not be physically within the structure 150. For example, a device controlling a pool heater 114 or irrigation system 116 may be located outside of the structure 150.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is also to be appreciated that while the terms user, customer, installer, homeowner, occupant, guest, tenant, landlord, repair person, and the like may be used to refer to the person or persons acting in the context of some particularly situations described herein, these references do not limit the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the implementations, such identity should not be construed in the descriptions that follow as necessarily limiting the scope of the present teachings to those particular individuals having those particular identities.

The depicted structure 150 includes a plurality of rooms 152, separated at least partly from each other via walls 154. The walls 154 may include interior walls or exterior walls. Each room may further include a floor 156 and a ceiling 158. Devices may be mounted on, integrated with and/or supported by a wall 154, floor 156 or ceiling 158.

In some implementations, the integrated devices of the smart home environment 100 include intelligent, multi-sensing, network-connected devices that integrate seamlessly with each other in a smart home network (e.g., 202 FIG. 2A) and/or with a central server or a cloud-computing system to provide a variety of useful smart home functions. The smart home environment 100 may include one or more intelligent, multi-sensing, network-connected thermostats 102 (hereinafter referred to as "smart thermostats 102"), one or more intelligent, network-connected, multi-sensing hazard detection units 104 (hereinafter referred to as "smart hazard detectors 104"), one or more intelligent, multi-sensing, network-connected entryway interface devices 106 and 120 (hereinafter referred to as "smart doorbells 106" and "smart door locks 120"), and one or more intelligent, multi-sensing, network-connected alarm systems 122 (hereinafter referred to as "smart alarm systems 122").

In some implementations, the one or more smart thermostats 102 detect ambient climate characteristics (e.g., temperature and/or humidity) and control a HVAC system 103 accordingly. For example, a respective smart thermostat 102 includes an ambient temperature sensor.

The one or more smart hazard detectors 104 may include thermal radiation sensors directed at respective heat sources (e.g., a stove, oven, other appliances, a fireplace, etc.). For example, a smart hazard detector 104 in a kitchen 153 includes a thermal radiation sensor directed at a stove/oven 112. A thermal radiation sensor may determine the temperature of the respective heat source (or a portion thereof) at which it is directed and may provide corresponding blackbody radiation data as output.

The smart doorbell 106 and/or the smart door lock 120 may detect a person's approach to or departure from a location (e.g., an outer door), control doorbell/door locking functionality (e.g., receive user inputs from a portable electronic device 166-1 to actuate bolt of the smart door lock 120), announce a person's approach or departure via audio or visual means, and/or control settings on a security system (e.g., to activate or deactivate the security system when occupants go and come). In some implementations, the smart doorbell 106 includes some or all of the components and features of the camera 118. In some implementations, the smart doorbell 106 includes a camera 118, and therefore, is also called "doorbell camera 106" in this application.

The smart alarm system 122 may detect the presence of an individual within close proximity (e.g., using built-in IR sensors), sound an alarm (e.g., through a built-in speaker, or by sending commands to one or more external speakers), and send notifications to entities or users within/outside of the smart home network 100. In some implementations, the smart alarm system 122 also includes one or more input devices or sensors (e.g., keypad, biometric scanner, NFC transceiver, microphone) for verifying the identity of a user, and one or more output devices (e.g., display, speaker). In some implementations, the smart alarm system 122 may also be set to an "armed" mode, such that detection of a trigger condition or event causes the alarm to be sounded unless a disarming action is performed.

In some implementations, the smart home environment 100 includes one or more intelligent, multi-sensing, network-connected wall switches 108 (hereinafter referred to as "smart wall switches 108"), along with one or more intelligent, multi-sensing, network-connected wall plug interfaces 110 (hereinafter referred to as "smart wall plugs 110"). The smart wall switches 108 may detect ambient lighting conditions, detect room-occupancy states, and control a power and/or dim state of one or more lights. In some instances, smart wall switches 108 may also control a power state or speed of a fan, such as a ceiling fan. The smart wall plugs 110 may detect occupancy of a room or enclosure and control supply of power to one or more wall plugs (e.g., such that power is not supplied to the plug if nobody is at home).

In some implementations, the smart home environment 100 of FIG. 1 includes a plurality of intelligent, multi-sensing, network-connected appliances 112 (hereinafter referred to as "smart appliances 112"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, when plugged in, an appliance may announce itself to the smart home network, such as by indicating what type of appliance it is, and it may automatically integrate with the controls of the smart home. Such communication by the appliance to the smart home may be facilitated by either a wired or wireless communication protocol. The smart home may also include a variety of non-communicating legacy appliances 140, such as old conventional washer/dryers, refrigerators, and the like, which may be controlled by smart wall plugs 110. The smart home environment 100 may further include a variety of partially communicating legacy appliances 142, such as infrared ("IR") controlled wall air conditioners or other IR-controlled devices, which may be controlled by IR signals provided by the smart hazard detectors 104 or the smart wall switches 108.

In some implementations, the smart home environment 100 includes one or more network-connected cameras 118 that are configured to provide video monitoring and security in the smart home environment 100. The cameras 118 may be used to determine occupancy of the structure 150 and/or particular rooms 152 in the structure 150, and thus may act as occupancy sensors. For example, video captured by the cameras 118 may be processed to identify the presence of an occupant in the structure 150 (e.g., in a particular room 152). Specific individuals may be identified based, for example, on their appearance (e.g., height, face) and/or movement (e.g., their walk/gait). Cameras 118 may additionally include one or more sensors (e.g., IR sensors, motion detectors), input devices (e.g., microphone for capturing audio), and output devices (e.g., speaker for outputting audio). In some implementations, the cameras 118 are each configured to operate in a day mode and in a low-light mode (e.g., a night mode). In some implementations, the cameras 118 each include one or more IR illuminators for providing illumination while the camera is operating in the low-light mode. In some implementations, the cameras 118 include one or more outdoor cameras. In some implementations, the outdoor cameras include additional features and/or components such as weatherproofing and/or solar ray compensation.

The smart home environment 100 may additionally or alternatively include one or more other occupancy sensors (e.g., the smart doorbell 106, smart door locks 120, touch screens, IR sensors, microphones, ambient light sensors, motion detectors, smart nightlights 170, etc.). In some implementations, the smart home environment 100 includes radio-frequency identification (RFID) readers (e.g., in each room 152 or a portion thereof) that determine occupancy based on RFID tags located on or embedded in occupants. For example, RFID readers may be integrated into the smart hazard detectors 104.

The smart home environment 100 may also include communication with devices outside of the physical home but within a proximate geographical range of the home. For example, the smart home environment 100 may include a pool heater monitor 114 that communicates a current pool temperature to other devices within the smart home environment 100 and/or receives commands for controlling the pool temperature. Similarly, the smart home environment 100 may include an irrigation monitor 116 that communicates information regarding irrigation systems within the smart home environment 100 and/or receives control information for controlling such irrigation systems.

By virtue of network connectivity, one or more of the smart home devices of FIG. 1 may further allow a user to interact with the device even if the user is not proximate to the device. For example, a user may communicate with a device using a computer (e.g., a desktop computer, laptop computer, or tablet) or other portable electronic device 166 (e.g., a mobile phone, such as a smart phone). A webpage or application may be configured to receive communications from the user and control the device based on the communications and/or to present information about the device's operation to the user. For example, the user may view a current set point temperature for a device (e.g., a stove) and adjust it using a computer. The user may be in the structure during this remote communication or outside the structure.

As discussed above, users may control smart devices in the smart home environment 100 using a network-connected computer or portable electronic device 166. In some examples, some or all of the occupants (e.g., individuals who live in the home) may register their device 166 with the smart home environment 100. Such registration may be made at a central server to authenticate the occupant and/or the device as being associated with the home and to give permission to the occupant to use the device to control the smart devices in the home. An occupant may use their registered device 166 to remotely control the smart devices of the home, such as when the occupant is at work or on vacation. The occupant may also use their registered device to control the smart devices when the occupant is actually located inside the home, such as when the occupant is sitting on a couch inside the home. It should be appreciated that instead of or in addition to registering devices 166, the smart home environment 100 may make inferences about which individuals live in the home and are therefore occupants and which devices 166 are associated with those individuals. As such, the smart home environment may "learn" who is an occupant and permit the devices 166 associated with those individuals to control the smart devices of the home.

In some implementations, in addition to containing processing and sensing capabilities, devices 102, 104, 106, 108, 110, 112, 114, 116, 118, 120, and/or 122 (collectively referred to as "the smart devices") are capable of data communications and information sharing with other smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.5A, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

In some implementations, the smart devices serve as wireless or wired repeaters. In some implementations, a first one of the smart devices communicates with a second one of the smart devices via a wireless router. The smart devices may further communicate with each other via a connection (e.g., network interface 160) to a network, such as the Internet 162. Through the Internet 162, the smart devices may communicate with a server system 164 (also called a central server system and/or a cloud-computing system herein). The server system 164 may be associated with a manufacturer, support entity, or service provider associated with the smart device(s). In some implementations, a user is able to contact customer support using a smart device itself rather than needing to use other communication means, such as a telephone or Internet-connected computer. In some implementations, software updates are automatically sent from the server system 164 to smart devices (e.g., when available, when purchased, or at routine intervals).

In some implementations, the network interface 160 includes a conventional network device (e.g., a router), and the smart home environment 100 of FIG. 1 includes a hub device 180 that is communicatively coupled to the network(s) 162 directly or via the network interface 160. The hub device 180 is further communicatively coupled to one or more of the above intelligent, multi-sensing, network-connected devices (e.g., smart devices of the smart home environment 100). Each of these smart devices optionally communicates with the hub device 180 using one or more radio communication networks available at least in the smart home environment 100 (e.g., ZigBee, Z-Wave, Insteon, Bluetooth, Wi-Fi and other radio communication networks). In some implementations, the hub device 180 and devices coupled with/to the hub device can be controlled and/or interacted with via an application running on a smart phone, household controller, laptop, tablet computer, game console or similar electronic device. In some implementations, a user of such controller application can view status of the hub device or coupled smart devices, configure the hub device to interoperate with smart devices newly introduced to the home network, commission new smart devices, and adjust or view settings of connected smart devices, etc. In some implementations the hub device extends capabilities of low capability smart device to match capabilities of the highly capable smart devices of the same type, integrates functionality of multiple different device types—even across different communication protocols, and is configured to streamline adding of new devices and commissioning of the hub device. In some implementations, hub device 180 further includes a local storage device for storing data related to, or output by, smart devices of smart home environment 100. In some implementations, the data includes one or more of: video data output by a camera device, metadata output by a smart device, settings information for a smart device, usage logs for a smart device, and the like.

In some implementations, smart home environment 100 includes a local storage device 190 for storing data related to, or output by, smart devices of smart home environment 100. In some implementations, the data includes one or more of: video data output by a camera device (e.g., camera 118 or doorbell camera 106), metadata output by a smart device, settings information for a smart device, usage logs for a smart device, and the like. In some implementations, local storage device 190 is communicatively coupled to one or more smart devices via a smart home network (e.g., smart home network 202, FIG. 2A). In some implementations, local storage device 190 is selectively coupled to one or more smart devices via a wired and/or wireless communication network. In some implementations, local storage device 190 is used to store video data when external network conditions are poor. For example, local storage device 190 is used when an encoding bitrate of camera 118 exceeds the available bandwidth of the external network (e.g., network(s) 162). In some implementations, local storage device 190 temporarily stores video data from one or more cameras (e.g., camera 118) prior to transferring the video data to a server system (e.g., server system 164).

In accordance with various implementations of the application, a doorbell camera 106 integrates a camera 118 in a smart doorbell device 106. The doorbell camera 106 has a doorbell button, a camera module, a processor and memory including programs executed by the processor, and is electrically coupled to a remote chime device that rings in response to a user press on the doorbell button. The doorbell camera 106 operates at a first camera mode and a second camera mode. In both of these two modes, the doorbell camera 106 continuously records video information from a field of view of the doorbell camera 106, and communicates with a remote server 164 to receive instructions from and/or upload the recorded video information to the remote server 164. More importantly, the doorbell camera 106 is configured to detect whether there is a user press on the doorbell button. In accordance with a determination that no user press is being applied on the doorbell button, the first camera mode is activated to bypass the remote chime device and couple the camera module of the doorbell camera 106 to a remote transformer for receiving a power supply therefrom. Conversely, in accordance with a determination that a user press is being applied on the doorbell button, the second doorbell mode is activated to couple both the camera module of the doorbell camera 106 and the remote chime device to the remote transformer. For example, the camera module and the remote chimer device are electrically coupled in series and both powered by the remote transformer at the second doorbell mode, thereby enabling the remote chime device to ring concurrently while the camera module is recording the video information. In some implementations, while the doorbell button is being pressed (i.e., at a second doorbell mode), the camera module of the doorbell camera 106 is electrically decoupled from the transformer, and relies on the battery to provide needed power. The battery is recharged at the first camera mode when the button is not pressed. The battery needs to be sized to be sufficiently large so that it can charge back up in between button presses. In some implementations, the doorbell button of the doorbell camera 106 is configured to sustain a predetermined number (e.g., 100) of continuous presses without losing battery power.

In some implementations, the doorbell camera 106 is located at a door of a structure 150, and the remote chime device and the transformer are located in two separate rooms 152 (e.g., in a kitchen 153 and a garage, respectively).

In some implementations, the doorbell camera 106 continues to operate as a standard doorbell (i.e., ring the remote chime device in response to a user press on the doorbell button), independently of whether the camera module of the doorbell camera 106 functions properly. For example, in some situations, the doorbell camera 106 loses connection to any local or wide area network. The camera module is disabled from capturing images and sharing the captured images with the remote server 164 or any client device 166, and however, the doorbell camera 106 still responds properly to the user press on its doorbell button.

Additionally, in some implementations, video and audio recording functions of the doorbell camera 106 are configured to comply with local laws and regulations that are enforced in different jurisdictions concerning recording video and audio information in public places without consent of those being recorded. The doorbell camera 106 is pre-programmed to comply with such laws and regulations in a factory, before it is shipped to a specific jurisdiction.

Figure 2A:
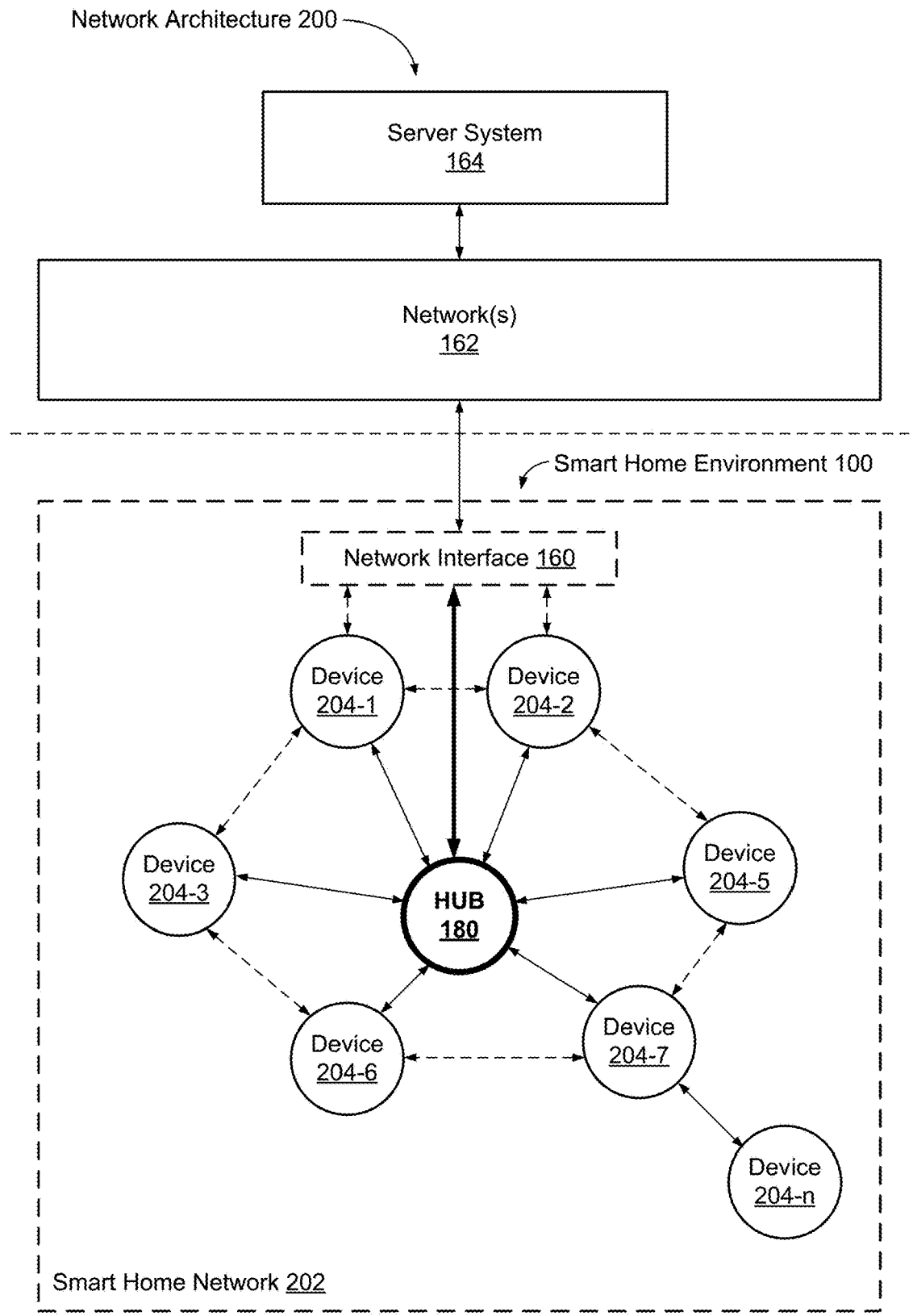
FIG. 2A is a block diagram illustrating a representative network architecture that includes a smart home network in accordance with some implementations.

FIG. 2A is a block diagram illustrating a representative network architecture 200 that includes a smart home network 202 in accordance with some implementations. In some implementations, the smart devices 204 in the smart home environment 100 (e.g., devices 102, 104, 106, 108, 110, 112, 114, 116, 118, 120, and/or 122) combine with the hub device 180 to create a mesh network in smart home network 202. In some implementations, one or more smart devices 204 in the smart home network 202 operate as a smart home controller. Additionally and/or alternatively, hub device 180 operates as the smart home controller. In some implementations, a smart home controller has more computing power than other smart devices. In some implementations, a smart home controller processes inputs (e.g., from smart devices 204, electronic device 166, and/or server system 164) and sends commands (e.g., to smart devices 204 in the smart home network 202) to control operation of the smart home environment 100. In some implementations, some of the smart devices 204 in the smart home network 202 (e.g., in the mesh network) are "spokesman" nodes (e.g., 204-1) and others are "low-powered" nodes (e.g., 204-9). Some of the smart devices in the smart home environment 100 are battery powered, while others have a regular and reliable power source, such as by connecting to wiring (e.g., to 120V or 240V line voltage wires) behind the walls 154 of the smart home environment. The smart devices that have a regular and reliable power source are referred to as "spokesman" nodes. These nodes are typically equipped with the capability of using a wireless protocol to facilitate bidirectional communication with a variety of other devices in the smart home environment 100, as well as with the server system 164. In some implementations, one or more "spokesman" nodes operate as a smart home controller. On the other hand, the devices that are battery powered are the "low-power" nodes. These nodes tend to be smaller than spokesman nodes and typically only communicate using wireless protocols that require very little power, such as Zigbee, ZWave, 6LoWPAN, Thread, Bluetooth, etc.

In some implementations, some low-power nodes are incapable of bidirectional communication. These low-power nodes send messages, but they are unable to "listen." Thus, other devices in the smart home environment 100, such as the spokesman nodes, cannot send information to these low-power nodes.

In some implementations, some low-power nodes are capable of only a limited bidirectional communication. For example, other devices are able to communicate with the low-power nodes only during a certain time period.

As described, in some implementations, the smart devices serve as low-power and spokesman nodes to create a mesh network in the smart home environment 100. In some implementations, individual low-power nodes in the smart home environment regularly send out messages regarding what they are sensing, and the other low-powered nodes in the smart home environment—in addition to sending out their own messages—forward the messages, thereby causing the messages to travel from node to node (i.e., device to device) throughout the smart home network 202. In some implementations, the spokesman nodes in the smart home network 202, which are able to communicate using a relatively high-power communication protocol, such as IEEE 802.11, are able to switch to a relatively low-power communication protocol, such as IEEE 802.15.4, to receive these messages, translate the messages to other communication protocols, and send the translated messages to other spokesman nodes and/or the server system 164 (using, e.g., the relatively high-power communication protocol). Thus, the low-powered nodes using low-power communication protocols are able to send and/or receive messages across the entire smart home network 202, as well as over the Internet 162 to the server system 164. In some implementations, the mesh network enables the server system 164 to regularly receive data from most or all of the smart devices in the home, make inferences based on the data, facilitate state synchronization across devices within and outside of the smart home network 202, and send commands to one or more of the smart devices to perform tasks in the smart home environment.

As described, the spokesman nodes and some of the low-powered nodes are capable of "listening." Accordingly, users, other devices, and/or the server system 164 may communicate control commands to the low-powered nodes. For example, a user may use the electronic device 166 (e.g., a smart phone) to send commands over the Internet to the server system 164, which then relays the commands to one or more spokesman nodes in the smart home network 202. The spokesman nodes may use a low-power protocol to communicate the commands to the low-power nodes throughout the smart home network 202, as well as to other spokesman nodes that did not receive the commands directly from the server system 164.

In some implementations, a smart nightlight 170 (FIG. 1), which is an example of a smart device 204, is a low-power node. In addition to housing a light source, the smart nightlight 170 houses an occupancy sensor, such as an ultrasonic or passive IR sensor, and an ambient light sensor, such as a photo resistor or a single-pixel sensor that measures light in the room. In some implementations, the smart nightlight 170 is configured to activate the light source when its ambient light sensor detects that the room is dark and when its occupancy sensor detects that someone is in the room. In other implementations, the smart nightlight 170 is simply configured to activate the light source when its ambient light sensor detects that the room is dark. Further, in some implementations, the smart nightlight 170 includes a low-power wireless communication chip (e.g., a ZigBee chip) that regularly sends out messages regarding the occupancy of the room and the amount of light in the room, including instantaneous messages coincident with the occupancy sensor detecting the presence of a person in the room. As mentioned above, these messages may be sent wirelessly (e.g., using the mesh network) from node to node (i.e., smart device to smart device) within the smart home network 202 as well as over the Internet 162 to the server system 164.

Other examples of low-power nodes include battery-operated versions of the smart hazard detectors 104. These smart hazard detectors 104 are often located in an area without access to constant and reliable power and may include any number and type of sensors, such as smoke/fire/heat sensors (e.g., thermal radiation sensors), carbon monoxide/dioxide sensors, occupancy/motion sensors, ambient light sensors, ambient temperature sensors, humidity sensors, and the like. Furthermore, smart hazard detectors 104 may send messages that correspond to each of the respective sensors to the other devices and/or the server system 164, such as by using the mesh network as described above.

Examples of spokesman nodes include smart doorbells 106, smart thermostats 102, smart wall switches 108, and smart wall plugs 110. These devices are often located near and connected to a reliable power source, and therefore may include more power-consuming components, such as one or more communication chips capable of bidirectional communication in a variety of protocols.

In some implementations, the smart home environment 100 includes service robots 168 (FIG. 1) that are configured to carry out, in an autonomous manner, any of a variety of household tasks.

As explained above with reference to FIG. 1, in some implementations, the smart home environment 100 of FIG. 1 includes a hub device 180 that is communicatively coupled to the network(s) 162 directly or via the network interface 160. The hub device 180 is further communicatively coupled to one or more of the smart devices using a radio communication network that is available at least in the smart home environment 100. Communication protocols used by the radio communication network include, but are not limited to, ZigBee, Z-Wave, Insteon, EuOcean, Thread, OSIAN, Bluetooth Low Energy and the like. In some implementations, the hub device 180 not only converts the data received from each smart device to meet the data format requirements of the network interface 160 or the network(s) 162, but also converts information received from the network interface 160 or the network(s) 162 to meet the data format requirements of the respective communication protocol associated with a targeted smart device. In some implementations, in addition to data format conversion, the hub device 180 further processes the data received from the smart devices or information received from the network interface 160 or the network(s) 162 preliminary. For example, the hub device 180 can integrate inputs from multiple sensors/connected devices (including sensors/devices of the same and/or different types), perform higher level processing on those inputs—e.g., to assess the overall environment and coordinate operation among the different sensors/devices—and/or provide instructions to the different devices based on the collection of inputs and programmed processing. It is also noted that in some implementations, the network interface 160 and the hub device 180 are integrated to one network device. Functionality described herein is representative of particular implementations of smart devices, control application(s) running on representative electronic device(s) (such as a smart phone), hub device(s) 180, and server(s) coupled to hub device(s) via the Internet or other Wide Area Network. All or a portion of this functionality and associated operations can be performed by any elements of the described system—for example, all or a portion of the functionality described herein as being performed by an implementation of the hub device can be performed, in different system implementations, in whole or in part on the server, one or more connected smart devices and/or the control application, or different combinations thereof.

Figure 2B:
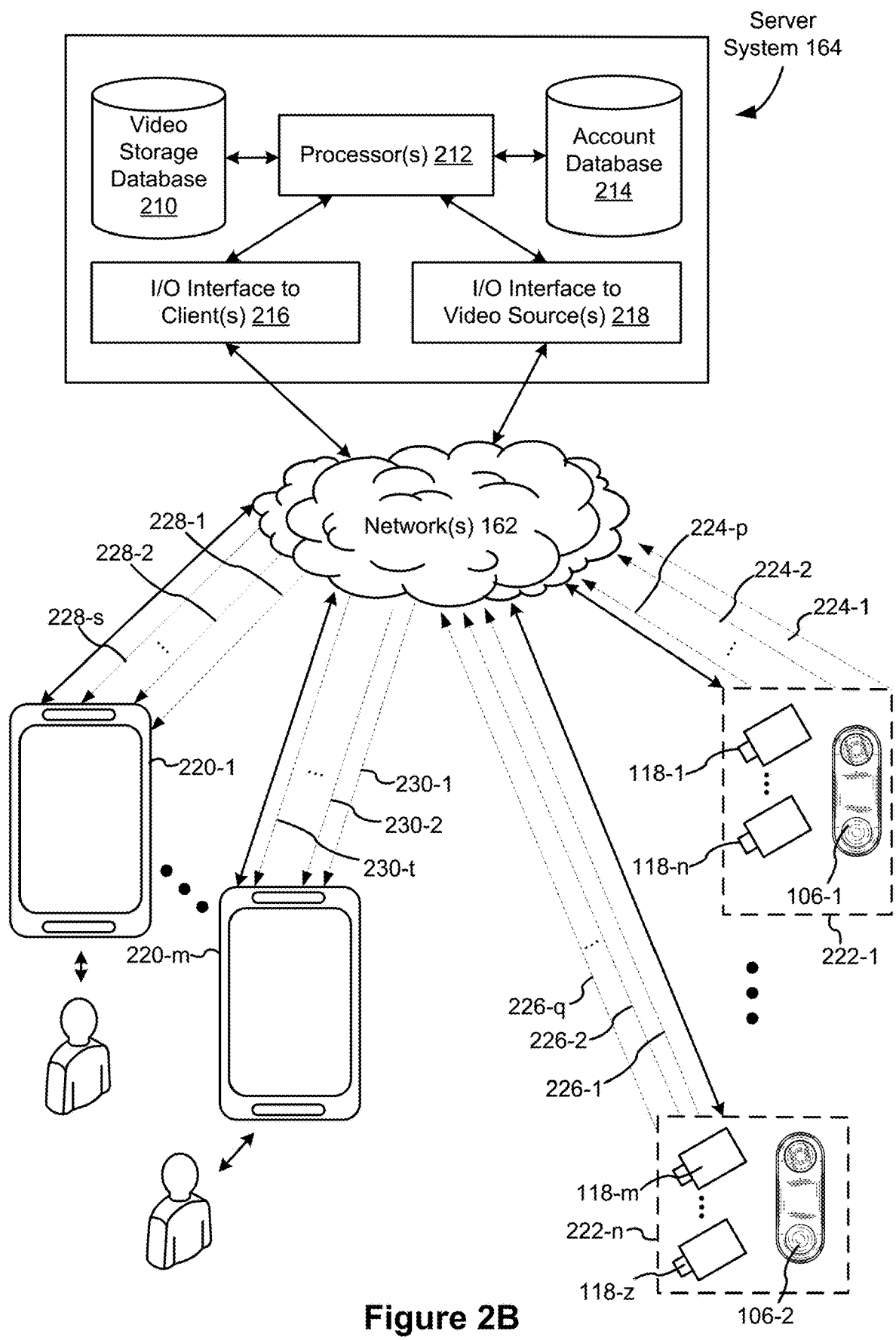
FIG. 2B is a representative operating environment in which a server system interacts with client devices and smart devices in accordance with some implementations.

FIG. 2B illustrates a representative operating environment in which a server system 164 provides data processing for monitoring and facilitating review of events (e.g., motion, audio, security, etc.) in video streams captured by video cameras 118 or doorbell cameras 106. As shown in FIG. 2B, the server system 164 receives video data from video sources 222 (including cameras 118 or doorbell cameras 106) located at various physical locations (e.g., inside homes, restaurants, stores, streets, parking lots, and/or the smart home environments 100 of FIG. 1). Each video source 222 may be bound to one or more reviewer accounts, and the server system 164 provides video monitoring data for the video source 222 to client devices 220 associated with the reviewer accounts. For example, the portable electronic device 166 is an example of the client device 220. In some implementations, the server system 164 is a video processing server that provides video processing services to video sources and client devices 220.

In some implementations, each of the video sources 222 includes one or more video cameras 118 or doorbell cameras 106 that capture video and send the captured video to the server system 164 substantially in real-time. In some implementations, each of the video sources 222 includes a controller device (not shown) that serves as an intermediary between the one or more cameras and the server system 164. The controller device receives the video data from the one or more cameras, optionally performs some preliminary processing on the video data, and sends the video data to the server system 164 on behalf of the one or more cameras substantially in real-time. In some implementations, each camera has its own on-board processing capabilities to perform some preliminary processing on the captured video data before sending the processed video data (along with metadata obtained through the preliminary processing) to the controller device and/or the server system 164.

In accordance with some implementations, each of the client devices 220 includes a client-side module. The client-side module communicates with a server-side module executed on the server system 164 through the one or more networks 162. The client-side module provides client-side functionality for the event monitoring and review processing and communications with the server-side module. The server-side module provides server-side functionality for event monitoring and review processing for any number of client-side modules each residing on a respective client device 220. The server-side module also provides server-side functionality for video processing and camera control for any number of the video sources 222, including any number of control devices and the cameras.

In some implementations, the server system 164 includes one or more processors 212, a video storage database 210, an account database 214, an I/O interface to one or more client devices 216, and an I/O interface to one or more video sources 218. The I/O interface to one or more clients 216 facilitates the client-facing input and output processing. The account database 214 stores a plurality of profiles for reviewer accounts registered with the video processing server, where a respective user profile includes account credentials for a respective reviewer account, and one or more video sources linked to the respective reviewer account. The I/O interface to one or more video sources 218 facilitates communications with one or more video sources 222 (e.g., groups of one or more cameras and associated controller devices). The video storage database 210 stores raw video data received from the video sources 222, as well as various types of metadata, such as motion events, event categories, event category models, event filters, and event masks, for use in data processing for event monitoring and review for each reviewer account.

Examples of a representative client device 220 include a handheld computer, a wearable computing device, a personal digital assistant (PDA), a tablet computer, a laptop computer, a desktop computer, a cellular telephone, a smart phone, an enhanced general packet radio service (EGPRS) mobile phone, a media player, a navigation device, a game console, a television, a remote control, a point-of-sale (POS) terminal, a vehicle-mounted computer, an ebook reader, or a combination of any two or more of these data processing devices or other data processing devices.

Examples of the one or more networks 162 include local area networks (LAN) and wide area networks (WAN) such as the Internet. The one or more networks 162 are implemented using any known network protocol, including various wired or wireless protocols, such as Ethernet, Universal Serial Bus (USB), FIREWIRE, Long Term Evolution (LTE), Global System for Mobile Communications (GSM), Enhanced Data GSM Environment (EDGE), code division multiple access (CDMA), time division multiple access (TDMA), Bluetooth, Wi-Fi, voice over Internet Protocol (VoIP), Wi-MAX, or any other suitable communication protocol.

In some implementations, the server system 164 is implemented on one or more standalone data processing apparatuses or a distributed network of computers. In some implementations, the server system 164 also employs various virtual devices and/or services of third party service providers (e.g., third-party cloud service providers) to provide the underlying computing resources and/or infrastructure resources of the server system 164. In some implementations, the server system 164 includes, but is not limited to, a server computer, a handheld computer, a tablet computer, a laptop computer, a desktop computer, or a combination of any two or more of these data processing devices or other data processing devices.

The server-client environment shown in FIG. 2B includes both a client-side portion (e.g., the client-side module) and a server-side portion (e.g., the server-side module). The division of functionality between the client and server portions of operating environment can vary in different implementations. Similarly, the division of functionality between a video source 222 and the server system 164 can vary in different implementations. For example, in some implementations, the client-side module is a thin-client that provides only user-facing input and output processing functions, and delegates all other data processing functionality to a backend server (e.g., the server system 164). Similarly, in some implementations, a respective one of the video sources 222 is a simple video capturing device that continuously captures and streams video data to the server system 164 with limited or no local preliminary processing on the video data. Although many aspects of the present technology are described from the perspective of the server system 164, the corresponding actions performed by a client device 220 and/or the video sources 222 would be apparent to one of skill in the art. Similarly, some aspects of the present technology may be described from the perspective of a client device or a video source, and the corresponding actions performed by the video server would be apparent to one of skill in the art. Furthermore, some aspects of the present technology may be performed by the server system 164, a client device 220, and a video source 222 cooperatively.

In some implementations, a video source 222 (e.g., a camera 118 or 106) transmits one or more streams of video data to the server system 164. In some implementations, the one or more streams may include multiple streams, of respective resolutions and/or frame rates, of the raw video captured by the camera 118 or 106. In some implementations, the multiple streams may include a "primary" stream with a certain resolution and frame rate, corresponding to the raw video captured by the camera 118 or 106, and one or more additional streams. An additional stream may be the same video stream as the "primary" stream but at a different resolution and/or frame rate, or a stream that captures a portion of the "primary" stream (e.g., cropped to include a portion of the field of view or pixels of the primary stream) at the same or different resolution and/or frame rate as the "primary" stream.

In some implementations, one or more of the streams are sent from the video source 222 directly to a client device 220 (e.g., without being routed to, or processed by, the server system 164). In some implementations, one or more of the streams is stored at the camera 118 or 106 (e.g., in memory 406, FIG. 4) and/or a local storage device (e.g., a dedicated recording device), such as a digital video recorder (DVR). For example, in accordance with some implementations, the camera 118 or 106 stores the most recent 24 hours of video footage recorded by the camera. In some implementations, portions of the one or more streams are stored at the camera 118 or 106 and/or the local storage device (e.g., portions corresponding to particular events or times of interest).

In some implementations, the server system 164 transmits one or more streams of video data to a client device 220 to facilitate event monitoring by a user. In some implementations, the one or more streams may include multiple streams, of respective resolutions and/or frame rates, of the same video feed. In some implementations, the multiple streams include a "primary" stream with a certain resolution and frame rate, corresponding to the video feed, and one or more additional streams. An additional stream may be the same video stream as the "primary" stream but at a different resolution and/or frame rate, or a stream that shows a portion of the "primary" stream (e.g., cropped to include portion of the field of view or pixels of the primary stream) at the same or different resolution and/or frame rate as the "primary" stream, as described in greater detail in U.S. patent application Ser. No. 15/594,518.

Figure 3A:
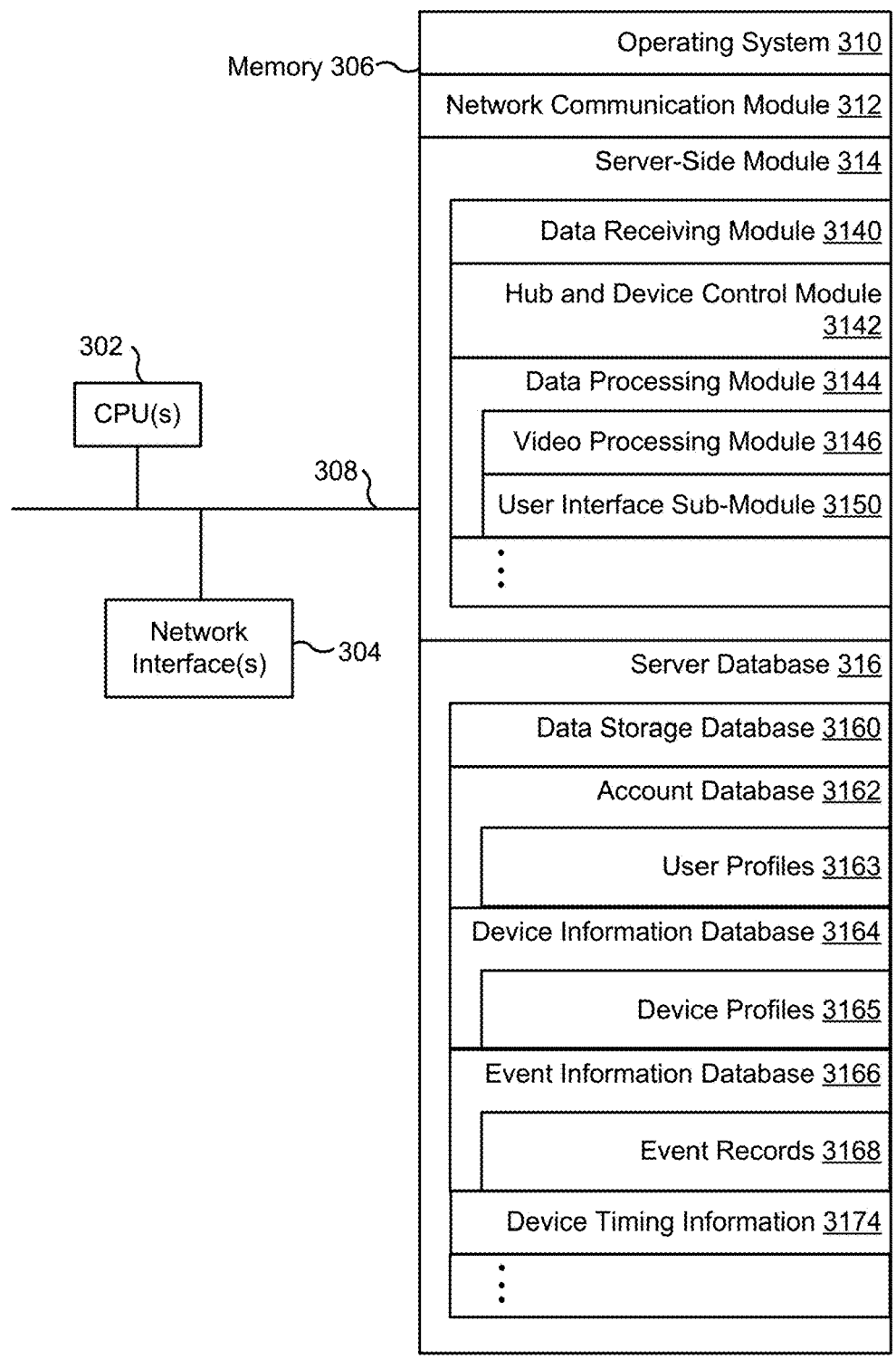
FIG. 3A is a block diagram illustrating a representative server system, in accordance with some implementations.

FIG. 3A is a block diagram illustrating the server system 164 in accordance with some implementations. The server system 164 typically includes one or more processing units (CPUs) 302, one or more network interfaces 304 (e.g., including an I/O interface to one or more client devices and an I/O interface to one or more electronic devices), memory 306, and one or more communication buses 308 for interconnecting these components (sometimes called a chipset). The memory 306 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 306, optionally, includes one or more storage devices remotely located from one or more processing units 302. The memory 306, or alternatively the non-volatile memory within memory 306, includes a non-transitory computer readable storage medium. In some implementations, the memory 306, or the non-transitory computer readable storage medium of the memory 306, stores the following programs, modules, and data structures, or a subset or superset thereof:

- an operating system 310 including procedures for handling various basic system services and for performing hardware dependent tasks;
- a network communication module 312 for connecting the server system 164 to other systems and devices (e.g., client devices, electronic devices, and systems connected to one or more networks 162) via one or more network interfaces 304 (wired or wireless);
- a server-side module 314, which provides server-side functionalities for device control, data processing, and data review, including, but not limited to:
  - a data receiving module 3140 for receiving data from electronic devices (e.g., video data from a camera 118 or 106, FIG. 1) via the hub device 180, and preparing the received data for further processing and storage in the data storage database 3160;
  - a hub and device control module 3142 for generating and sending server-initiated control commands to modify operation modes of electronic devices (e.g., devices of a smart home environment 100), and/or receiving (e.g., from client devices 220) and forwarding user-initiated control commands to modify operation modes of the electronic devices;

a data processing module 3144 for processing the data provided by the electronic devices, and/or preparing and sending processed data to a device for review (e.g., client devices 220 for review by a user), including, but not limited to:

an event processor sub-module 3146 for processing event candidates and/or events within a received video stream (e.g., a video stream from cameras 118 or 106);

an event categorizer sub-module 3148 for categorizing event candidates and/or events within the received video stream; and a user interface sub-module 3150 for communicating with a user (e.g., sending alerts, timeline events, etc. and receiving user edits and zone definitions and the like)

a server database 316, including but not limited to:

a data storage database 3160 for storing data associated with each electronic device (e.g., each camera) of each user account, as well as data processing models, processed data results, and other relevant metadata (e.g., names of data results, location of electronic device, creation time, duration, settings of the electronic device, etc.) associated with the data, where (optionally) all or a portion of the data and/or processing associated with the hub device 180 or smart devices are stored securely;

an account database 3162 for storing account information for user accounts, including user account information such as user profiles 3163, information and settings for linked hub devices and electronic devices (e.g., hub device identifications), hub device specific secrets, relevant user and hardware characteristics (e.g., service tier, device model, storage capacity, processing capabilities, etc.), user interface settings, data review preferences, etc., where the information for associated electronic devices includes, but is not limited to, one or more device identifiers (e.g., MAC address and UUID), device specific secrets, and displayed titles;

a device information database 3164 for storing device information related to one or more devices such as device profiles 3165, e.g., device identifiers and hub device specific secrets, independently of whether the corresponding hub devices have been associated with any user account; and an event information database 3166 for storing event information such as event records 3168, e.g., event log information, event categories, and the like.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise rearranged in various implementations. In some implementations, the memory 306, optionally, stores a subset of the modules and data structures identified above. Furthermore, the memory 306, optionally, stores additional modules and data structures not described above.

Figure 3B:
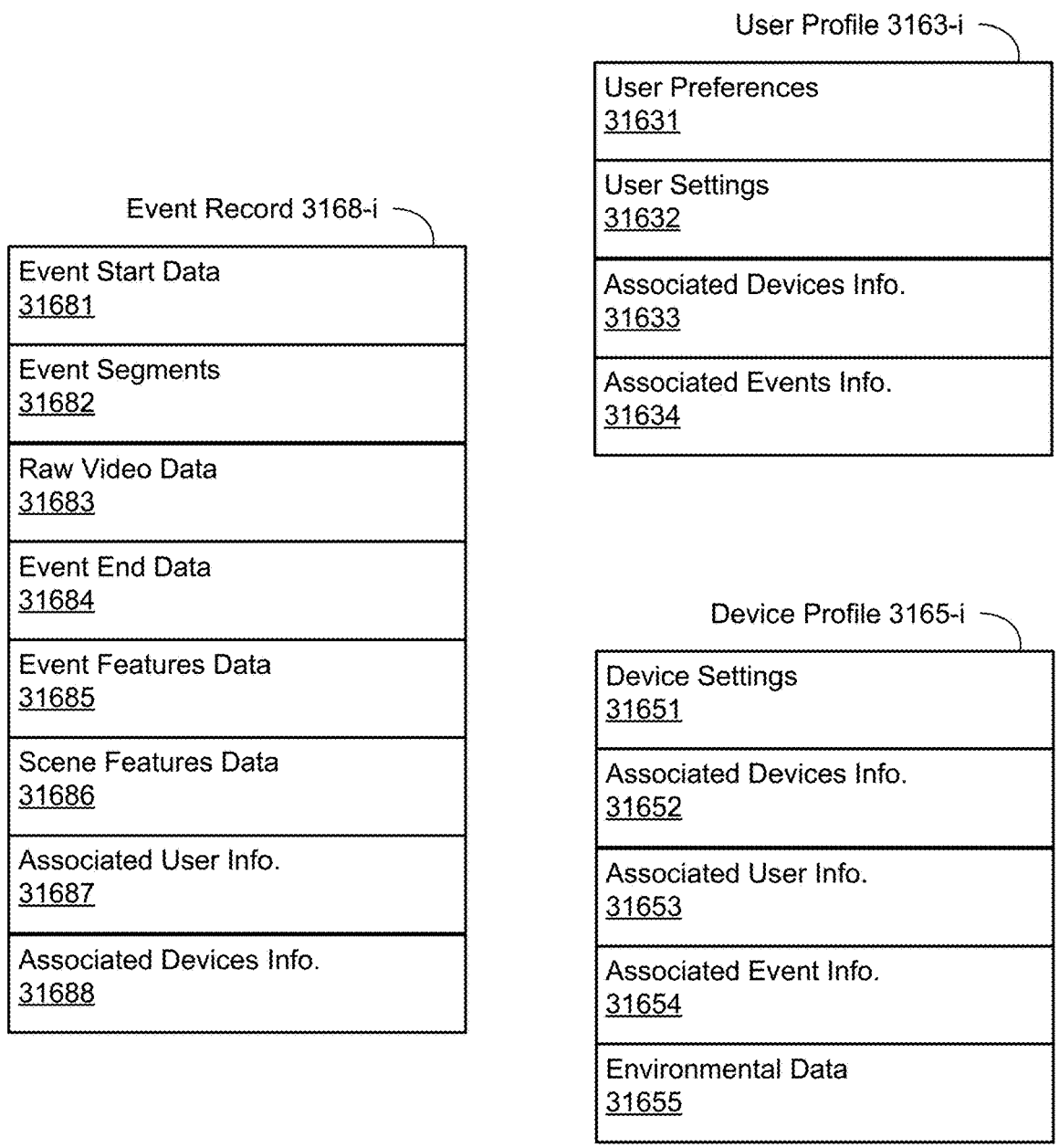
FIG. 3B illustrates various data structures used by some implementations.

FIG. 3B illustrates various data structures used by some implementations, including an event record 3168-*i*, a user profile 3163-*i*, and a device profile 3165-*i*. The event record 3168-*i* corresponds to an event i and data for the event i. In some instances, the data for motion event i includes event start data 31681 indicating when and/or how the event started, event segments data 31682, raw video data 31683, event end data 31684 indicating when and/or how the event ended, event features data 31685, scene features data 31686, associated user information 31687, and associated devices information 31688. In some instances, the event record 3168-*i* includes only a subset of the above data. In some instances, the event record 3168-*i* includes additional event data not shown such as data regarding event/motion masks.

The event start data 31681 includes date and time information such as a timestamp and optionally includes additional information such as information regarding the amount of motion present, a motion start location, amount of audio present, characteristics of the audio, and the like. Similarly, the event end data 31684 includes date and time information such as a timestamp and optionally includes additional information such as information regarding the amount of motion present, a motion start location, amount of audio present, characteristics of the audio, and the like.

The event segments 31682 includes information regarding segmentation of motion event i. In some instances, event segments are stored separately from the raw video data 31683. In some instances, the event segments are stored at a lower display resolution than the raw video data. For example, the event segments are optionally stored at 480p or 780p and the raw video data is stored at 1080i or 1080p. Storing the event segments at a lower display resolution enables the system to devote less time and resources to retrieving and processing the event segments. In some instances, the event segments are not stored separately and the segmentation information includes references to the raw video data 31683 as well as date and time information for reproducing the event segments. In some implementations, the event segments include one or more audio segments (e.g., corresponding to video segments).

The event features data 31685 includes information regarding event features such as event categorizations/classifications, object masks, motion masks, identified/recognized/tracked motion objects (also sometimes called blobs), information regarding features of the motion objects (e.g., object color, object dimensions, velocity, size changes, etc.), information regarding activity in zones of interest, and the like. The scene features data 31686 includes information regarding the scene in which the event took place such as depth map information, information regarding the location of windows, televisions, fans, the ceiling/floor, etc., information regarding whether the scene is indoors or outdoors, information regarding zones of interest, and the like. In some implementations, the event features data includes audio data, such as volume, pitch, characterizations, and the like.

The associated user information 31687 includes information regarding users associated with the event such as users identified in the event, users receiving notification of the event, and the like. In some instances, the associated user information 31687 includes a link, pointer, or reference to a user profile 3163 for to the user. The associated devices information 31688 includes information regarding the device or devices involved in the event (e.g., a camera 118 or 106 that recorded the event). In some instances, the associated devices information 31688 includes a link, pointer, or reference to a device profile 3165 for the device. In a specific example, the associated user information 31687 includes user identity of a visitor that has been recognized by the doorbell camera 106 when the visitor approaches the doorbell camera 106 and knocks at the door.

The user profile 3163-i corresponds to a user i associated with the smart home network (e.g., smart home network 202) such as a user of a hub device 204, a user identified by a hub device 204, a user who receives notifications from a hub device 204 or from the server system 164, and the like. In some instances, the user profile 3163-i includes user preferences 31631, user settings 31632, associated devices information 31633, and associated events information 31634. In some instances, the user profile 3163-i includes only a subset of the above data. In some instances, the user profile 3163-i includes additional user information not shown such as information regarding other users associated with the user i.

The user preferences 31631 include explicit user preferences input by the user as well as implicit and/or inferred user preferences determined by the system (e.g., server system 164 and/or client device 220). In some instances, the inferred user preferences are based on historical user activity and/or historical activity of other users. The user settings 31632 include information regarding settings set by the user i such as notification settings, device settings, and the like. In some instances, the user settings 31632 include device settings for devices associated with the user i.

The associated devices information 31633 includes information regarding devices associated with the user i such as devices within the user's smart home environment 100 and/or client devices 220. In some instances, associated devices information 31633 includes a link, pointer, or reference to a corresponding device profile 3165. Associated events information 31634 includes information regarding events associated with user i such as events in which user i was identified, events for which user i was notified, events corresponding to user i's smart home environment 100, and the like. In some instances, the associated events information 31634 includes a link, pointer, or reference to a corresponding event record 3168.

The device profile 3165-i corresponds to a device i associated with a smart home network (e.g., smart home network 202) such a hub device 204, a camera 118 or 106, a client device 220, and the like. In some instances, the device profile 3165-i includes device settings 31651, associated devices information 31652, associated user information 31653, associated event information 31654, and environmental data 31655. In some instances, the device profile 3165-i includes only a subset of the above data. In some instances, the device profile 3165-i includes additional device information not shown such as information regarding whether the device is currently active.

The device settings 31651 include information regarding the current settings of device i such as positioning information, mode of operation information, and the like. In some instances, the device settings 31651 are user-specific and are set by respective users of the device i. The associated devices information 31652 includes information regarding other devices associated with device i such as other devices linked to device i and/or other devices in the same smart home network as device i. In some instances, the associated devices information 31652 includes a link, pointer, or reference to a respective device profile 3165 corresponding to the associated device.

The associated user information 31653 includes information regarding users associated with the device such as users receiving notifications from the device, users registered with the device, users associated with the smart home network of the device, and the like. In some instances, the associated user information 31653 includes a link, pointer, or reference to a user profile 3163 corresponding to the associated user.

The associated event information 31654 includes information regarding events associated with the device i such as historical events involving the device i. In some instances, the associated event information 31654 includes a link, pointer, or reference to an event record 3168 corresponding to the associated event.

The environmental data 31655 includes information regarding the environment of device i such as information regarding whether the device is outdoors or indoors, information regarding the light level of the environment, information regarding the amount of activity expected in the environment (e.g., information regarding whether the device is in a private residence versus a busy commercial property), information regarding environmental objects (e.g., depth mapping information for a camera), and the like.

Figure 4:
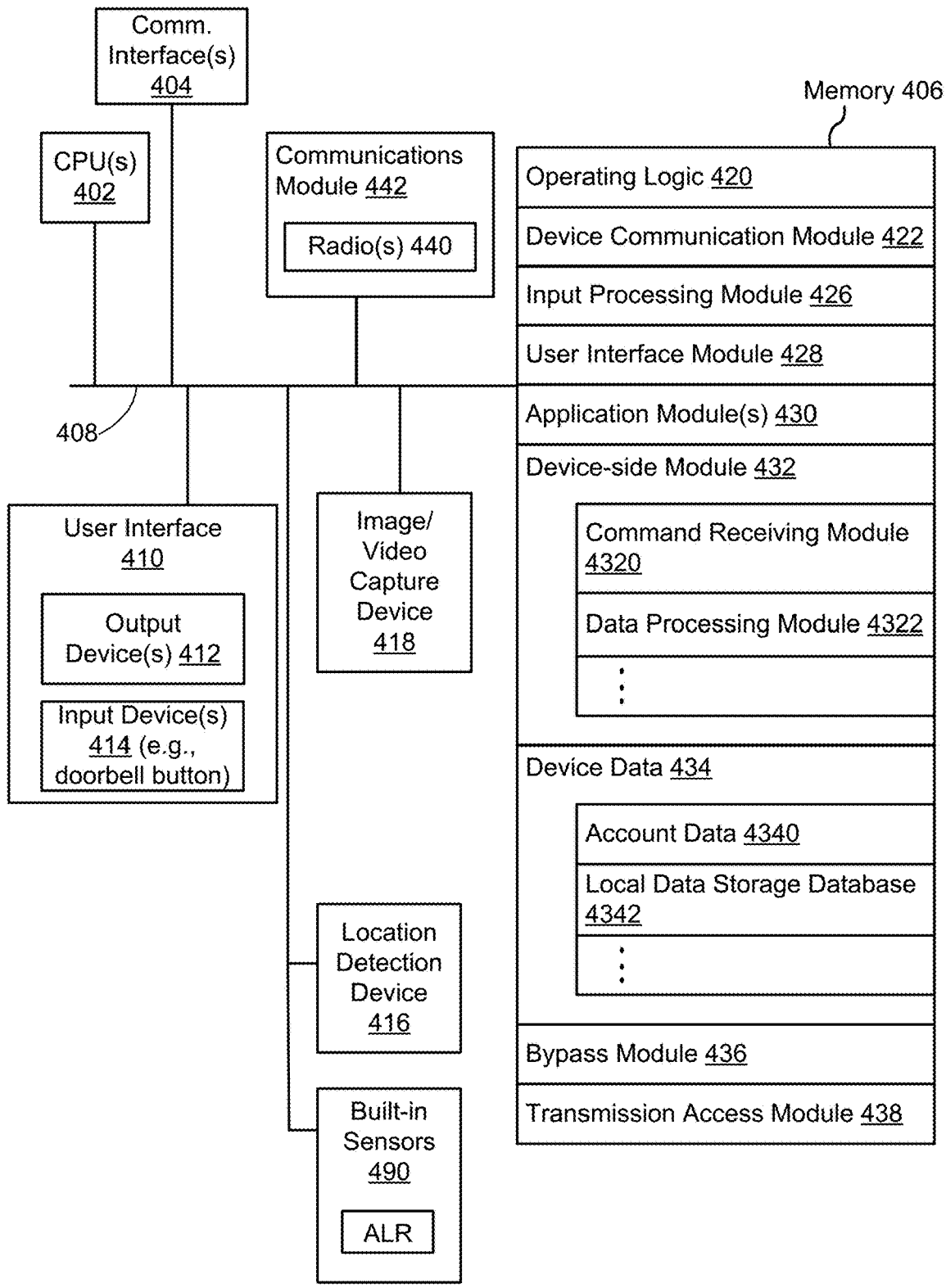
FIG. 4 is a block diagram illustrating a representative smart device, e.g., a doorbell camera, in accordance with some implementations.

FIG. 4 is a block diagram illustrating a representative smart device 204 in accordance with some implementations. In some implementations, the smart device 204 (e.g., any smart device of a smart home environment 100, FIG. 1) includes one or more processing units (e.g., CPUs, ASICs, FPGAs, microprocessors, and the like) 402, one or more communication interfaces 404, memory 406, communications module 442 with radios 440, and one or more communication buses 408 for interconnecting these components (sometimes called a chipset). In some implementations, the user interface 410 includes one or more output devices 412 that enable presentation of media content, including one or more speakers and/or one or more visual displays (e.g., a light ring formed on a periphery of a front cover plate, a button or a camera lens opening of a doorbell camera). In some implementations, the user interface 410 also includes one or more input devices 414, including user interface components that facilitate user input such as a keyboard, a mouse, a voice-command input unit or microphone, a touch screen display, a touch-sensitive input pad, a gesture capturing camera, a doorbell button or other input buttons or controls. Furthermore, some smart devices 204 use a microphone and voice recognition or a camera and gesture recognition to supplement or replace the keyboard. In some implementations, the smart device 204 includes one or more image/video capture devices 418 (e.g., cameras, video cameras, scanners, photo sensor units).

Figure 7B:
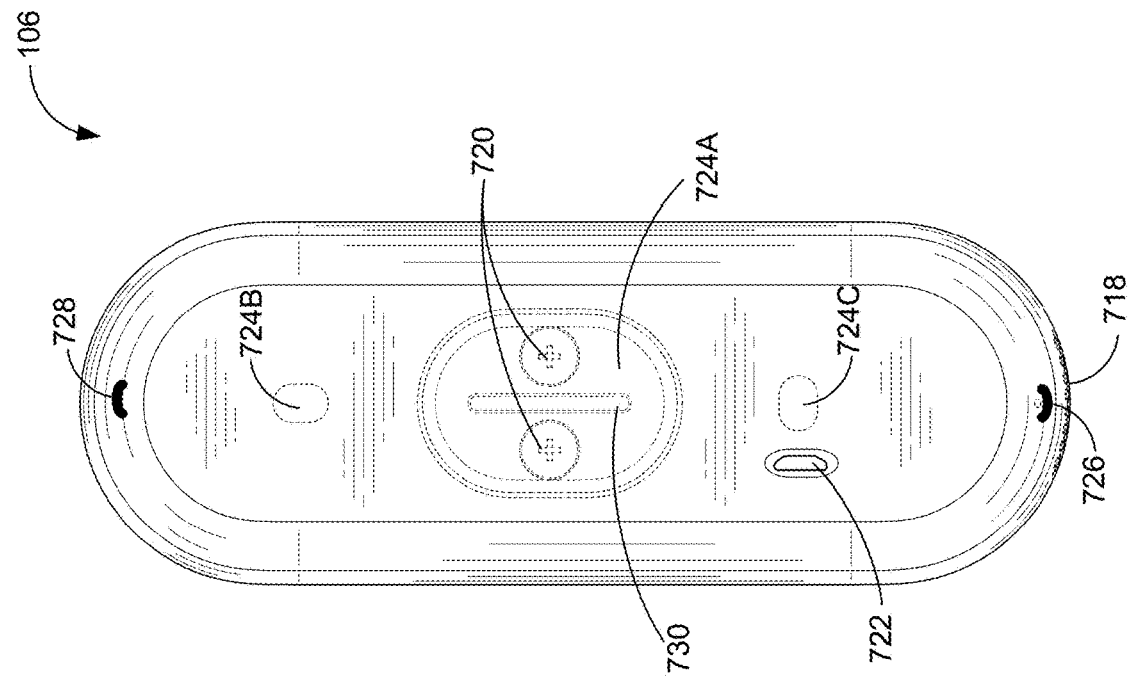
FIGS. 7A and 7B are a front view and a rear view of a doorbell camera in accordance with some implementations, respectively.
Figure 7A:
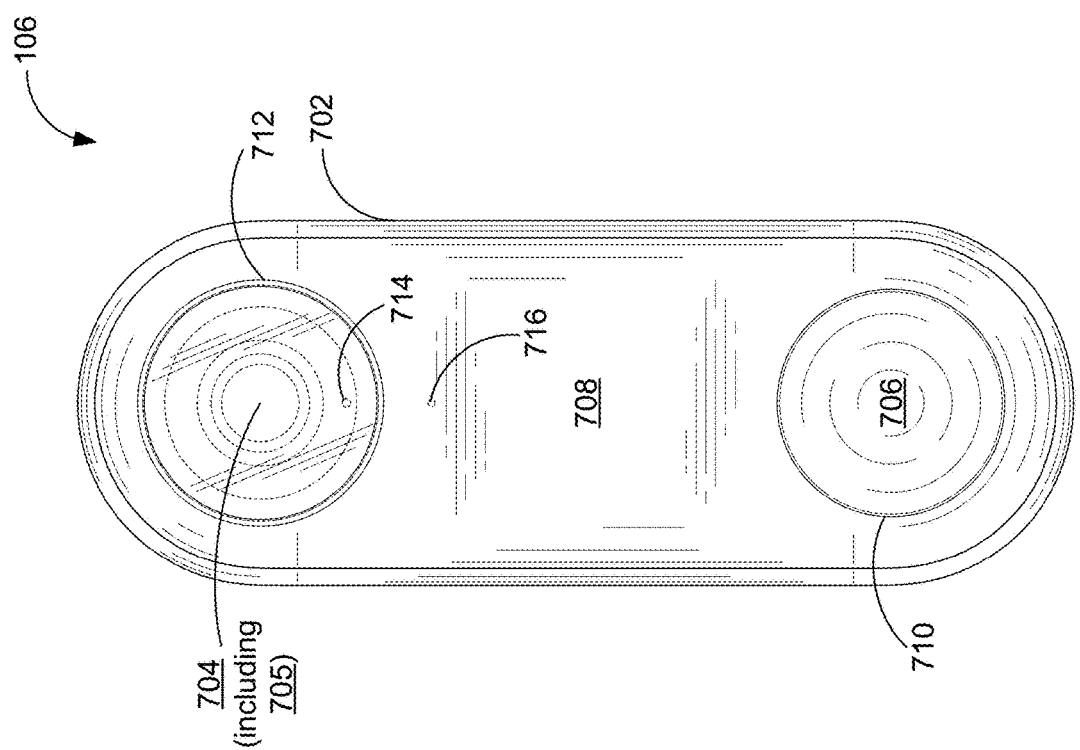

The built-in sensors 490 include, for example, one or more thermal radiation sensors, ambient temperature sensors, humidity sensors, IR sensors, occupancy sensors (e.g., using RFID sensors), ambient light sensors (e.g., the ambient light sensor (ALS) assembly 714 in FIG. 7A), motion detectors, accelerometers, and/or gyroscopes.

The radios 440 enable one or more radio communication networks in the smart home environments, and allow a smart device 204 to communicate with other devices. In some implementations, the radios 440 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.5A, WirelessHART, MiWi, etc.) custom or standard wired protocols (e.g., Ethernet, HomePlug, etc.), and/or any other suitable communication protocol, including communication protocols not yet developed as of the filing date of this document.

The communication interfaces 404 include, for example, hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.5A, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

The memory 406 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 406, or alternatively the non-volatile memory within the memory 406, includes a non-transitory computer readable storage medium. In some implementations, the memory 406, or the non-transitory computer readable storage medium of the memory 406, stores the following programs, modules, and data structures, or a subset or superset thereof:

- operating logic 420 including procedures for handling various basic system services and for performing hardware dependent tasks;
- a device communication module 422 for connecting to and communicating with other network devices (e.g., network interface 160, such as a router that provides Internet connectivity, networked storage devices, network routing devices, server system 164, etc.) connected to one or more networks 162 via one or more communication interfaces 404 (wired or wireless);
- an input processing module 426 for detecting one or more user inputs or interactions from the one or more input devices 414 and interpreting the detected inputs or interactions;
- a user interface module 428 for providing and displaying a user interface in which settings, captured data, and/or other data for one or more devices (e.g., the smart device 204, and/or other devices in smart home environment 100) can be configured and/or viewed;
- one or more applications 430 for execution by the smart device (e.g., games, social network applications, smart home applications, and/or other web or non-web based applications) for controlling devices (e.g., executing commands, sending commands, and/or configuring settings of the smart device 204 and/or other client/ electronic devices), and for reviewing data captured by devices (e.g., device status and settings, captured data, or other information regarding the smart device 204 and/or other client/electronic devices);
- a device-side module 432, which provides device-side functionalities for device control, data processing and data review, including but not limited to:
  - a command receiving module 4320 for receiving, forwarding, and/or executing instructions and control commands (e.g., from a client device 220, from a server system 164, from user inputs detected on the user interface 410, etc.) for operating the smart device 204;
  - a data processing module 4322 for processing data captured or received by one or more inputs (e.g., input devices 414, image/video capture devices 418, location detection device 416), sensors (e.g., built-in sensors 490), interfaces (e.g., communication interfaces 404, radios 440), and/or other components of the smart device 204, and for preparing and sending processed data to a device for review (e.g., client devices 220 for review by a user); and
- device data 434 storing data associated with devices (e.g., the smart device 204), including, but not limited to:
  - account data 4340 storing information related to user accounts loaded on the smart device 204, wherein such information includes cached login credentials, smart device identifiers (e.g., MAC addresses and UUIDs), user interface settings, display preferences, authentication tokens and tags, password keys, etc.;
  - local data storage database 4342 for selectively storing raw or processed data associated with the smart device 204 (e.g., video surveillance footage captured by a camera 118 or 106);
- a bypass module 436 for detecting whether radio(s) 440 are transmitting signals via respective antennas coupled to the radio(s) 440 and to accordingly couple radio(s) 440 to their respective antennas either via a bypass line or an amplifier (e.g., a low noise amplifier); and
- a transmission access module 438 for granting or denying transmission access to one or more radio(s) 440 (e.g., based on detected control signals and transmission requests).

Each of the above identified elements may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise rearranged in various implementations. In some implementations, the memory 406, optionally, stores a subset of the modules and data structures identified above. Furthermore, the memory 406, optionally, stores additional modules and data structures not described above.

In some implementations, the smart device 204 provides visual and/or audio feedback to a person near the smart device 204. The feedback may concern an operational status of the smart device 204 itself, a status of the outdoor environment surrounding the smart device 204, the operational status of another electronic device associated with the smart device 204, and/or the operational status of a set of electronic devices associated with the smart device 204.

In some implementations, the smart device 204 includes a doorbell camera 106, and the doorbell camera 106 has physical features that can provide real time camera status information and/or audio/visual content that indicates or complements camera processing activity, to occupants of the environment without disturbing operation of the camera or the occupants. In some implementations, such physical features include a light ring that is provided at a periphery of a front cover, a periphery of a camera lens, or a periphery of a button on the doorbell camera 106, and is configured to be visible to occupants of the environment from a wide range of positions in the environment. For example, in some implementations, the light ring is configured to be visible in a range of positions that include at least areas of the environment that fall within the camera's field of view. In some implementations, the light ring has a plurality of individual lighting elements, each having associated lighting characteristics that are individually controllable to reflect local camera status and/or a camera processing state/operation. In some configurations, the controllable lighting characteristics include one or more of on/off state, hue, saturation and/or brightness/intensity. In some configurations, the lighting elements are controlled individually to display an overall pattern (e.g., an entire ring or one or more portions of a ring) that can be static or dynamic (e.g., one or more rotating portions of a ring) consisting of a single displayed color or two or more different displayed colors. Each of the patterns can conform to a visual language and correspond to a camera status and/or a camera processing operation. For example, a color or a pattern of two or more different colors (static or dynamic) can indicate that the camera is on or off, has an active or inactive connection to a server (e.g., a server that performs image processing or that distributes video and notifications to remote users), is actively processing local information from the environment, or has received a notification or status information from another smart device in the home environment or a server. In some implementations that include a speaker, the physical feature (e.g., a light ring) can be controlled by the camera to display patterns that correspond to audible beats/rhythm of music or audio messages being played from the speaker in a range of colors selected to match the tempo/feeling of the music or audio messages. Providing such information via light patterns is advantageous as this is readily perceived by all/most users in the environment (even if they do not have access to camera smart phone application) without intruding on activity of occupants in the environment, as audible alerts could do sometimes.

Figure 5:
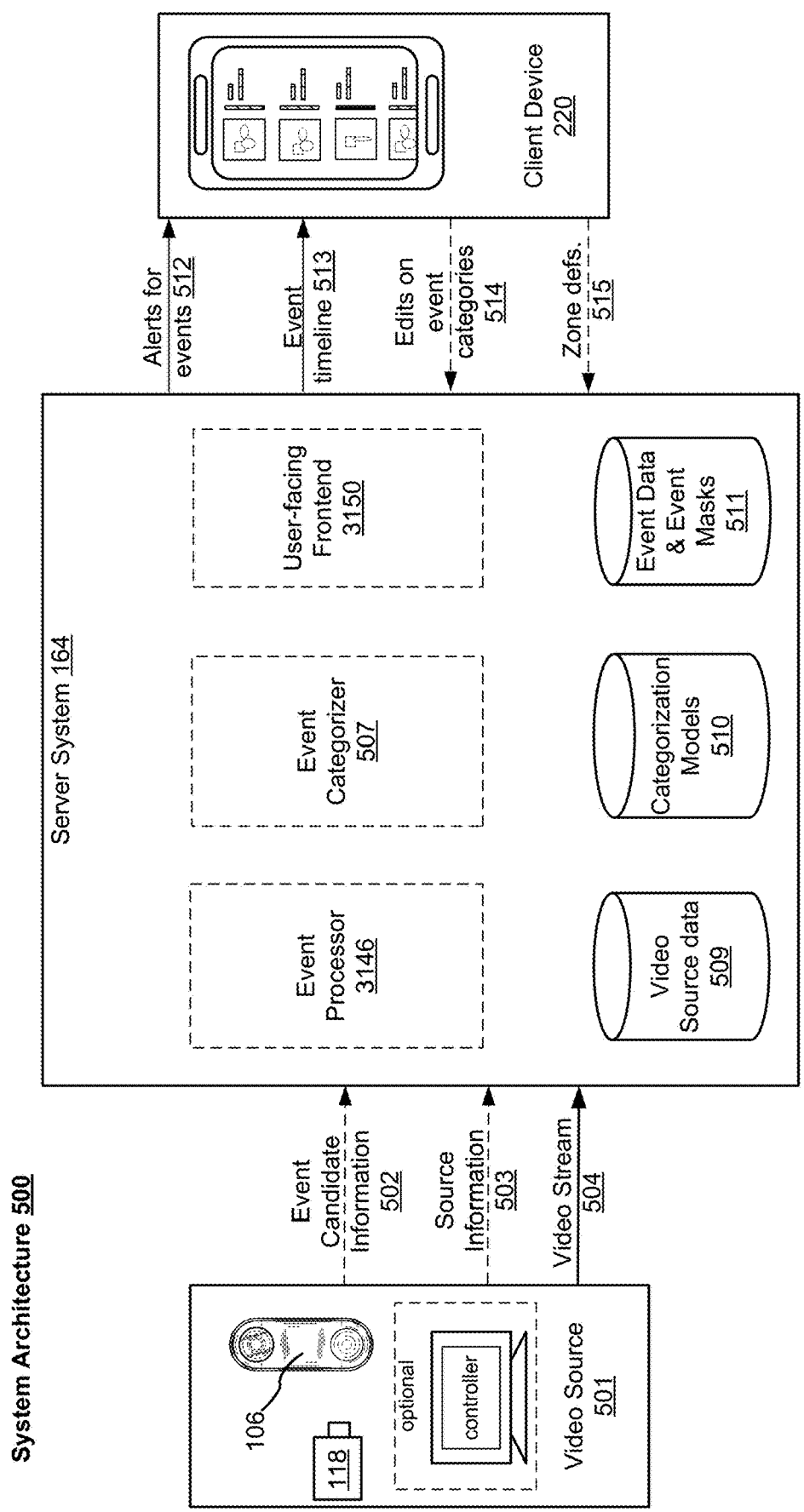
FIG. 5 illustrates a representative system architecture for video analysis and categorization, in accordance with some implementations.

FIG. 5 illustrates a representative system architecture 500. In some implementations, the server system 164 includes functional modules for an event processor 3146, an event categorizer 507, and a user-facing frontend 3150. The event processor 3146 obtains the event candidates (e.g., by processing the video stream, by receiving the event start information from the video source 501, or by detecting a user press on a doorbell button of a doorbell camera). In some implementations, the event candidates include motion event candidates. It is noted that the video source 501 is an example of the video source 222 shown in FIG. 2B. In some implementations, the event candidates include a user press on a doorbell button of a doorbell camera. In some implementations, the event candidates include audio and/or visual aspects. The event categorizer 3148 categorizes the event candidates into different event categories. The user-facing frontend 3150 generates event alerts and facilitates review of the events by a reviewer through a review interface on a client device 220. The user-facing frontend also receives user edits on the event categories, user preferences for alerts and event filters, and zone definitions for zones of interest. The event categorizer optionally revises event categorization models and results based on the user edits received by the user-facing frontend 3150. The server system 164 also includes a video source data database 509, event categorization models database 510, and event data and event masks database 511. In some implementations, each of these databases is part of the server database 316 (e.g., part of data storage database 3160).

The server system 164 receives one or more video stream(s) 504 from the video source 501 and optionally receives event candidate information 502 such as event start information (e.g., motion start information) and source information 503 such as device settings for a camera 118 or 106 (e.g., a device profile 3165 for camera 118 or 106). In some implementations, the event processor sub-module 3146 communicates with the video source 501. The server system sends alerts for events 512 and event timeline information 513 to the client device 220. The server system 164 optionally receives user information from the client device 220 such as edits on event categories 514 and zone definitions 515.

A data processing pipeline processes video information (e.g., a live video feed) received from a video source 501 (e.g., including a camera 118 or 106 and an optional controller device) and/or audio information received from one or more smart devices in real-time to identify and categorize events occurring in the smart home environment, and sends real-time event alerts and a refreshed event timeline to a client device 220 associated with a reviewer account for the smart home environment. The data processing pipeline also processes stored information (such as stored video feeds from a video source 501) to reevaluate and/or re-categorize events as necessary, such as when new information is obtained regarding the event and/or when new information is obtained regarding event categories (e.g., a new activity zone is obtained from the user).

After video and/or audio data is captured at a smart device, the data is processed to determine if any potential event candidates are present. In some implementations, the data is initially processed at the smart device (e.g., video source 501 or camera 118 or 106). Thus, in some implementations, the smart device sends event candidate information, such as event start information, to the server system 164. In some implementations, the data is processed at the server system 164 for event start detection. In some implementations, the video and/or audio data is stored on server system 164 (e.g., in video and source data database 509). In some implementations, the video stream is stored on a server distinct from server system 164. In some implementations, after a motion start is detected, the relevant portion of the video stream is retrieved from storage (e.g., from video and source data database 509).

In some implementations, the event identification process includes segmenting the video stream into multiple segments then categorizing the event candidate within each segment. In some implementations, categorizing the event candidate includes an aggregation of background factors, entity detection and identification, motion vector generation for each motion entity, entity features, and scene features to generate motion features for the event candidate. In some implementations, the event identification process further includes categorizing each segment, generating or updating an event log based on categorization of a segment, generating an alert for the event based on categorization of a segment, categorizing the complete event, updating the event log based on the complete event, and generating an alert for the event based on the complete event. In some implementations, a categorization is based on a determination that the event occurred within a particular zone of interest. In some implementations, a categorization is based on a determination that the event candidate involves one or more zones of interest. In some implementations, a categorization is based on audio data and/or audio event characterization.

The event analysis and categorization process may be performed by the smart device (e.g., the video source 501) and the server system 164 cooperatively, and the division of the tasks may vary in different implementations, for different equipment capability configurations, and/or for different network and server load situations. After the server system 164 categorizes the event candidate, the result of the event detection and categorization may be sent to a reviewer associated with the smart home environment.

In some implementations, the server system 164 stores raw or compressed video data (e.g., in a video and source data database 509), event categorization models (e.g., in an event categorization model database 510), and event masks and other event metadata (e.g., in an event data and event mask database 511) for each of the video sources 222. In some implementations, the video data is stored at one or more display resolutions such as 480p, 780p, 1080i, 1080p, and the like.

In some implementations, the video source 501 (e.g., the camera 118 or 106) transmits a live video feed to the remote server system 164 via one or more networks (e.g., the network(s) 162). In some implementations, the transmission of the video data is continuous as the video data is captured by the camera 118 or 106. In some implementations, the transmission of video data is irrespective of the content of the video data, and the video data is uploaded from the video source 501 to the server system 164 for storage irrespective of whether any motion event has been captured in the video data. In some implementations, the video data may be stored at a local storage device of the video source 501 by default, and only video portions corresponding to motion event candidates detected in the video stream are uploaded to the server system 164 (e.g., in real-time).

In some implementations, the video source 501 dynamically determines at what display resolution the video stream is to be uploaded to the server system 164. In some implementations, the video source 501 dynamically determines which parts of the video stream are to be uploaded to the server system 164. For example, in some implementations, depending on the current server load and network conditions, the video source 501 optionally prioritizes the uploading of video portions corresponding to newly detected motion event candidates ahead of other portions of the video stream that do not contain any motion event candidates; or the video source 501 uploads the video portions corresponding to newly detected motion event candidates at higher display resolutions than the other portions of the video stream. This upload prioritization helps to ensure that important motion events are detected and alerted to the reviewer in real-time, even when the network conditions and server load are less than optimal. In some implementations, the video source 501 implements two parallel upload connections, one for uploading the continuous video stream captured by the camera 118 or 106, and the other for uploading video portions corresponding to detected motion event candidates. At any given time, the video source 501 determines whether the uploading of the continuous video stream needs to be suspended temporarily to ensure that sufficient bandwidth is given to the uploading of the video segments corresponding to newly detected motion event candidates.

In some implementations, the video stream uploaded for cloud storage is at a lower quality (e.g., lower resolution, lower frame rate, higher compression, etc.) than the video segments uploaded for motion event processing.

As shown in FIG. 5, the video source 501 includes a camera 118 or 106, and an optional controller device. In some implementations, the camera 118 or 106 includes sufficient on-board processing power to perform all necessary local video processing tasks (e.g., cuepoint detection for motion event candidates, video uploading prioritization, network connection management, etc.), and the camera 118 or 106 communicates with the server system 164 directly, without any controller device acting as an intermediary. In some implementations, the camera 118 or 106 captures the video data and sends the video data to the controller device for the necessary local video processing tasks. The controller device optionally performs the local processing tasks for multiple cameras. For example, there may be multiple cameras in one smart home environment (e.g., the smart home environment 100, FIG. 1), and a single controller device receives the video data from each camera and processes the video data to detect motion event candidates in the video stream from each camera. The controller device is responsible for allocating sufficient outgoing network bandwidth to transmitting video segments containing motion event candidates from each camera to the server before using the remaining bandwidth to transmit the video stream from each camera to the server system 164. In some implementations, the continuous video stream is sent and stored at one server facility while the video segments containing motion event candidates are send to and processed at a different server facility.

In some implementations, the smart device sends additional source information 503 to the server system 164. This additional source information 503 may include information regarding a device state (e.g., IR mode, AE mode, DTPZ settings, etc.) and/or information regarding the environment in which the device is located (e.g., indoors, outdoors, night-time, day-time, etc.). In some implementations, the source information 503 is used by the server system 164 to perform event detection and/or to categorize event candidates. In some implementations, the additional source information 503 includes one or more preliminary results from video processing performed by the camera 118 or 106 (e.g., categorizations, object recognitions, motion masks, etc.).

In some implementations, the video portion after an event start incident is detected is divided into multiple segments. In some implementations, the segmentation continues until event end information (sometimes also called an "end-of-event signal") is obtained. In some implementations, the segmentation occurs within the server system 164 (e.g., by the event processor module 3146). In some implementations, the segmentation includes generating overlapping segments. For example, a 10-second segment is generated every second, such that a new segment overlaps the prior segment by 9 seconds.

In some implementations, each of the multiple segments is of the same or similar duration (e.g., each segment has a 10-12 second duration). In some implementations, the first segment has a shorter duration than the subsequent segments. Keeping the first segment short allows for real time initial categorization and alerts based on processing the first segment. The initial categorization may then be revised based on processing of subsequent segments. In some implementations, a new segment is generated if the motion entity enters a new zone of interest.

In some implementations, after the event processor module obtains the video portion corresponding to an event candidate, the event processor module 3146 obtains background factors and performs motion entity detection identification, motion vector generation for each motion entity, and feature identification. Once the event processor module 3146 completes these tasks, the event categorizer module 3148 aggregates all of the information and generates a categorization for the motion event candidate. In some implementations, false positive suppression is optionally performed to reject some motion event candidates before the motion event candidates are submitted for event categorization. In some implementations, determining whether a motion event candidate is a false positive includes determining whether the motion event candidate occurred in a particular zone. In some implementations, determining whether a motion event candidate is a false positive includes analyzing an importance score for the motion event candidate. The importance score for a motion event candidate is optionally based on zones of interest involved with the motion event candidate, background features, motion vectors, scene features, entity features, motion features, motion tracks, and the like.

In some implementations, the video source 501 has sufficient processing capabilities to perform, and does perform, the background estimation, motion entity identification, the motion vector generation, and/or the feature identification.

Figure 6:
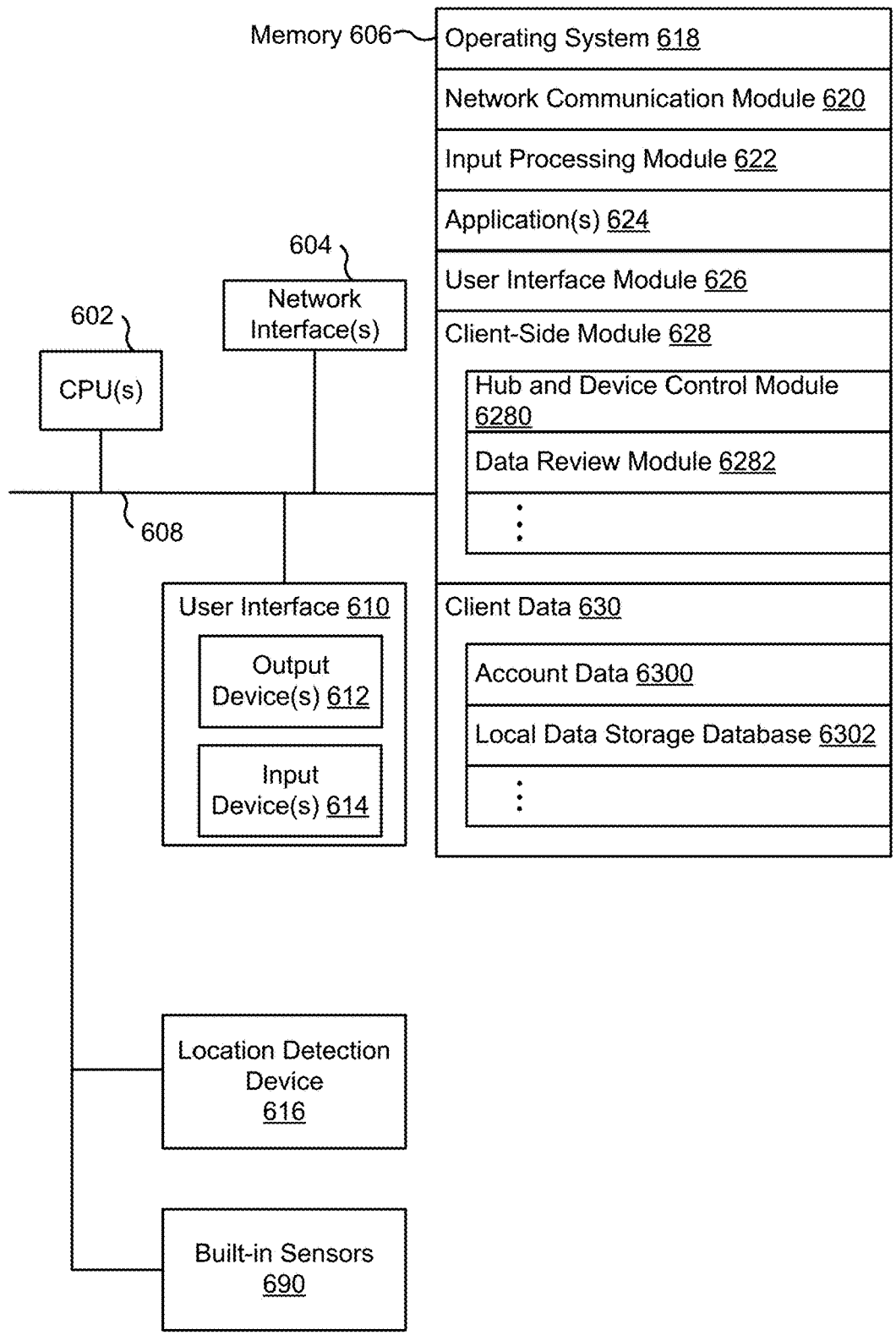
FIG. 6 is a block diagram illustrating a representative client device, in accordance with some implementations.

FIG. 6 is a block diagram illustrating a representative client device 220 associated with a user account in accordance with some implementations. The client device 220, typically, includes one or more processing units (CPUs) 602, one or more network interfaces 604, memory 606, and one or more communication buses 608 for interconnecting these components (sometimes called a chipset). Optionally, the client device also includes a user interface 610 and one or more built-in sensors 690 (e.g., accelerometer and gyroscope). The user interface 610 includes one or more output devices 612 that enable presentation of media content, including one or more speakers and/or one or more visual displays. The user interface 610 also includes one or more input devices 614, including user interface components that facilitate user input such as a keyboard, a mouse, a voice-command input unit or microphone, a touch screen display, a touch-sensitive input pad, a gesture capturing camera, or other input buttons or controls. Furthermore, some the client devices use a microphone and voice recognition or a camera and gesture recognition to supplement or replace the keyboard. In some implementations, the client device includes one or more cameras, scanners, or photo sensor units for capturing images (not shown). Optionally, the client device includes a location detection device 616, such as a GPS (global positioning satellite) or other geo-location receiver, for determining the location of the client device.

The memory 606 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 606, optionally, includes one or more storage devices remotely located from one or more processing units 602. The memory 606, or alternatively the non-volatile memory within the memory 606, includes a non-transitory computer readable storage medium. In some implementations, the memory 606, or the non-transitory computer readable storage medium of the memory 606, stores the following programs, modules, and data structures, or a subset or superset thereof:

- an operating system 618 including procedures for handling various basic system services and for performing hardware dependent tasks;
- a network communication module 620 for connecting the client device 220 to other systems and devices (e.g., client devices, electronic devices, and systems connected to one or more networks 162) via one or more network interfaces 604 (wired or wireless);
- an input processing module 622 for detecting one or more user inputs or interactions from one of the one or more input devices 614 and interpreting the detected input or interaction;
- one or more applications 624 for execution by the client device (e.g., games, social network applications, smart home applications, and/or other web or non-web based applications) for controlling devices (e.g., sending commands, configuring settings, etc. to hub devices and/or other client or electronic devices) and for reviewing data captured by the devices (e.g., device status and settings, captured data, or other information regarding the hub device or other connected devices);
- a user interface module 622 for providing and displaying a user interface in which settings, captured data, and/or other data for one or more smart devices (e.g., smart devices 204 in smart home environment 100) can be configured and/or viewed;
- a client-side module 628, which provides client-side functionalities for device control, data processing and data review, including but not limited to:
  - a hub device and device control module 6280 for generating control commands for modifying an operating mode of the hub device or the electronic devices in accordance with user inputs; and
  - a data review module 6282 for providing user interfaces for reviewing data processed by the server system 164; and
- client data 630 storing data associated with the user account and electronic devices, including, but not limited to:
  - account data 6300 storing information related to both user accounts loaded on the client device and electronic devices (e.g., of the video sources 222) associated with the user accounts, wherein such information includes cached login credentials, hub device identifiers (e.g., MAC addresses and UUIDs), electronic device identifiers (e.g., MAC addresses and UUIDs), user interface settings, display preferences, authentication tokens and tags, password keys, etc.; and
  - a local data storage database 6302 for selectively storing raw or processed data associated with electronic devices (e.g., of the video sources 222, such as a camera 118 or 106).

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise rearranged in various implementations. In some implementations, the memory 606, optionally, stores a subset of the modules and data structures identified above. Furthermore, the memory 606, optionally, stores additional modules and data structures not described above.

Example Functions of a Doorbell Camera System

In some implementations, the server-side module 314 of the server system 164 determines that a user press is being applied on a button of a doorbell camera 106, and in accordance with the determination, sends a push notification to a user mobile application 624 executed on a client device 220. Optionally, when such a notification is pushed into the client device 220, the user mobile application 624 is automatically activated to display a user interface to receive a user response. Alternatively, in some implementations, the server system 164 detects motion or recognizes a face of a person in a field of view of the doorbell camera 106 based on video images recorded by the camera 106. In accordance with the detection or the recognition, the server system 164 sends a push notification to the user mobile application 624 executed on the client device 220 in association with the doorbell camera 106. Optionally, facial recognition is implemented on device (i.e., locally on the doorbell camera 106) and in cloud (e.g., remotely in the server system 164). In some implementations, when face recognition is implemented locally, it is simplified according to local computational capability available at the doorbell camera 106. As a result of the facial recognition, the push notification is sent to the client device 220 indicating whether a known person has been recognized or a visitor is an unrecognizable person (e.g., a stranger). In some implementations, face recognition is only conducted after a user press on the doorbell button is detected.

Alternatively, in some implementations, face recognition is conducted before a user press on the doorbell button, and triggers a process to monitor and detect the user press on the doorbell button. Specifically, a motion stream is obtained from a camera (e.g., the doorbell camera 106) of a smart home environment 100. The doorbell camera 106 has a field of view of an entryway of the smart home environment 100. The motion stream is a video stream depicting movement or information regarding amount of motion in a scene. The server 164 determines based on an analysis of the motion stream that a visitor is approaching the entryway, and performs a facial recognition operation based on one or more frames of the motion stream. The server 164 then determines based on an outcome of the facial recognition operation whether the person is known to the smart home environment. A time window is initiated in response to the determination that a visitor is approaching, and the time window is optionally predefined to correspond to a reasonable amount of time for the visitor to complete approaching/reaching the entryway. During the time window, the server 164 obtains contextual information from one or more sensors of the smart home environment 100, and determines whether an action from the visitor (e.g., a doorbell press, a door knock) is detected within the time window. In accordance with an action being detected within the time window, a first type of response is initiated. Examples of the first type of response include sending a first type of notification to a user of a client device. In accordance with no action being detected within the time window, a second type of response is initiated. Examples of the second type of response include sending a second type of notification to a user of a client device.

In some implementations, images captured by the doorbell camera 106 may be distorted (e.g., show a fisheye effect), as the doorbell camera 106 may use a wide-angle lens assembly to capture the images. The images are processed in the server system 164 before they are sent to the client device 220 for display in the user mobile application 624. In such embodiments, the distortion of the images may be at least partially compensated before the images are displayed on the client device 220.

In some implementations, when the client device 220 loads the user mobile application 624 associated with the doorbell camera 106, the application 624 initiates a live video and/or audio connection to the doorbell camera, and allows video and audio information to stream within a predetermined duration of time (e.g., <1 second). Further, in some implementations, the user mobile application 624 displays an event list of events detected form the video and audio information received from the doorbell camera 106. Each event of the event list of events is represented by a thumbnail on a user interface of the user mobile application 624. In some implementations, the user mobile application 624 stores location information of a plurality of cameras used in the smart home environment 100, including the doorbell camera 106.

In some implementations, the doorbell camera 106, the client device 220 and the remote server 164 allow a user to interact with a visitor to a smart home environment 100 via an electronic greeting system of the smart home environment 100. The server 164 obtains motion data from a smart device (e.g., the doorbell camera 106), and identifies based on analysis of the motion data a motion event involving a visitor approaching an entryway (e.g., a door) of the smart home environment 100. The server 164 obtains context information from the smart home environment 100 for the motion event, and based on the context information, identifies a plurality of appropriate actions available to a user of a client device for interacting with the visitor via the doorbell camera 106. The identified actions are presented to the user of the client device 220. For example, the appropriate actions include, but are not limited to, displaying a visual pattern on a light ring of the doorbell camera 106, broadcasting an audio message to the visitor, and collecting more information concerning the visitor using the doorbell camera 106.

The doorbell integrated in the doorbell camera 106 can also take advantage of computational and communication capabilities of the doorbell camera 106. In some implementations, a schedule can be defined on the user mobile application 624 of the client device 220 to control a remote chime device that rings in response to a user press on the doorbell button of the doorbell camera 106. For example, in accordance with the schedule, the remote chime device may be controlled to remain silent from 12 PM to 4 PM every day, thereby allowing a homeowner to have a quiet afternoon nap. In some embodiments, the remote chime may be implemented in other smart devices that include a speaker, such as a hazard detector, thermostat, or other device described in accordance with FIG. 1.

Doorbell Camera

FIGS. 7A and 7B are a front view and a rear view of a doorbell camera 106 in accordance with some implementations. The doorbell camera 106 integrates a camera module and a doorbell system within a device housing 702. The camera module includes a lens assembly 704 and an image sensor that are configured to capture images, and a wireless transceiver that is configured to exchange data with a remote server over one or more wireless communication networks. The doorbell system is configured to ring a remote chime device in response to a press on a button top 706 of a button assembly. The device housing 702 has a substantially elongated shape. Optionally, the elongated shape has a width that is less than a width of most doorframes available in the market, such that the doorbell camera 106 can be directly mounted on a commonly available doorframe. In some implementations, the lens assembly 704 of the camera module is disposed within a top half of the device housing 702, and the button top 706 of the doorbell system is disposed on a bottom half of the device housing 702. When the doorbell camera 106 is mounted on a wall surface or a doorbell frame, the lens assembly 704 is located on top of the button top 706, thereby allowing a field of view of the lens assembly 704 to remain clear when a user presses the button top 706.

Referring to FIGS. 7A and 7B, in this example, the device housing 702 includes an elongated body and two semicircular ends, and the elongated body has a width substantially equal to a diameter of the two semicircular ends. The lens assembly 704 is concentric with a top one of the two semicircular ends, and the button top 706 is concentric with a bottom one of the two semicircular ends. Such physical arrangements not only create a more aesthetically pleasing look for the doorbell camera 106, but also ensure sufficient separation between the lens assembly 702 and the button top 706, thereby avoiding a user press on the button top 706 interfering with video recording of the camera module (e.g., by blocking the field of view of the lens assembly 704).

In some implementations, the device housing 702 includes a front cover plate 708 that seals at least a plurality of electronic components, the lens assembly and a button assembly within the device housing 702. Optionally, the front cover plate 708 has a peripheral edge that interfaces with a body of the device housing 702. The peripheral edge is configured to form a water tight seal with an edge of the body of the device housing 702, thereby preventing water from entering the device housing 702 through the interface between the front cover plate 708 and the body of the device housing 702.

The button top 706 is part of the button assembly, and is configured to receive the user press on the button assembly. The front cover plate 708 therefore includes a button opening 710 configured to expose the button top 706 of the button assembly on the front cover plate 708. The button top 706 has a first diameter that is substantially smaller than a second diameter of the opening 710 of the front cover plate 708. The button top 706 can move vertically in a direction perpendicular to a plane of the button opening 710 (e.g., in a downward direction into or out of the device housing 702) when a user presses on the button top 706. The button assembly includes a flexible edge that surrounds the button top 706 and fills a gap between the button opening 710 and the button top 706. The flexible edge enables a range of motion for movement of the button top 706 with respect to the button opening 710 of the front cover plate 708. In some implementations, the flexible edge of the button assembly forms a water tight seal with an edge of the button opening 710 of the front cover plate 708, and prevents water from entering the device housing 702 via the opening 710.

In some implementations, the front cover plate 708 of the device housing 702 is made of a single piece of material (e.g., glass or plastic). The single piece of material creates a more aesthetically pleasing look, reduces production costs by reducing the number of parts, reduces complexity by eliminating the need to tightly fit multiple sections, increases waterproofing of the device by eliminating seams between multiple sections, and increases a quality of the images captured by image sensors.

In some implementations (also in FIGS. 9F, 9G, 11D and 11E), the front cover plate 708 includes a camera opening 712 configured to expose the lens assembly 704. The lens assembly 704 includes a cover glass 705 configured to protect the lens assembly 704. An edge of the cover glass 705 of the lens assembly 704 forms a watertight seal with an edge of the camera opening 712. Alternatively, in some implementations, the front cover plate 708 does not have the camera opening 712, but includes a substantially transparent area 712 that is disposed on top of the lens assembly 704 to allow light (e.g., visible and infrared light) to enter the lens assembly 704. In some implementations, the camera opening or transparent area 712 has a size substantially larger than that of lenses of the lens assembly 704. By these means, the camera opening or transparent area 712 of the front cover plate 708 does not become a limiting factor for a margin of a field of view of the doorbell camera 106, and the size of the lens assembly 704 determines the field of view for the doorbell camera 106. Stated another way, the margin of the field of view is limited by physical features of the lens assembly 704, rather than by the camera opening or transparent area 712 of the front cover plate 708. Such a substantially large camera opening or transparent area 712 enables a substantially wide angle view for the doorbell camera 106 when a wide angle lens assembly is applied.

In some implementations, the front cover plate 708 includes a substantially opaque area that is distinct from the substantially transparent area of the camera opening 712. An interior surface of the substantially opaque area is painted with dark color ink (e.g., black ink). The dark color ink could be transparent to infrared light, such that the substantially opaque area is opaque to visible light and transparent to infrared light. In an example, the interior surface of the front cover plate 708 is entirely covered by the ink except the button opening 710 exposing the button top 706 and the substantially transparent area 712 covering the lens assembly 704. Further, in some implementations, the doorbell camera 106 includes an array of IR illuminators (not shown in FIGS. 7A and 7B). The IR illuminators can be disposed below any portion behind the substantially opaque area. The IR illuminators are concealed under the front cover plate 708, but light generated by the IR illuminators can still penetrate the front cover plate 708 to illuminate the field of view of the doorbell camera 106.

In some implementations, the doorbell camera 106 further includes an ambient light sensor (ALS) assembly 714 at least partially disposed within the lens assembly 704. The ALS assembly 714 is configured to measure amount of light entering the lens assembly 702 from an ambient environment surrounding the lens assembly 704. Part of the ALS assembly 714 is exposed to incoming light, and therefore, visible from a front of the doorbell camera 106 in the lens assembly 704. The ALS assembly 714 is configured to compare the measured amount of light to a threshold illumination level, and the doorbell camera uses corresponding comparison results to determine its operation mode between a daytime mode and a night mode. Specifically, in some situations, the ALS assembly 714 determines that the mount of light entering the lens assembly 702 exceeds the threshold illumination level, and the doorbell camera 106 enables the daytime mode in which the IR illuminators are turned off. Alternatively, in some situations, the ALS assembly 714 determines that the amount of light entering the lens assembly 702 is not greater than the threshold illumination level, and the doorbell camera 106 enables a night mode in which the IR illuminators are optionally turned on to illuminate the field of view of the doorbell camera 106. In some implementations, two distinct threshold illumination levels are applied to enable a first type of switching from the daytime mode to the night mode and a second type of switching from the night node to the daytime mode. Thus, use of the ALS assembly 714 can be used to cause switching between the daytime and night modes and enable/disable the IR illuminators in an efficient manner.

The doorbell camera 106 may further include a microphone and a speaker. In some implementations, the front cover plate 708 includes a microphone aperture 716 to allow sound signals to reach the microphone concealed within the doorbell camera 106. In some implementations, the device housing 702 includes a plurality of speaker openings 718 at its bottom rim surface. When the doorbell camera 106 is mounted onto a wall or doorframe surface, the speaker holes 718 are not visible from a gaze of a visitor approaching or standing near the surface, while still being able to broadcast audio messages to the visitor. In embodiments where the doorbell camera 106 includes both the microphone and the speaker, a remote user may review live video streams captured by the camera module of the doorbell camera 106, and have a conversation in real-time with the visitor.

In some implementations, both the microphone and the speaker of the doorbell camera 106 adopt waterproof features to deter water permeation into the electronic components within the device housing 702 and cause irreversible damages to the electronic components. Specifically, the waterproof features may be integrated at the openings 716 and 718 to deter water permeation (such as from a jet or stream of water impinging on at least one of the openings 716 and 718). In an example, the microphone may be disposed inside the device housing 102, and include a sound input region offset from the microphone aperture 716. A hydrophobic membrane is affixed to a first interior surface of the device housing 702 and covers the microphone aperture 716 thereon. The hydrophobic membrane is configured to allow transmission of sound waves and block water intrusion from the microphone aperture 716. A sound transmission channel couples the sound input region of the microphone to the microphone aperture 716 on the front cover plate 708. The sound transmission channel is configured to allow sound waves transmitted through the microphone aperture 716 and the hydrophobic membrane to be coupled to the sound input region of the microphone without exposing the sound input region to damaging pressures due to environmental impacts on the doorbell camera 106. In some implementations, the speaker may also adopt a sound input region offset from the speaker openings 718 and a respective hydrophobic membrane to block water intrusion while allowing transmission of sound waves from the speaker openings 718 to the sound input region of the speaker. More details of some examples of waterproof microphones and speakers are discussed in U.S. patent application Ser. No. 15/209,735, filed Jul. 13, 2016, titled "Magnetic Mount Assembly of a Camera," which is hereby incorporated by its entirety.

Referring to FIG. 7B, in some implementations, a rear exterior surface of the device housing 702 provides an access to at least one of a plurality of wire terminals 720 and an electrical connector 722 (e.g., a Universal Serial Bus (USB) connector). The plurality of wire terminals 720 include a first terminal and a second terminal configured to receive a power supply line and a ground line for driving the plurality of electronic components contained within the device housing 106. Specifically, in an example, each of the power supply line and the ground line includes a respective fork terminal coupled to a corresponding wire terminal 720, and fixed thereto by tightening a screw fastener. Under some circumstances, the doorbell camera 106 is mounted on a wall or doorframe surface in place of a conventional doorbell, and the plurality of wire terminals 722 are coupled to receive the power supply line and the ground line that were applied to drive the conventional doorbell.

Alternatively, in some implementations, the electrical connector 722 is coupled to one or more electrical wires for receiving a power supply or exchanging data with another electronic device. In an example, both the plurality of wire terminals 720 and the electrical connector 722 are available on the rear exterior surface of the device housing 702. The electrical connector 722 is only connected in a factory for testing, calibrating and/or setting up the doorbell camera 106, while the plurality of wire terminals 720 are applied to provide the power supply in the factory and/or after the doorbell camera 106 is shipped to a customer.

In some implementations, the rear exterior surface of the device housing 702 includes a plurality of recesses 724. For example, the plurality of wire terminals 720 is disposed within a first recess 724A, and separated by a separation 730 that protects the lines connected to the first and second terminals of the plurality of wire terminals 720 from being shorted to each other. A height of the separation 730 may be smaller than a depth of the first recess, and the depth of the first recess 724A is configured to be greater than a height of a connection formed between the plurality of wire terminals 720 and the power supply or ground line. Specifically, in the above example, when the screw fastener is used to fix the fork terminal of the power supply or ground line onto one of the plurality of wire terminals 720, the depth of the first recess 724A is configured to be greater than a total height summing a thickness of the fork terminal and a height of a screw head of the screw fastener. As such, when the power supply and ground lines are connected (i.e., tightened) to the plurality of wire terminals 720, the lines extend beyond the first recess 724A, while the corresponding connections (i.e., at the plurality of wire terminals 720) do not rise beyond the rear exterior surface of the device housing 702.

Figure 8B:
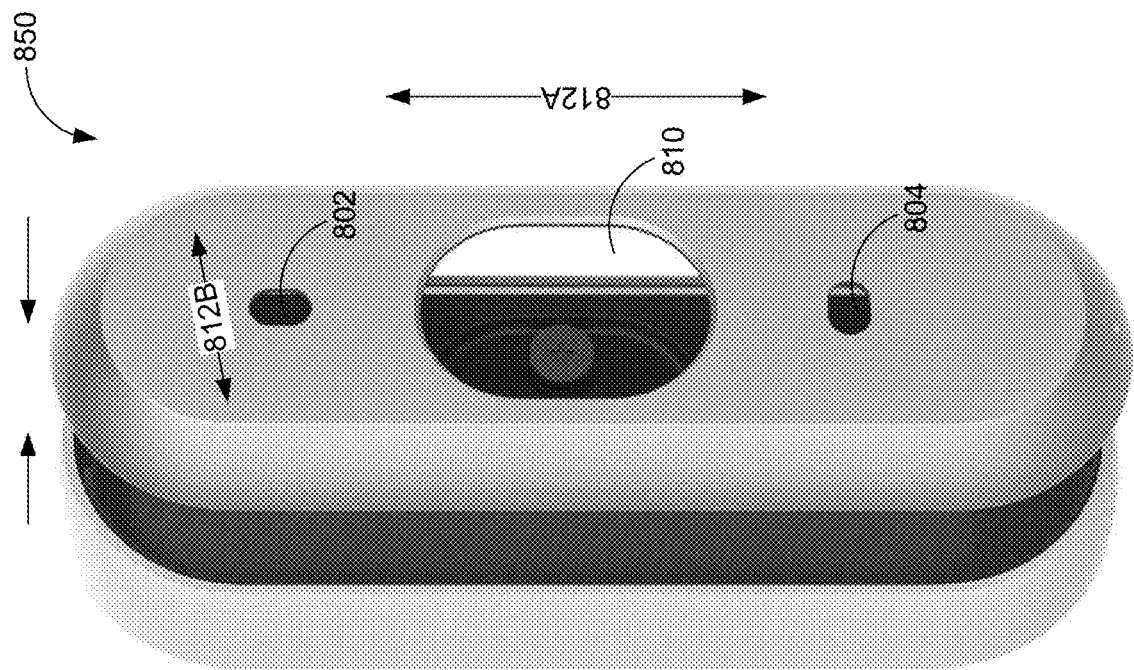
FIG. 8B is a process of mounting a doorbell camera onto the mounting plate in accordance with some implementations.
Figure 8A:
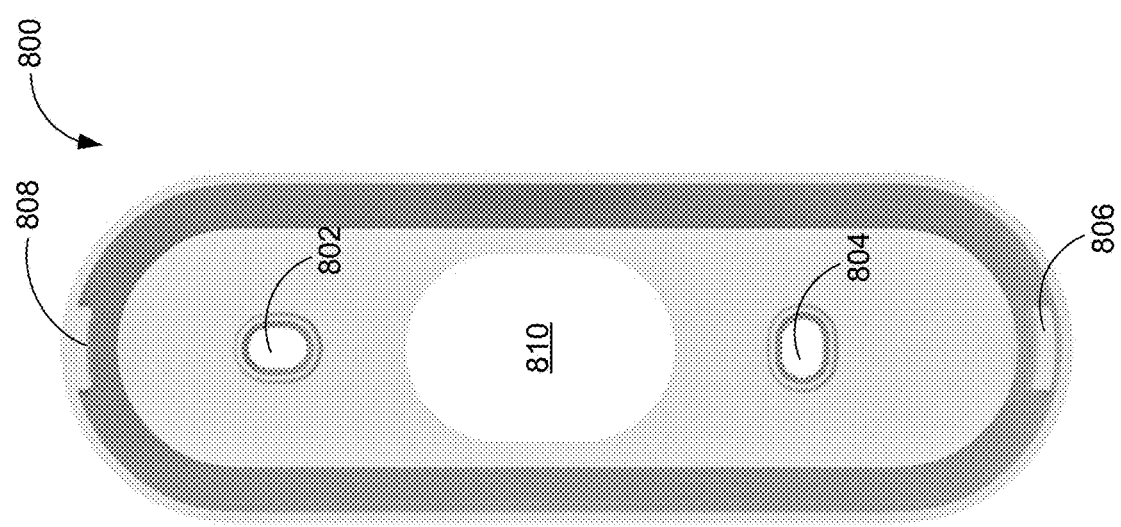
FIG. 8A is a mounting plate configured to support a doorbell camera in accordance with some implementations.

FIG. 8A is a mounting plate 800 configured to support a doorbell camera 106 in accordance with some implementations, and FIG. 8B is a process 850 of mounting a doorbell camera 106 onto the mounting plate 800 in accordance with some implementations. The mounting plate 800 has a substantially elongated shape that matches that of the device housing 702. The mounting plate 800 has a raised edge, and is configured to receive the device housing 702. When the device housing 702 is mechanically coupled to the mounting plate 800, the device housing 702 sits on or within the mounting plate 800, and the rear exterior surface of the device housing 702 is disposed substantially close to, or come into contact with a front surface of the mounting plate 800, allowing the rear exterior surface of the device housing 702 to be wrapped in the raised edge of the mounting plate 800.

In some implementations, the mounting plate 800 includes a first open slot 802 and a second open slot 804 that are perpendicular to each other. For example, the first open slot 802 may be aligned with and parallel to a longitudinal edge of the elongated mounting plate 800, and the second open slot 804 may be oriented to be perpendicular with the longitudinal edge. Each of the first and second open slots 802 and 804 is configured to receive a body of a fastener (e.g., a screw) and block an enlarged head of the fastener. Each of the first and second open slots has a respective width that is larger than a first width of the body of the fastener and smaller than a second width of the enlarged head of the fastener. When the mounting plate 800 is being mounted to a surface, the respective fasteners are fastened onto the surface via the first and second open slots, thereby holding the mounting plate 800 between the enlarged heads of the fasteners and the surface. Before the respective fasteners are tightened onto the surface, a position of the mounting plate 800 is adjusted by moving the mounting plate 800, including the first and second open slots, with respect to the respective fasteners. The first and second open slots 802 and 804 can therefore define two perpendicular directions of adjustment for the position of the mounting plate 800, and each of these two perpendicular directions of adjustment is associated with a respective range of adjustment defined according to a longitudinal size of the respective open slot.

Further, in some implementations, the heads of the fasteners fastened into the first and second open slots 802 and 804 rises beyond the front surface of the mounting plate 800 by a head height. Referring to FIG. 7B, the rear exterior surface of the device housing 702 may include a second recess 724B and a third recess 724C configured to cover the heads of the fasteners fastened into the first and second open slots 802 and 804, when the device housing 702 is mounted onto the mounting plate 800. Each of the second and third recess 724B and 724C may have a respective depth substantially greater than the respective head height of the fasteners fastened into the first and second open slots 802 and 804.

In some implementations, the mounting plate 800 includes a first fastener structure 806 located at a first end of the mounting plate 800, and the first fastener structure 806 is configured to mate with a second fastener structure 726 located at a corresponding end of the rear exterior surface of the device housing 702. The device housing 702 is mechanically fixed onto the mounting plate 800, when the first and second fastener structures are fastened to each other. In some implementations, the mounting plate 800 includes a third fastener structure 808 located at a second end of the mounting plate 800, and the third fastener structure 808 is configured to mate with a fourth fastener structure 728 located at a corresponding end of the rear exterior surface of the device housing 702. The device housing 702 is mechanically fixed onto the mounting plate 800, when the first and third fastener structures 806 and 808 are fastened to the second and fourth fastener structures 726 and 728, respectively. In a specific example, the third fastener structure 808 includes an extended holding structure, and the fourth fastener structure 728 of the device housing 702 includes a recess hole configured to receive the extended holding structure. The extended holding structure may be pulled out of the recess hole of the device housing 702 when the device housing 702 slides along a longitudinal direction 812A or a transversal direction 812B, but not when the device housing 702 is pulled by a separation force having a direction perpendicular to a front exterior surface of the device housing 702. Further, the first fastener structure 806 may include a snap fastener configured to lock onto the respective fastener structure 726 of the device housing 702. Once locked onto each other, the snap fastener 806 and the respective fastener structure 726 securely hold the device housing 702 onto the mounting plate 800, thereby onto the wall or doorframe surface to which the mounting plate 800 is mounted. Alternatively, in another example, each of the first and third fastener structures 806 and 808 includes a respective snap fastener configured to lock onto the respective fastener structure 726 or 728.

The mounting plate 800 may include an opening 810 configured to let through one or more electrical wires, such as the power supply line and the ground line that can be electrically coupled to the plurality of wire terminals 720 of the doorbell camera 106. In some implementations, in accordance with process 850 of mounting the doorbell camera 106, the mounting plate 800 is fixed onto an area of the surface where the power supply line and the ground line are located. The power supply and ground lines come out of the surface, pass through the opening 810, and are connected to the plurality of wire terminals 720 located at the rear exterior surface of the doorbell camera 106. The device housing 702 is then mounted onto the mounting plate 800 via the fasteners 806 and 808 and their respective fasteners 726 and 728 located at the rear exterior surface of the doorbell camera 106. The power supply and ground lines are concealed within the opening 810 of the mounting plate 800 and the first recess 724A of the device housing 702. Under these circumstances, the depth of the first recess 724A is configured such that a cumulative depth that sums the depth of the first recess 724A and a depth of the opening 810 is greater than a height of connections formed between the plurality of wire terminals 720 and the power supply and ground lines. By these means, the device housing 720 may be securely mounted onto the mounting plate 800 without being withheld by the connections formed between the plurality of wire terminals 720 and the power supply and ground lines.

FIGS. 9A-9E are a front perspective view, a rear perspective view, a side view, a top view and a bottom view of a doorbell camera 106 mounted onto a mounting plate 800 in accordance with some implementations, respectively. FIGS. 9F and 9G are two exploded views of a doorbell camera 106 mounted onto a mounting plate 800 in accordance with some implementations, respectively. The doorbell camera 106 and mounting plate 800 are fixed on a mounting surface (e.g., a wall or doorframe surface) via fasteners 902 and 904. A rear surface 906 of the mounting plate 800 adheres to the surface, and the plurality of wire terminals 720 are covered by the doorbell camera 106 (e.g., entirely concealed between the doorbell camera 106 and the surface). When the doorbell camera 106 is fixed onto the surface, a lens assembly 704 of the doorbell camera 106 faces away from the surface for capturing images of a field of view (i.e., a camera scene), and a button top 706 sits on a front surface of the doorbell camera and receives a user press for activating a remote chime device.

In some implementations, the device housing 702 is mechanically fixed onto the mounting plate 800 when a first fastener structure 806 located at a front surface of the mounting plate 800 is fastened to a second fastener structure 726 located at the rear exterior surface of the device housing 702. In a specific example, the first fastener structure 806 includes a snap fastener configured to lock onto the respective fastener structure 726 of the device housing 702. The mounting plate 800 may further include a first hole 908. The first hole 908 may be located on or in proximity to the raised edge of the mounting plate 800, allowing a release tool 912 to access the first hole 908 when a flat portion of the rear surface of the mounting plate 800 adheres to the mounting surface. The first hole 908 may be located on or in proximity to the first fastener structure 806. The release tool 912 may have an extended long apical part that fits into the first hole 908. The release tool 912 can be inserted into the first hole 908 to gain an access to the first fastener structure 806 or the second fastener structure 726 that mates with the first fastener structure 806 when the device housing 702 is mechanically fixed onto the mounting plate 800. The first fastener structure 806 and the second fastener structure 726 are unfastened from each other when the release tool 912 is inserted into the first hole 908 and applies an unlocking action (e.g., a press and a twist) on them.

In some implementations, a microphone aperture 716 is located on a front cover plate 708 of the doorbell camera 106 to allow sound wave to reach a microphone concealed behind the front cover plate 708. A plurality of speaker openings 718 may be located at a bottom rim surface of the device housing 702 of the doorbell camera 106, and configured to broadcast audio messages (e.g., coming from a remote client device) to a visitor near the mounting surface. When the doorbell camera 106 is mounted onto the mounting surface, the speaker openings 718 are not visible from a gaze of the visitor as the visitor is approaching or standing near the mounting surface. Also, the speaker openings 718 may be configured to face down towards a ground to prevent water and dust from dropping into a speaker box via the speaker openings 718. Given that the doorbell camera 106 includes both the microphone and the speaker, a remote user may have a full duplex audio session (i.e., receiving audio messages from the visitor and sending audio message to the visitor) with the visitor via the doorbell camera 106, while reviewing live video streams captured by the camera module of the doorbell camera 106 on the remote client device 220 associated with the remote user.

Figure 9F:
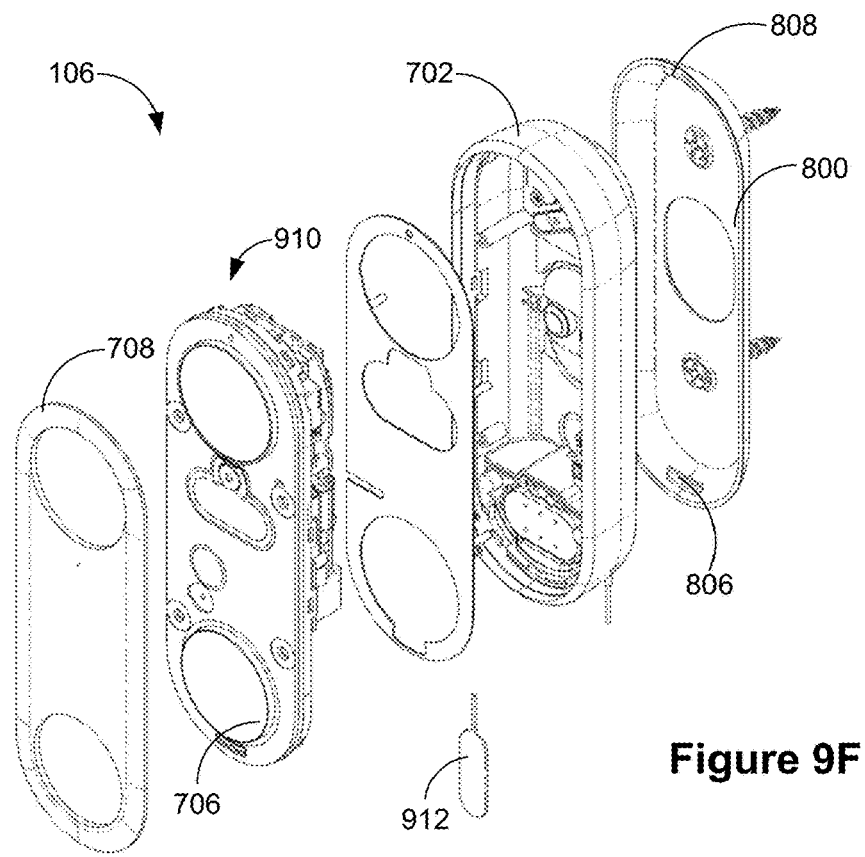
FIGS. 9F and 9G are two exploded views of a doorbell camera mounted onto a mounting plate 800 in accordance with some implementations.
Figure 9G:
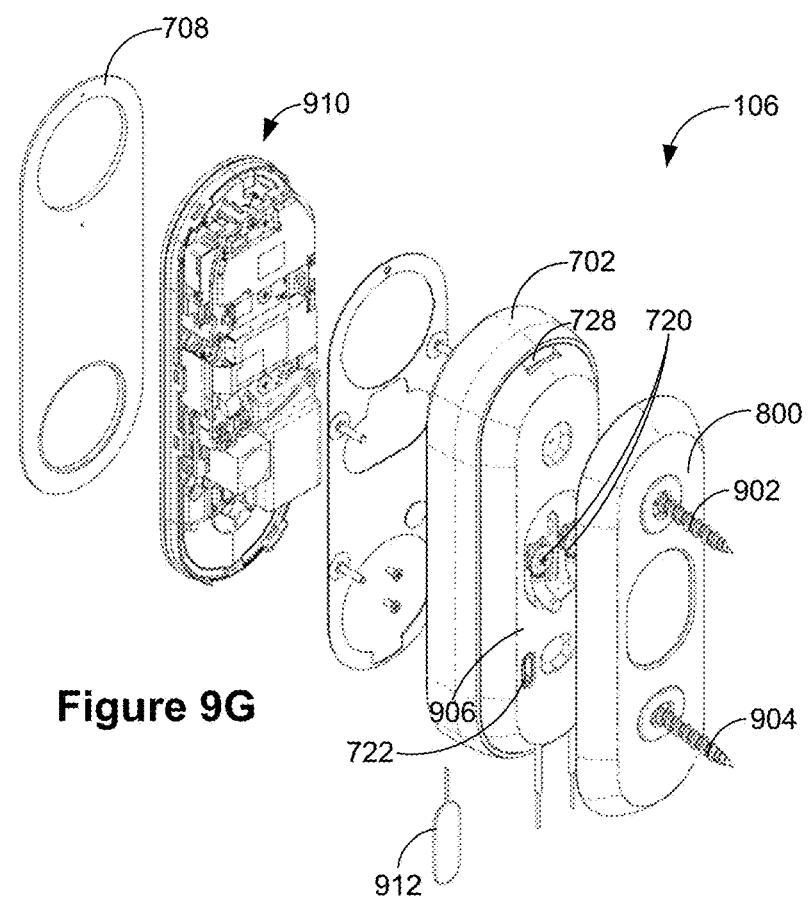

Referring to FIGS. 9F and 9G, the doorbell camera 106 may include a stack 910 of electronic and optical components. The stack 910 is securely enclosed within the device housing 702 when the front cover plate 708 is assembled onto a body of the device housing 702. In some implementations, the stack 910 of electronic and optical components are assembled prior to being enclosed within the device housing 702. In some implementations, the electronic and optical components are sequentially disposed into the body of the device housing 702 to form the stack 910 that are thereby enclosed within the device housing 702 when the front cover plate 708 in assembled onto the body of the device housing 702.

Voltage Compatibility of a Doorbell Camera

Figure 10A:
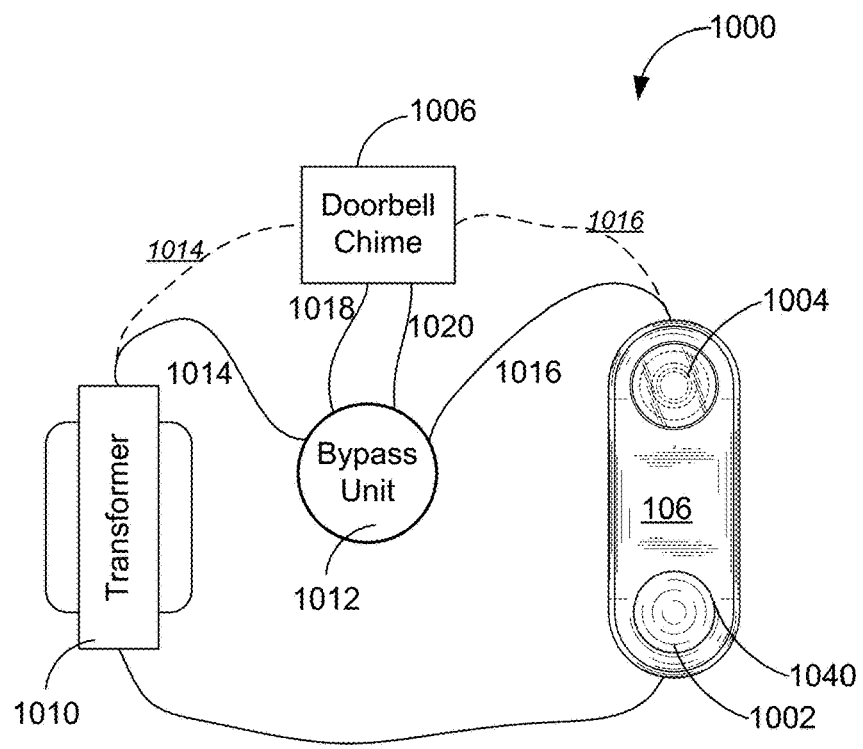
FIG. 10A is a block diagram of a doorbell camera system that operates at a first camera mode and a second doorbell camera in accordance with some implementations.
Figure 10B:
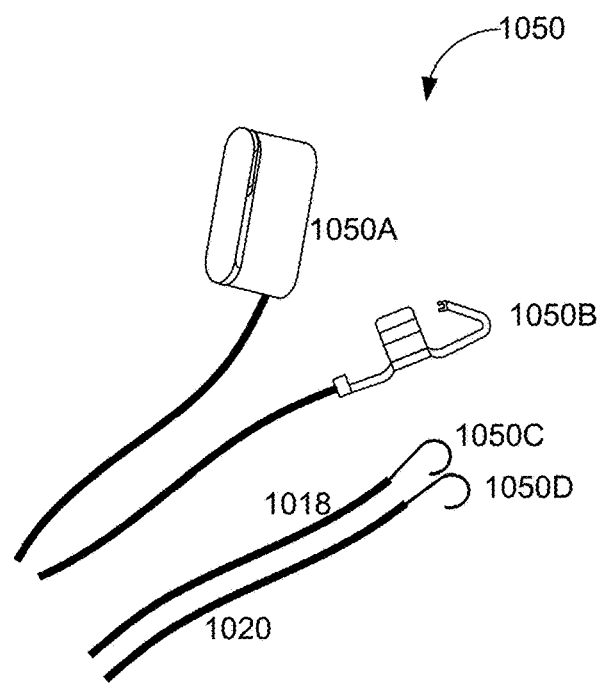
FIG. 10B is a set of electrical connectors applied to couple a bypass unit into the doorbell camera system in accordance with some implementations.
Figure 10C:
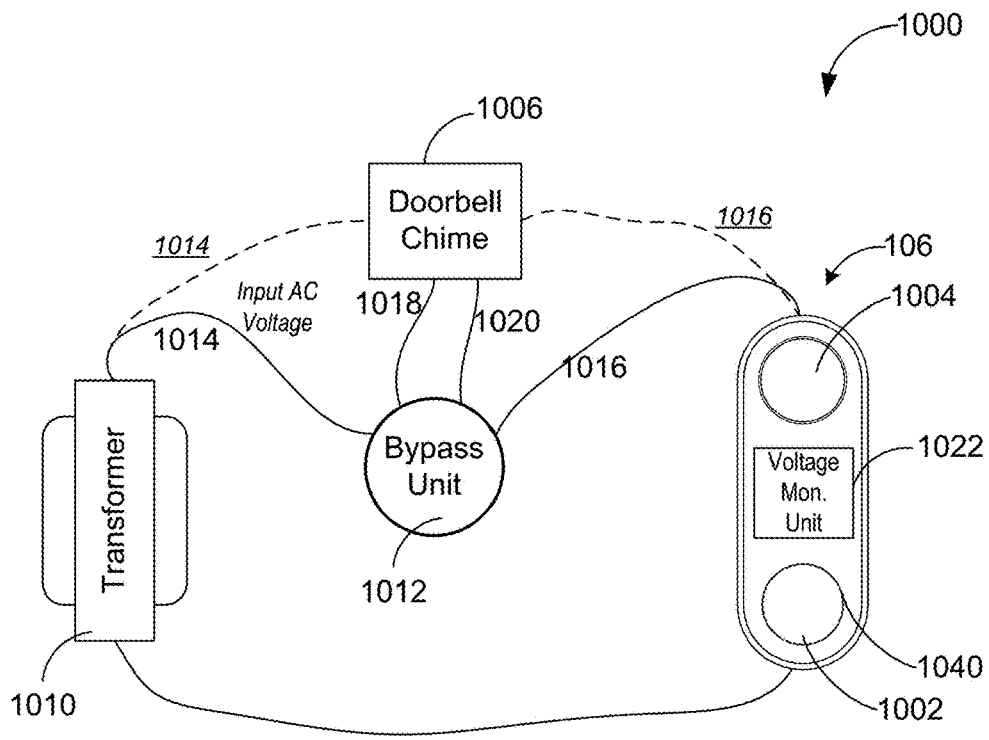
FIG. 10C is a block diagram of a doorbell camera system that has a voltage monitoring unit in a doorbell camera in accordance with some implementations.
Figure 10D:
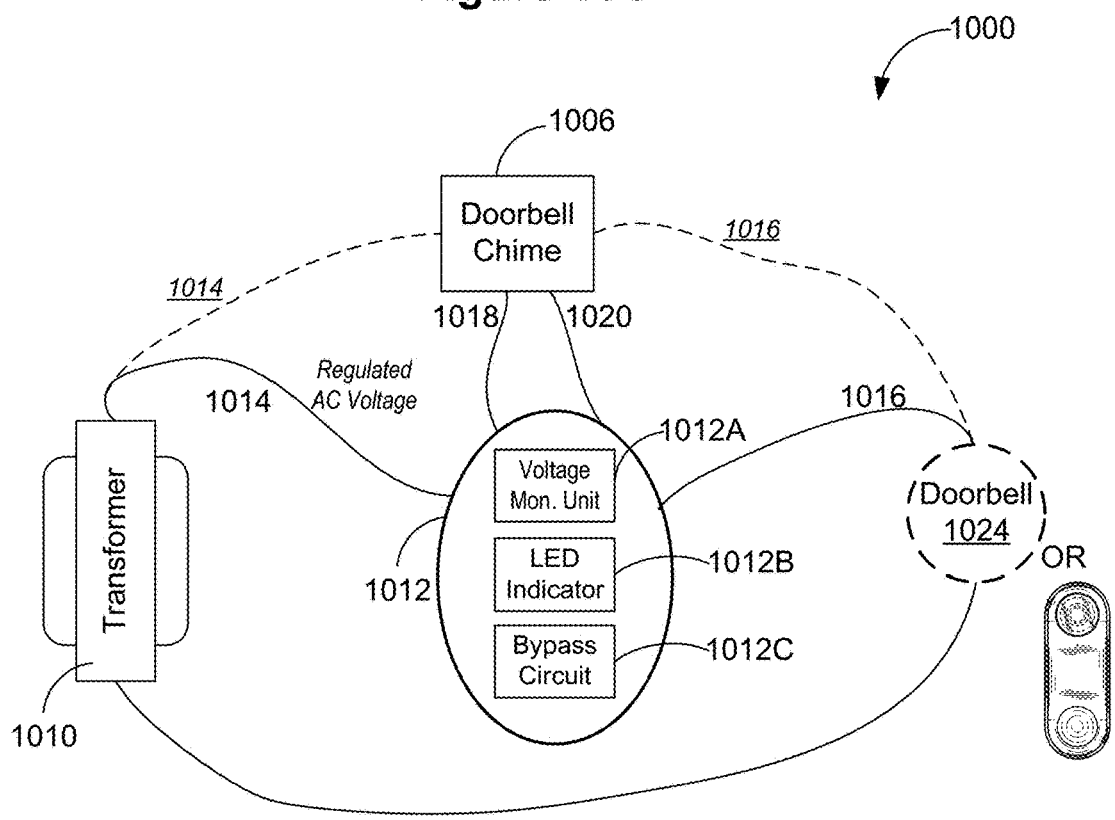
FIG. 10D is a block diagram of a doorbell camera system that has a voltage monitoring unit in a bypass unit in accordance with some implementations.

FIG. 10A is a block diagram of a doorbell camera system 1000 that operates at a first camera mode and a second doorbell camera in accordance with some implementations, and FIG. 10B is a set of electrical connectors 1050 applied to couple a bypass unit 1012 into the doorbell camera system 1000 in accordance with some implementations. FIG. 10C is a block diagram of a doorbell camera system that has a voltage monitoring unit in a doorbell camera in accordance with some implementations. FIG. 10D is a block diagram of a doorbell camera system that has a voltage monitoring unit in a bypass unit in accordance with some implementations. The doorbell camera system 1000 includes a doorbell camera 106 having a doorbell button 1002, a camera module 1004, an LED indicator, a speaker, a microphone, a processor and memory including programs executed by the processor. The camera module 1004 further includes a lens assembly 704 and an image sensor array that are configured to capture images at a premises, and a wireless transceiver that is configured to exchange data with a remote server over one or more wireless communication networks. The doorbell button 1002 is configured to trigger a remote chime 1006 in response to a user press on a button top 702. In some implementations, the LED indicator is configured to illuminate through a peripheral edge 1040 of the doorbell button 1002 that surrounds the button top 702.

The doorbell camera 106 is electrically coupled to the remote chime 1006 via a bypass unit 1012 powered by a transformer 1010 that provides an input AC voltage (e.g., by converting a mains power supply of 110V to the input AC voltage of 8V, 10V or 12V). The remote chime 1006 is configured to ring in response to a press on the doorbell button 1002. In some circumstances, a conventional doorbell is electrically coupled to the remote chime 1006 that is further coupled to the transformer 1010. When the doorbell camera 106 replaces the conventional doorbell, the remote chime 1006 is disconnected from the transformer 1010 and the doorbell, and replaced by the bypass unit 1010. Stated another way, wires 1014 and 1016 that are used to couple the doorbell chime 1006 for the conventional doorbell are reconnected to the bypass unit 1012. The bypass unit 1012 has two additional wires 1018 and 1020 that are further connected to the remote chime 1006. In some implementations, the bypass unit 1012 is disposed in proximity to the remote chime 1006, i.e., within the same chime box that contains the remote chime 1006. As such, the bypass unit 1012 is configured to receive the input AC voltage provided by the transformer 1010 via the wire 1014.

Referring to FIG. 10B, in some implementations, the bypass unit 1012 may come with the set of electrical connectors 1050 when it is delivered to a user with the doorbell camera 106. Each connector 1050 is physically configured to facilitate coupling to the doorbell chime 1006 and the wires 1014 and 1016, thereby simplifying installation of the doorbell camera 106 for a user. For example, a connector 1050A may include a splice connector to receive and hold an open wire end (e.g., that of the wire 1014) directly. A connector 1050B may include a metal wire terminal to couple to another complemental connector (e.g., that of the wire 1016). Connector 1050C and 1050D are respectively coupled to the wires 1018 and 1020, and open wire ends of the connectors 1050C and 1050D are bent into a hook shape such that they may be fastened onto connectors on the doorbell chime 1006 directly. These connectors are compatible with existing wires 1014 and 1016 and the connectors of doorbell chime 1006, and ease the installation of the doorbell camera 106 without requiring the user to use additional tools.

The doorbell camera system 1000 may be configured to generate a supply monitoring signal based on the input AC voltage to indicate whether the input AC voltage is greater than a supply threshold. Optionally, the supply monitoring signal is generated when the user of the doorbell camera 106 is pressing the button 1002. Optionally, the supply monitoring signal is generated by the bypass unit 1012 or the doorbell camera 106.

Referring to FIG. 10C, in some implementations, the doorbell camera 106 includes a voltage monitoring unit 1022 configured to generate the supply monitoring signal based on the input AC voltage. The LED indicator of the doorbell camera 106 is configured to, based on a value of the supply monitoring signal, display on a surface of the device housing 702 one of a set of predetermined visual patterns, thereby sending a visual message to a user of the doorbell camera 106 to indicate whether the input AC voltage is low with respect to the supply threshold. For example, the supply threshold may be 8V. When the input AC voltage is greater than 8V, the supply monitoring signal may control the LED indicator to display a green color along the peripheral edge 1040 of the doorbell button 1002, indicating that the input AC voltage is sufficient to drive the doorbell camera 106. In contrast, when the input AC voltage is not greater than 8V, the supply monitoring signal may control the LED indicator to display a red color along the peripheral edge 1040 of the doorbell button 1002, indicating that the input AC voltage is insufficient to drive the doorbell camera 106.

Alternatively, in some implementations, the doorbell camera 106 may generate an audio message based on the value of the supply monitoring signal, and broadcast the audio message from its speaker to indicate whether the input AC voltage is sufficient to drive the doorbell camera 106. Further, in some implementations, the remote chime 1006 may ring differently based on the supply monitoring signal, thereby indicating whether the input AC voltage is sufficient to drive the doorbell camera 106.

Referring to FIG. 10D, in some implementations, the bypass unit 1012 may also function as a voltage meter to determine whether the transformer 1010 can provide a supply voltage sufficient to drive the doorbell camera 106 (which normally consumes more power than a conventional doorbell). The bypass unit 1012 includes a voltage monitoring unit 1012A, an LED indicator 1012B, and bypass circuit 1012C. The supply monitoring signal is generated by the voltage monitoring unit 1012A of the bypass unit 1012, and the LED indicator 1012B is located in the bypass unit 1012. The LED indicator 1012B sends a visual message to the user to indicate whether the input AC voltage is low with respect to the supply threshold. Likewise, in some implementations, the remote chime 1006 may be configured to ring differently based on the supply monitoring signal, thereby indicating whether the input AC voltage is sufficient to drive the doorbell camera 106.

Arrangements shown in FIG. 10C may sometimes be utilized to simplify a process of setting up the doorbell camera 106. The bypass unit 1012 may be connected to the transformer 1010, the doorbell chime 1006 and a conventional doorbell 1024 (i.e., by connecting the wires 1014-1020). Then, the bypass unit 1012 generates the supply monitoring signal to indicate whether the input AC voltage is greater than the supply threshold, before the doorbell camera 106 needs to be connected to replace the conventional doorbell. Stated another way, if the supply monitoring signal indicates that the input AC voltage is not sufficient to drive the doorbell camera 106, a user does not need to take the efforts to replace the doorbell 1024 with the doorbell camera 106.

Under some circumstances, the input AC voltage is substantially low and insufficient to support some camera functions that require relatively large power consumption. Optionally, the camera module 1004 is configured to in accordance with a determination that the input AC voltage is not greater than the supply threshold, disable capturing images and exchanging data with a remote server, and enable communication with a client device via a short range communication link (e.g., a Bluetooth communication link). Optionally, the camera module 1004 is configured to in accordance with a determination that the input AC voltage is not greater than the supply threshold, activate a low power mode. In the low power mode, the images are optionally captured and/or transmitted to the server at a lower resolution and a lower frame rate, and local image processing may be disabled to conserver power.

Additionally, in some implementations, the camera module 1004 may send to the client device 220 via the short range communication link a notification message indicating that the input AC voltage provided by the transformer 1010 is not sufficient for powering the camera module 1004, when it is determined that the power supply voltage is not greater than the supply threshold. The notification message is optionally displayed at a user interface of a user mobile application 624 executed at the client device 220 in association with the doorbell camera 106.

In some implementations, the doorbell camera 106 alternates between a first camera mode and a second doorbell mode during its normal operation. The bypass unit 1012 is configured to operate in the first camera mode when it is determined that no user press has been applied to the button. Specifically, during the first camera mode, the bypass unit 1012 bypasses the remote chime 1006 (e.g., by the bypass circuit 1012C) while coupling the camera module 1004 of the doorbell camera 106 to the transformer 1010 to receive power therefrom. It is noted that when the remote chime 1006 is bypassed, the remote chime 1006 is electrically coupled to the bypass unit 1012 and the transformer 1010 while still letting pass a substantially low current that is less than a threshold chime current and does not activate the remote chime 1006 to ring. In addition, the bypass unit 1012 is configured to operate in the second doorbell mode in accordance with a determination that a user press has been applied to the button. In the second doorbell mode, the bypass unit 1012 enables the remote chime 1006 to ring while coupling the doorbell camera 106 to the transformer 1010 (e.g., by the bypass circuit 1012C). Thus, in the absence of any user press on the button 1002, the bypass unit 1012 provides the input AC voltage to the camera module 1004 and bypasses (i.e., mutes) the remote chime 1006; conversely, at the time of a user press on the button 1002, the bypass unit 1012 provides the input AC voltage to drive both the remote chime 1006 and the camera module 1004.

In some implementations, the camera module 1002 is continuously powered by the input AC voltage generated by the transformer 1010 during both the first camera mode and the second doorbell mode, independently of whether a user pressed the doorbell button 1002. By these means, the camera module 1002 captures images while awaiting a user press, and does not cease capturing images while the remote chime 1006 rings in response to the user press while the remote chime 1006 rings in response to the user press.

In some implementations, the doorbell camera 106 may include a rechargeable battery. In the second doorbell mode, the camera module 1004 of the doorbell camera 106 is electrically decoupled from the transformer 1010, and relies on the rechargeable battery (e.g., a battery 1116 in FIGS. 11A-11E) to power the camera module 1004 when the button 706 is being pressed (i.e., at a second doorbell mode). The battery is recharged when the button 706 (or the button 1002) is not pressed at the first camera mode. The battery is sized big enough so that it can charge back up in between button presses. Stated another way, the battery may be recharged between the button presses to reach a power level that is sufficient to sustain operation of the camera module 1004 during a subsequent press on the button 1002. In some implementations, the battery is configured to sustain a predetermined number (e.g., 100) of continuous presses on the button of the doorbell camera 106 without losing battery power.

In some implementations, in response to a user press on the button 1002, the speaker of the doorbell camera 106 may play a pre-programmed ring chime, before the remote chime 1006 rings or concurrently while the remote chime 1006 is ringing. In some implementations, how the speaker of the doorbell camera 106 and the remote chime 1006 function may be determined according to a home structure state (e.g., at home, away, sleeping). For example, if the home structure state is set or detected as "sleeping," the speaker of the doorbell camera 106 plays the pre-programmed ring chime or an audio message associated with the home structure state, while the remote chime 1006 remains silent. Moreover, a message may be sent to the client device 220 that executes the user mobile application 624 in association with the doorbell camera 106, indicating that the user has pressed the button 1002 of the doorbell camera 106 at a certain time. In some implementations, the doorbell camera 106 may prompt a visitor to record an audio message, and send the audio message and a timestamp associated with the press on the doorbell button 1002 to the server system 164 and further to the user mobile application 624 of the client device 220.

Figure 10E:
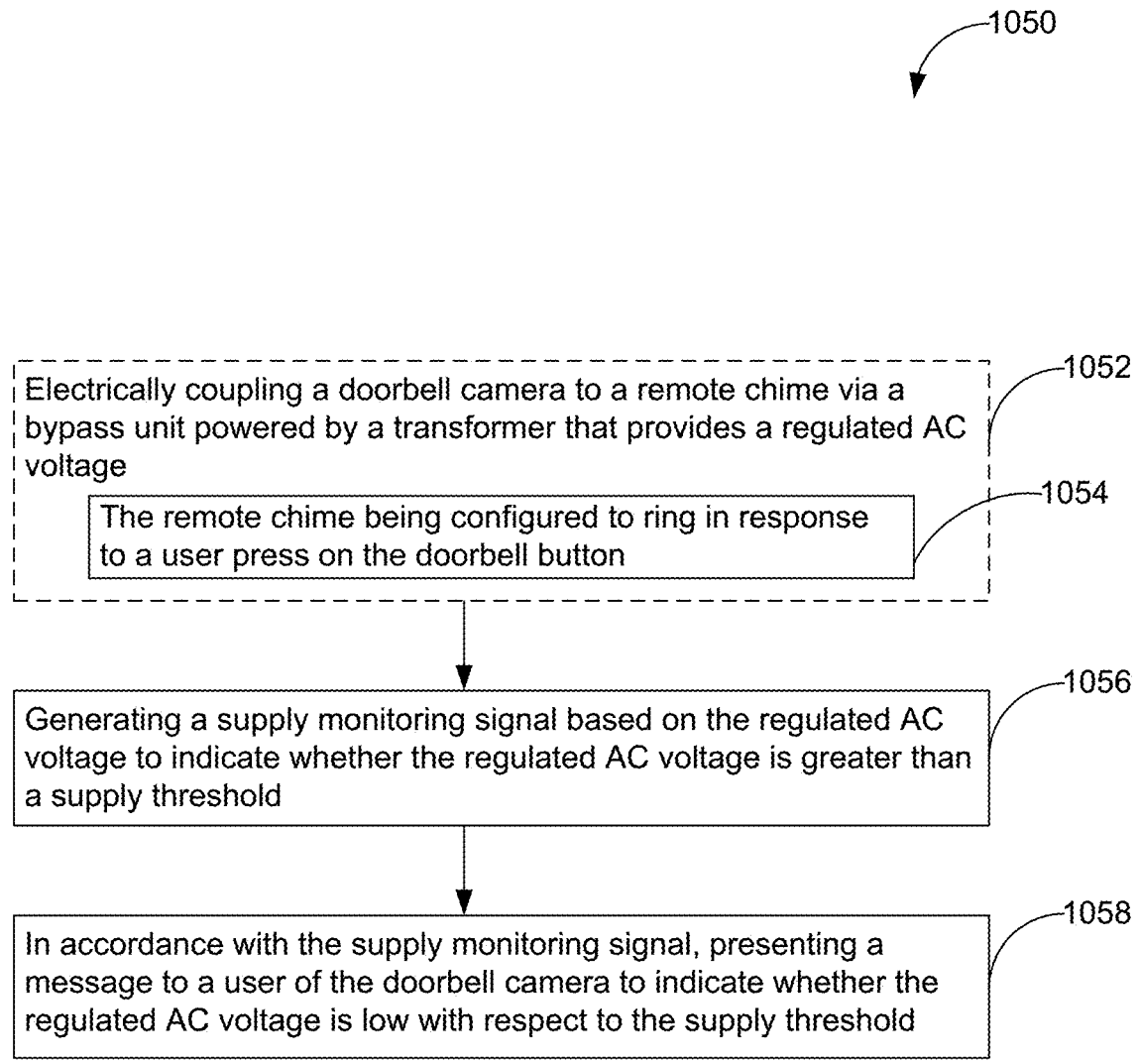
FIG. 10E is a flow chart of a method for controlling a doorbell camera in accordance with some implementations.

FIG. 10E is a flow chart of a method 1050 for controlling a doorbell camera in accordance with some implementations. In some implementations, the method 1050 is implemented at the doorbell camera 106 having a doorbell housing 702 and a doorbell button 1002 mounted on a front cover plate 708 of the doorbell housing 702. The doorbell housing 702 contains a camera module, an LED indicator, a processor and memory including programs executed by the processor. The doorbell camera 106 is electrically coupled to (1052) a remote chime 1006 via a bypass unit 1012 powered by a transformer 1010 that provides an input AC voltage. The remote chime 1006 is configured to ring (1054) in response to a user press on the doorbell button 1002. A supply monitoring signal is generated (1056) by the doorbell camera 106 based on the input AC voltage to indicate whether the input AC voltage is greater than a supply threshold. Based on a value of the supply monitoring signal, a user is notified by the doorbell camera 106 as to whether there is sufficient voltage to power the doorbell. In accordance with the supply monitoring signal, a message is presented by the doorbell camera 106 to a user of the doorbell camera 106 to indicate whether the input AC voltage is low with respect to the supply threshold. In some implementations, the message may include a visual message displayed by the LED indicator (e.g., a single LED light, a LED display ring formed around the doorbell button 1002) on a surface of the doorbell housing 708 according to one of a set of predetermined visual patterns input AC voltage. In some implementations, the message may include an audio message broadcast by the speaker of the doorbell camera 106. In some implementations, the camera module 1004 may send to the client device 220 via a short range communication link a notification message indicating that the input AC voltage provided by the transformer 1010 is not sufficient for powering the camera module 1004. More details on the method 1500 implemented by the doorbell camera 106 are explained above with reference to FIG. 10C.

Alternatively, in some implementations, at least part of the method 1050 may be implemented at the bypass unit 1012. Independently of whether the doorbell camera 106 is electrically coupled to the remote chime 1006 in place of a conventional doorbell, a supply monitoring voltage may be generated (1056) in the bypass unit 1012 based on the input AC voltage to indicate whether the input AC voltage is greater than a supply threshold. In accordance with the supply monitoring signal, a message may be presented (1058) by the bypass unit 1012 to a user of the doorbell camera 106 to indicate whether the input AC voltage is low with respect to the supply threshold. Optionally, the message may include a visual message displayed on the bypass unit 1012 by an LED indicator 1012B according to one of a set of predetermined visual patterns. In some implementations, the message presented to the user may include a ring of the remote chime 1006. By these means, voltage compatibility of the doorbell camera 106 may be determined and known to the user of the doorbell camera 106 before the doorbell camera 106 is installed, thereby avoiding installation of the doorbell camera 106 when it is not even compatible with the supply voltage provided by the transformer 1010. More details on the method 1500 implemented by the bypass unit 1012 are explained above with reference to FIG. 10D.

Electronic and Optical Components of a Doorbell Camera

Figure 11A:
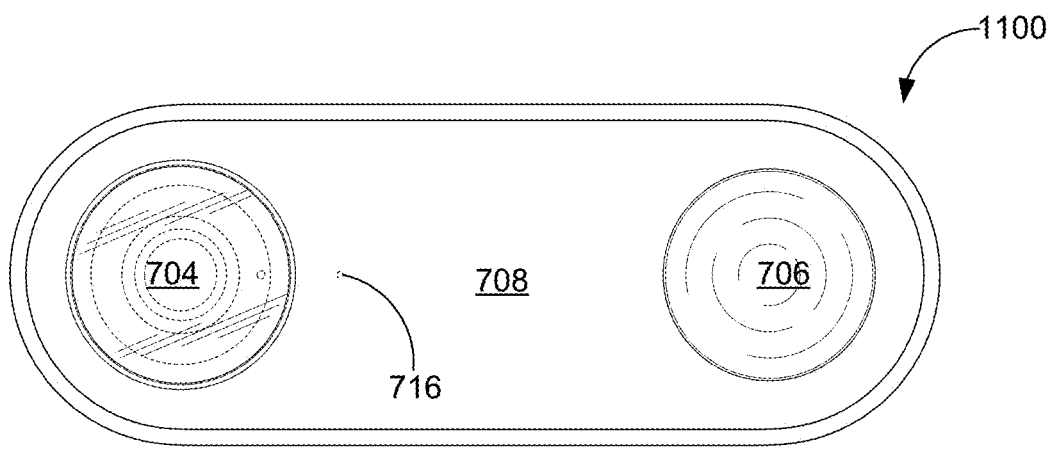
FIGS. 11A and 11B include a top view and a cross sectional view of a doorbell camera 106 in accordance with some implementations, respectively.
Figure 11B:
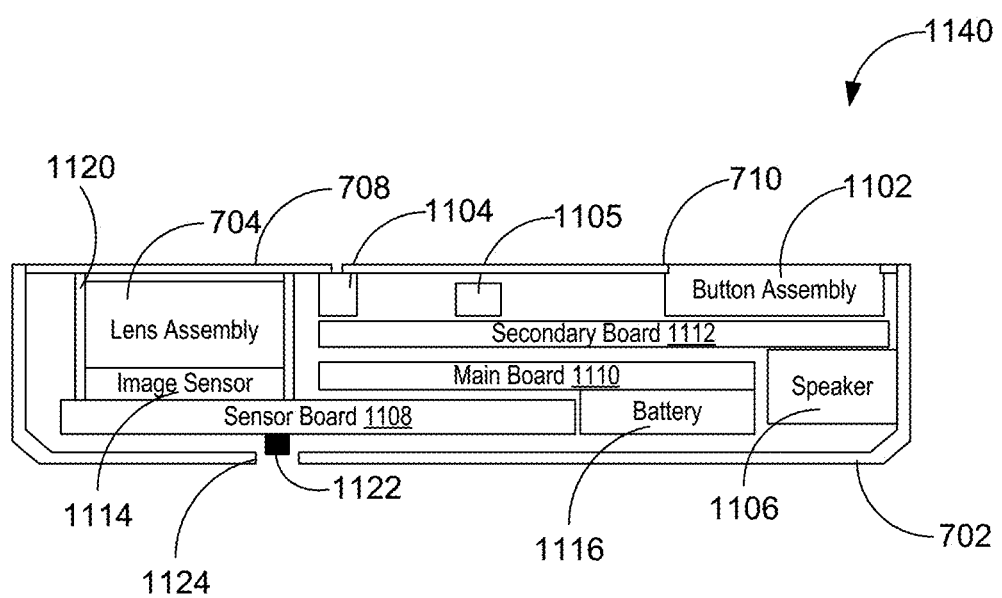
Figure 11C:
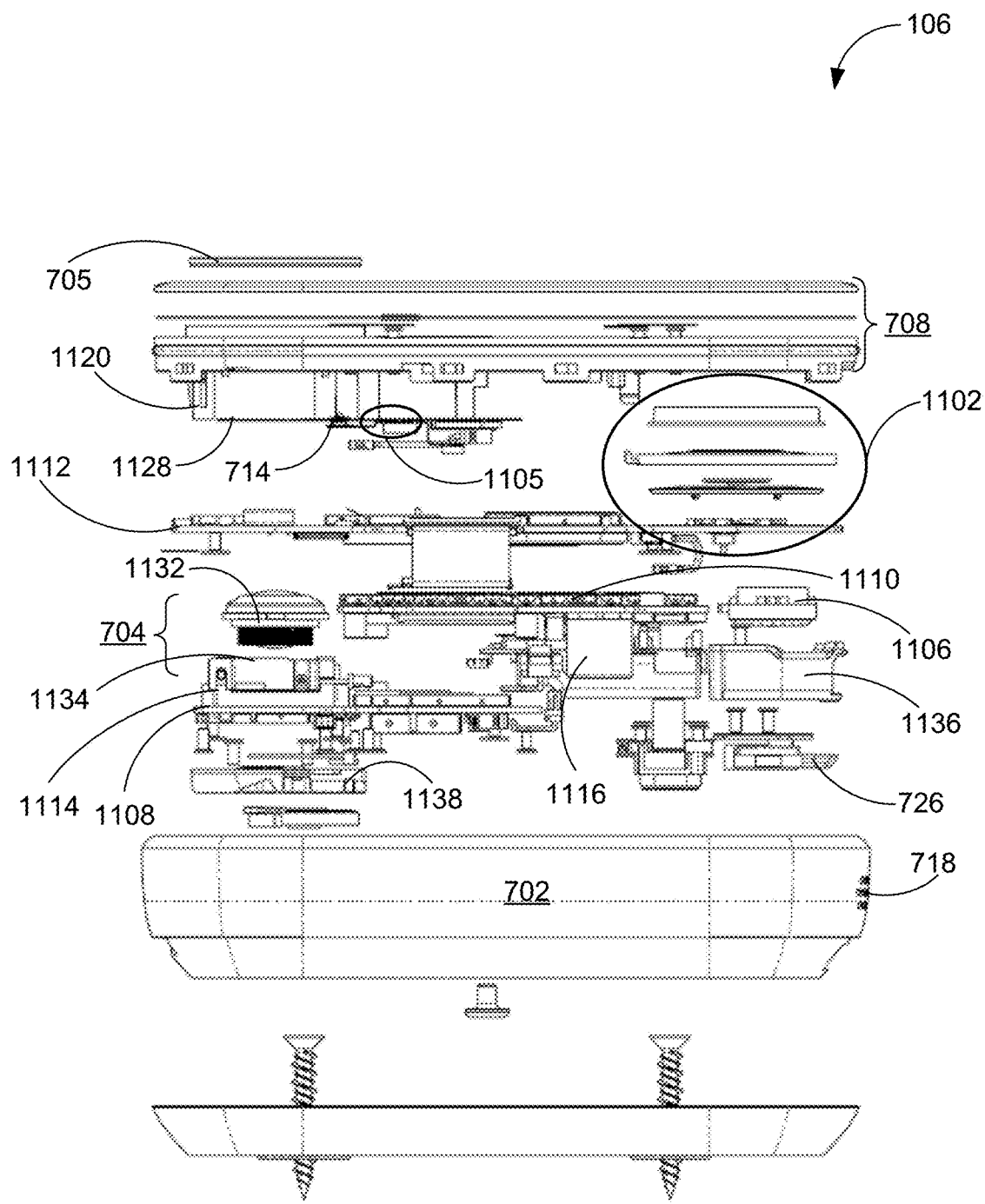
FIGS. 11C-11E are three exploded views of a doorbell camera in accordance with some implementations.
Figure 11D:
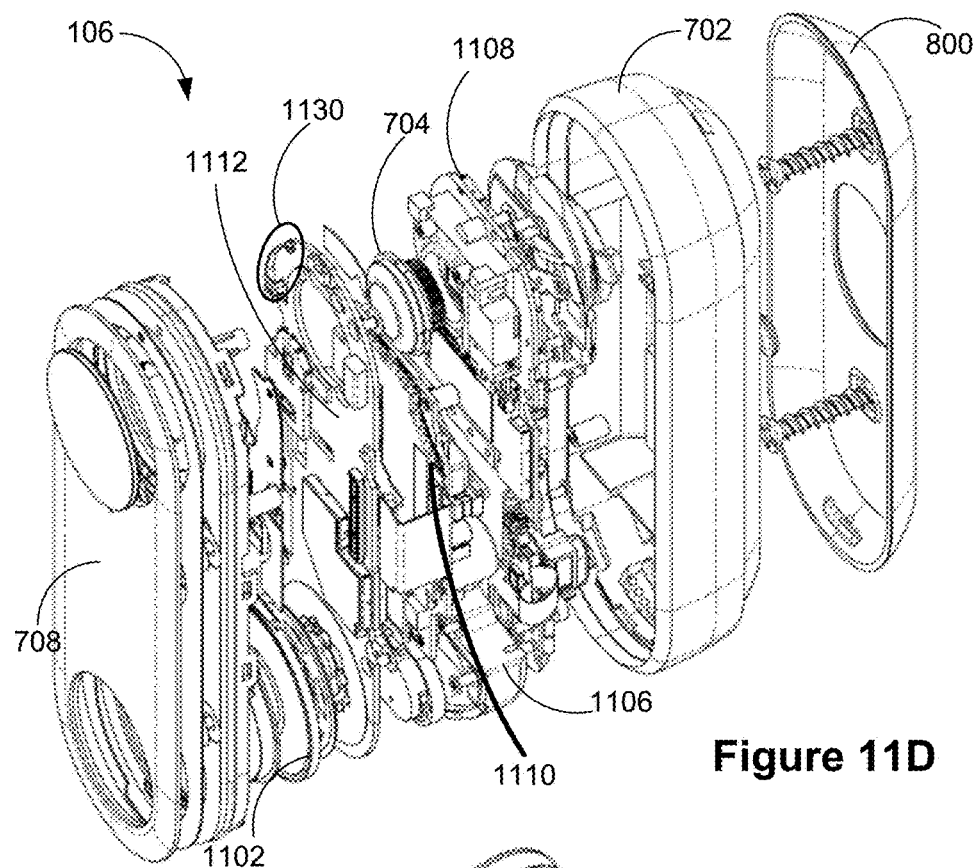
Figure 11E:
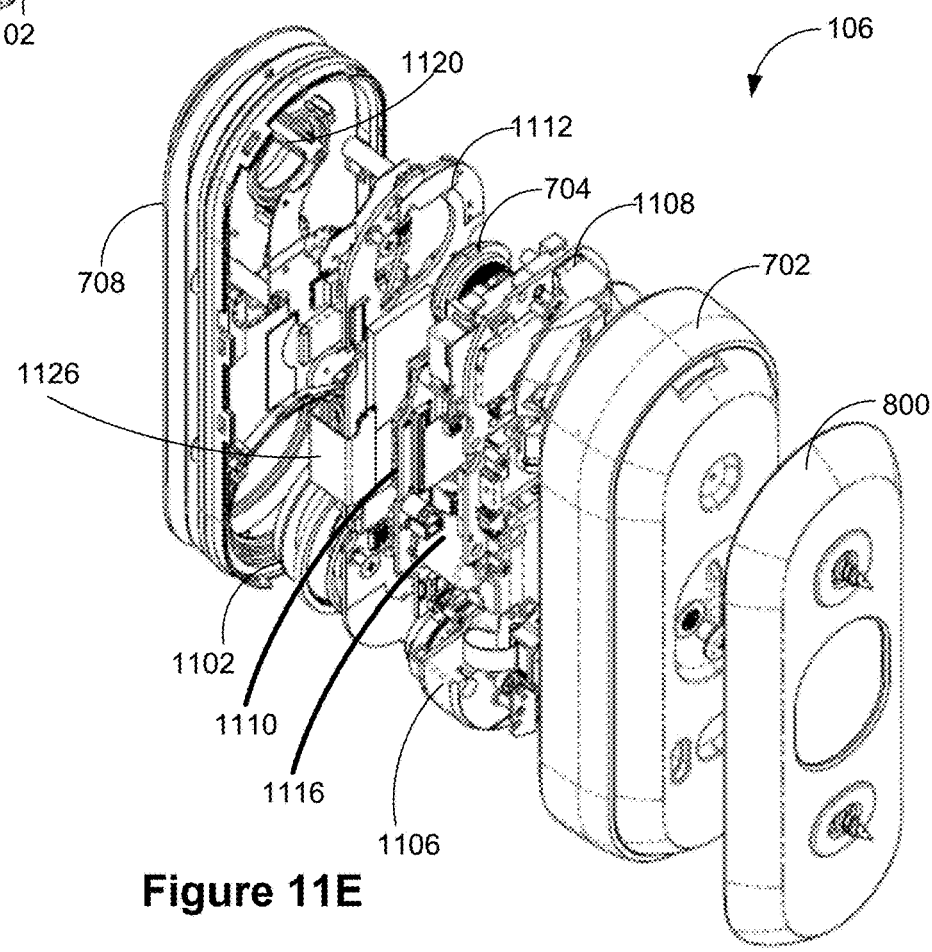

FIGS. 11A and 11B include a top view 1100 and a cross sectional view 1140 of a doorbell camera 106 in accordance with some implementations, respectively, and FIGS. 11C-11E are three exploded views of a doorbell camera 106 in accordance with some implementations. FIGS. 11F and 11G are a front side and a rear side of a secondary board 1112 in accordance with some implementations. FIGS. 11H and 11I are a front side and a rear side of a main board 1110 in accordance with some implementations. FIGS. 11J and 11K are a front side and a rear side of a sensor board 1108 in accordance with some implementations. The doorbell camera 106 includes a device housing 702 that encloses a plurality of electronic and optical components. The device housing 702 further includes a front cover plate 708 having an button opening 710. A waterproof button assembly 1102 is formed in the button opening 710 on the front cover plate 708 of the device housing 702, and a button top 706 of the button assembly 1102 is exposed from the button opening 710.

The front cover plate 708 of the device housing 702 may be made of a single piece of material (e.g., glass and plastic) having the button opening 710, or a stack of material pieces (e.g., each made of glass or plastic) that are aligned and have the button opening 710. In some implementations, the front cover plate 708 includes a camera opening 712 configured to expose the lens assembly 704. A top edge of the lens assembly 704 (e.g., a periphery of a cover glass 705 of the lens assembly 704) forms a water tight seal with an edge of the camera opening 712. Alternatively, in some implementations, the front cover plate 708 may not have the camera opening, but includes at least a substantially transparent area 712. The lens assembly 704 is disposed under the substantially transparent area 712 to receive light (e.g., visible and infrared light) passing through the transparent area 712.

Further, in some implementations, the front cover plate 708 includes a microphone aperture 716, and a microphone 1104 is disposed under the front cover plate 708 and coupled to the microphone aperture 716 to receive sound wave entering the microphone aperture 716. In some implementations, the doorbell camera 106 further includes an ALS assembly 714 disposed under the cover glass 705 of the lens assembly 704. The ALS assembly 714 optionally includes a light pipe to direct light entering the lens assembly 704 to an ALS and ALS interface circuit that are optionally located with a distance from the lens assembly 704.

In some implementations, the front cover plate 708 is substantially opaque except the button opening 710, the microphone aperture 716, and the camera opening (or transparent area) 712. In some implementations, the front cover plate 708 includes a substantially opaque area that is distinct from the button opening 710, the microphone aperture 716 and the camera opening (or transparent area) 712. The microphone 1104 is optionally concealed under the substantially opaque area. Further, in some implementations, an array of IR illuminators 1105 are disposed under the substantially opaque area of the front cover plate 708 and configured to illuminate a field of view of the lens assembly 704 with infrared light in a night mode. In an example, the array of IR illuminators 1105 include a number of (e.g., twelve) LEDs arranged in a row. The row of IR illuminators 1105 provide adequate illumination without producing a bright red/visible glow that would result from fewer and more powerful IR illuminators. In some implementations, the lens assembly 704 is supported by a lens holder 1120 within the device housing 702, and the lens holder 1120 has a top edge raised towards the front cover plate 708 for blocking the infrared light generated by the array of IR illuminators 1105 from entering the lens assembly 704 directly.

In some implementations, the IR illuminators 1105 include IR LEDs having a wavelength of 940 nanometers. In some implementations, the IR illuminators 1105 include IR LEDs having a wavelength of 850 nanometers. In some implementations, the image sensor for the doorbell camera 106 is less sensitive to 940 nm light than it is to 850 nm light. Therefore, IR LEDs having a 940 nm wavelength cause less interference with the image sensor than IR LEDs having an 850 nm wavelength. Further, in some implementations, a heat spreader 1128 is coupled to the IR illuminators 1105 to dissipate heat generated therefrom.

The doorbell camera 106 may further include a speaker 1106 contained within a speaker box 1136 that is further disposed in proximity to speaker holes 718. When the speaker holes 718 are located on a bottom rim surface of the device housing 702, the speaker 1106 is placed behind the button assembly 1102 and faces the speaker holes 718. Given that the doorbell camera 106 includes both the microphone 1104 and the speaker 1106, a remote user may review live video streams captured by the camera module of the doorbell camera 106, and have a conversation in real-time with the visitor. It is also desirable that the doorbell camera 106 can provide dynamic audio feedback to a user via the microphone 1104 and the speaker 1106. The feedback may concern an operational status of the doorbell camera 106 itself, a status of the outdoor environment surrounding the doorbell camera 106, the operational status of another electronic device associated with the doorbell camera 106, and/or the operational status of a set of electronic devices 106 associated with the doorbell camera. For ease of references, the speaker 1106 and the speaker box 1136 are collectively called the speaker 1106 in this application.

In some implementations, the lens assembly 704 includes a cover glass 705, a camera lens structure 1132 and an infrared filter 1134. The IR filter 1134 is activated in the daytime mode for precise color reproduction, and disabled in the night mode for greater light sensitivity when the field of view of the doorbell camera 106 is illuminated by the IR illuminators 1105. Optionally, the ALS assembly 714 is also used to cause switching between the daytime and night modes, and enable/disable the IR illuminators 1105 and the infrared filter 1134. In some implementations, the lens holder 1120 is supported by the infrared filter 1134 to protect lenses in the lens assembly 704 from being pushed when a user touches or presses the front cover plate 708.

The doorbell camera 106 may include at least a sensor board 1108, a main board 1110 and a secondary board 1112 that are stacked within the device housing 702. In some implementations, the sensor board 1108 includes a connector 1108A that is coupled to another connector of the main board 1110 directly. Alternatively, a flexible cable is optionally connected to the connector 1108A for electrically coupling the main board 1110 to the sensor board 1108. In some implementations, two ends of a flexible printed circuit (FPC) 1126 are electrically coupled to a respective connector at the main board 1110 and the secondary board to couple them to each other.

The sensor board 1108 optionally sits on a rear interior surface of the device housing 702. An image sensor array 1114 may be disposed on top of an end of the sensor board 1108, and the lens assembly 704 may be further disposed on top of the image sensor array 1114, such that light passing through the lens assembly 704 arrives at the image sensor array 1114 to form an image captured by the image sensor array 1114. In some implementations, the sensor board 1108 includes an image processor. The image processor of the sensor board 1108 is optionally located directly below the image sensor array 1114 to facilitate further processing of the image captured by the image sensor array 1114. In some implementations, the sensor board 1108 also includes a connector for communicatively coupling the sensor board 1108 to the image sensor array 1114. In some implementations, the image sensor array 1114 and/or the image processor of the sensor board 1108 is thermally coupled to a heat spreader 1138 that is disposed under the image sensor array 1114 and configured for dissipating heat generated while images are being captured and processed.

The sensor board 1108 may include one or more of a power supply connector 11082, an AC-DC converter 11084, a voltage regulator 11086 and a power unit 11088. The power supply connector 11082 is electrically coupled to the plurality of wire terminals 720, and configured to receive an external power supply. The AC-DC converter 11084 is coupled to the power supply connector 11082 and configured to generate one or more DC supply voltages to drive various electronic components of the doorbell camera 106. The voltage regulator 11086 is configured to regulate the one or more DC supply voltages to one or more internal supply voltages as needed. The power unit 11088 is coupled to the image sensor array 1114 and/or the image processor to provide power therefor. In some implementations, the sensor board 1108 further includes one or more storage capacitors that are configured to enable voltage conversion and regulation by the AC-DC converter 11084 and the voltage regulator 11086.

In some implementations, the main board 1110 includes at least a central processing unit (CPU), a memory system (e.g., including memory and a memory controller). In an example, the main board 1110 includes a system on chip (SoC), a memory (e.g., double data rate synchronous dynamic random-access memory (DDR SDRAM)), a memory controller, and an electromagnetic interference (EMI) fence. In some implementations, the EMI fence, in conjunction with EMI shielding, is adapted to substantially prevent electromagnetic interference with the SoC, the memory and/or the memory controller from outside sources.

Further, in some implementations, a rechargeable battery 1116 is mounted on the main board 1110 (optionally via a connector 11102). The main board 1110 may be flipped and bonded to the sensor board 1108. When the main board 1110 is offset from the sensor board 1108, the rechargeable battery 1116 may be positioned beside the sensor board 1108 and takes advantage of compact space within the device housing 702. In some implementations, the sensor board 1108 regulates supply voltages provided via the plurality of wire terminals 720, while the main board 1110 manages operation of the rechargeable battery 1116 and provides power to the sensor and secondary boards when the external power supply is not available. The main board 1110 may include charger circuit that is configured to manage operation of the rechargeable battery 1116. In some implementations, the rechargeable battery 1116 is disabled from being charged in accordance with a determination that a temperature of the rechargeable battery is greater than a first threshold temperature (e.g., 45° C.). In some implementations, a heater is disposed in proximity to the rechargeable battery 1116, and the heater is enabled to heat the rechargeable battery 1116 in accordance with a determination that the temperature of the rechargeable battery is less than a second threshold temperature (e.g., 0° C.). The heater is disabled from heating the rechargeable battery in accordance with a determination that the temperature of the rechargeable battery is equal to or greater than the second threshold temperature.

In some implementations, the main board 1110 includes power management integrated circuit (PMIC) that is configured to manage power provided by the sensor board 1108 and/or the rechargeable battery 1116. The main board 1110 may also include one or more storage capacitors (e.g., a capacitor 11104) that are configured to enable operation of the PMIC or the charger circuit.

The main board 1110 is electrically coupled to both the sensor board 1108 and the secondary board 1112. In some implementations, the main board 1110 is coupled to the secondary board 1112 or the sensor board 1108 via a flex cable (e.g., cable 1126), allowing data exchange with the respective board. In some implementations, the main board 1110 also includes a connector for communicatively coupling the main board 1110 to the speaker 1106, and connectors for communicatively coupling the main board 1110 to antennas (e.g., communicatively coupling radios to antennas).

In some implementations, the doorbell camera 106 is configured to switch between an offline mode and an online mode to preserve power of the rechargeable battery 1116. For example, the doorbell camera 106 determines that it is disconnected from an external power and operates at the power of the rechargeable battery 1116. In response to the determination, the doorbell camera 106 disables itself from the online mode that involves communication with the remote server and the client device, and enables the offline mode that operates locally to conserve the power of the rechargeable battery 1116. Additionally, in accordance with a determination that it is disconnected from an external power and operates at the power of the rechargeable battery 1116, the doorbell camera 106 sends a notification to the client device via the remote device, before or while switching from the online mode to the offline mode. In some situations, a visitor presses the button 706 of the doorbell camera 106 when it is offline. The doorbell camera 106 records a timestamp corresponding to a time when the user press occurs, and uploads the timestamp to the remote server and notify the client device that someone has pressed the door when the doorbell camera 106 operates in the online mode again. Conversely, when the doorbell camera 106 determines that it is connected to an external power, it charges the rechargeable battery 1116 and enables the online mode that involves communication with the remote server and the client device.

The secondary board 1112 may include at least one or more wireless transceiver circuit 11122, IR illuminator drivers 11124, LED indicator driver, and an audio signal processor 11126. The secondary board 1112 may be disposed on top of the main board 1110, and surrounded by the microphone 1104, the IR illuminators 1105, the button assembly 1102, and the speaker 1106. Due to such arrangements of their locations, the second board 1112 can conveniently receive signals from or send signals to these components 1102-1108 surrounding the secondary board 1112.

In some implementations, the doorbell camera 106 includes a plurality of radios each of which configured for one of broadband (e.g., Wi-Fi, cellular, etc.) communications, point-to-point (e.g., Bluetooth) communications, and mesh networking (e.g., Thread, Zigbee, ZWave, IEEE 802.15.4, etc.) communications. The plurality of radios are coupled to antennas. For example, an IEEE 802.15.4 antenna 1130 is disposed at a curved edge of the secondary board 1112 and in proximity to the lens assembly 704, and a WiFi antenna (not shown in FIGS. 11A-11E) is disposed at a flat edge of the secondary board 1112. In some implementations, EMI fencing is applied around the radios to minimize electromagnetic interference (e.g., from outside sources or between various components such as between any two of the radios). In some implementations, the EMI fencing is configured to substantially isolate the corresponding electrical components from sources outside of the EMI fencing. In some implementations, the EMI shielding is adapted to transfer heat from the sensor board 1108 or the secondary board 1112 to device housing. In some implementations, the EMI fencing is composed of aluminum and/or an aluminum alloy. In some implementations, the EMI shielding is configured to affix (e.g., snap) to the corresponding EMI fencing.

In some implementations, the secondary board 1112 also includes a connector for electrically coupling the secondary board 1112 to a light ring surrounding a periphery of the lens assembly 704 or the front cover plate 708, a connector 1112A for electrically coupling the secondary board 1112 to the speaker 1106, a connector 1112B for electrically coupling the secondary board 1112 to the microphone 1104, a connector 1112C for electrically coupling the secondary board 1112 to the IR illuminators 1105, and/or connectors for electrically coupling the secondary board 1112 to antennas (e.g., communicatively coupling the radios disposed on the secondary board 1112 to the antennas). In some implementations, at least one of these connectors for electrically coupling the secondary board 1112 to the light ring, the microphone 1104, the speaker 1106, the IR illuminators 1105 and the antennas includes one of a flex connector and a spring connector (e.g., a spring finger connector). In some implementations, the secondary board 1112 further includes a connector 1112D configured to connect to a test module applied to test the doorbell camera 106 during the course of manufacturing the doorbell camera 106. In some implementations, the secondary board 1112 further includes a connector 1112E configured to couple to the plurality of wire terminals 720 to receive the external power supply.

Further, in some implementations, the sensor board 1108 includes a reset button 1122 configured to reset electrical functions of the doorbell camera 106. The reset button 1122 is mounted on a rear surface of the sensor board 1108, and electrically coupled to reset circuit located on the sensor board 1108. The reset circuit is configured to initiate resetting the electrical functions of the doorbell camera 106 in response to a user press on the reset button 1122. Optionally, the user press on the reset button 1122 lasts for at least a predetermined duration of time before the reset circuit initiates resetting of the doorbell camera 106. The device housing 702 includes a reset opening 1124 that is aligned with and provides an access to the reset button 1122. Optionally, the reset opening 1124 is located in one of the second recess 724B or the third recess 724C. In some implementations, the reset button 1122 is separated from the reset opening 1124 by a rigid reset button top and a flexible gasket. The rigid reset button top receives the user press and transfer it to the reset button 1122 via the flexible gasket. The flexible gasket forms a water tight seal with an area surrounding the reset opening 1124 on the device housing 702 while transferring the user press on the rigid reset button top to the reset button 1122. More details on a waterproof reset button assembly are discussed below with reference to FIG. 12B.

In some implementations, the device housing 702 may enclose a support structure (not shown herein). The support structure is coupled between an interior rear surface of the front cover plate 708 and an interior bottom surface of the device housing 702 (directly or indirectly via one or more board 1108-1112), and configured to maintain a separation therebetween, such that electronic and optical components disposed in the device housing 702 are protected from mechanical pressure when movement of the rigid button top 706 exceeds a predetermined displacement or when the front cover plate 708 is pressed. Optionally, the support structure includes a lens holder 1120 configured to support the lens assembly 704 within the device housing 702. Optionally, the support structure includes a protrusion attached to the interior rear surface of the front cover plate, the interior bottom surface of the device housing or any of the boards 1108-1112. Stated another way, the support structure is mounted between any two of the interior rear surface of the front cover plate, the interior bottom surface of the device housing and the boards 1108-1112. The components protected by such a support structure include one or more of the lens assembly 704, the image sensor 1114, the plurality of printed circuit boards (PCBs) (e.g., the sensor board 1108, the main board 1110 and the secondary board 1112) that are arranged in parallel between the interior surface of the front cover plate and the interior bottom surface of the electronic device.

In some implementations, the image sensor 1114 is configured to capture IR light (e.g., IR light having a wavelength of 940 nm or 850 nm). In some implementations, the IR light is converted (e.g., at the camera 106) to white light for display to a user. In some implementations, the IR illuminators 1105 consist of a row of twelve IR LEDs. In some implementations, the wavelength of the IR illuminators 1105 is adjusted to be further from the visible spectrum. For example, the wavelength of the IR illuminators is adjusted to 940 nm rather than 850 nm. Adjusting the IR illuminators to be further from the visible spectrum of light means that the IR illumination from the illuminators is less visible (or invisible) to the human eye. In some implementations, the image sensor is tuned to 850 nm IR light, rather than 940 nm IR light. In some implementations, the IR illuminators 1105 are configured to emit 940 nm light and operate with increased power (e.g., double the power) to provide similar illumination to the image sensor (e.g., an image sensor tuned for 850 nm IR light) as would be provided by IR illuminators configured to emit at 850 nm. Therefore it is important that the IR illuminators are used as efficiently as possible. For example, the IR illuminators are configured to only illuminate the portion of the scene that is captured by the image sensor.

In some implementations, the image sensor 1114 has a rectangular field of view corresponding to +/−32 degrees vertical and +/−56 horizontal. In some implementations, the IR illuminators 1105 are configured to emit light in a hemispherical pattern. Therefore, there is a need to direct and shape the light from the IR illuminators to illuminate the image sensor's field of view, while minimizing illumination outside of the field of view and overlap between IR illuminators causing hot spots in the sensed image.

The doorbell camera 106 also includes a plurality of antennas (e.g., antennas 1130 and 1142) for wirelessly communicating with other electronic devices. In some implementations, the antennas are configured to operate concurrently using two distinct frequencies. In some implementations, the antennas are configured to operate concurrently using two distinct communication protocols. In some implementations, one or more of the antennas is configured for broadband communications (e.g., Wi-Fi) and/or point-to-point communications (e.g., Bluetooth). In some implementations, one or more of the antennas is configured for mesh networking communications (e.g., ZWave). In some implementations, a first antenna (e.g., antenna-1) is configured for 2.4 GHz Wi-Fi communication and a second antenna (e.g., antenna-2) is configured for 5 GHz Wi-Fi communication. In some implementations, a first antenna (e.g., antenna-1) is configured for 2.4 GHz Wi-Fi communication and point-to-point communication, a second antenna (e.g., antenna-2) is configured for 5 GHz Wi-Fi communication and point-to-point communication, and a third antenna (e.g., antenna-3) is configured for mesh networking communication. In some implementations, two or more of the antennas are configured to transmit and/or receive data concurrently with others of the antennas. In a specific example, an IEEE 802.15.4 antenna 1130 is disposed at a curved edge of the secondary board 1112 and in proximity to the lens assembly 704, and a WiFi antenna 1142 is disposed at a flat edge of the secondary board 1112. The secondary board 1112 further includes wireless transceiver circuit 11122 to drive antennas 1130 and 1142.

MIMO (multi input multi output) antenna technology provides the benefit of greater throughput and better range for the wireless communication. One of the parameters in an MIMO antenna system (e.g., the doorbell camera 106 including the plurality of antennas) is isolation between two antennas. Better isolation can ensure the data transmitted through two antennas are uncorrelated. One way to achieve good isolation is to have large antenna separations. Isolation is directly related to how much energy is coupled from one antenna to another. The Friis transmission equation defines the power received by another antenna as inversely proportional to $R^2$, where R is the distance between two antennas. So increasing antenna spacing is one effective way to achieve good isolation. However, in modern consumer electronics the space left for antennas is very tight so having enough spacing between antennas is infeasible. While isolation is important, antenna efficiency cannot be sacrificed. Thus, in some implementations, although the doorbell camera 106 has a compact form factor, its antennas (e.g., the IEEE 802.15.4 antenna 1130 and the WiFi antenna) are disposed as far from each other as possible in the device housing 702 to create desirable antenna efficiency.

In some implementations, a decoupling network may be used to isolate the antennas of the doorbell camera 106. For example, an artificial coupling channel is generated in additional to its original coupling channel (e.g., which is through air). By properly managing the two coupling channels, good isolation can be achieved among the antennas of the doorbell camera 106.

In some implementations, the antennas of the doorbell camera 106 include at least one dual-band Inverted-F Antenna (IFA). In some implementations, the antennas are made by flexible printed circuit (FPC), laser direct structuring (LDS), Stamping, or other state of art antenna manufacturing technology. In some implementations, the size of the antenna is about quarter-wavelength at 2.4 GHz. In some implementations, each antenna includes a radiating element, a feed line, and a ground stub. In some implementations, at least one of the antennas includes a second ground stub. The second ground stub is adapted to match the antenna to both 2.4 GHz and 5 GHz. In some implementations, the antenna feed is the feeding point for the 2.4 GHz and 5 GHz WiFi signal. In some implementations, the feed point is connected to the output of a WiFi chip. In some implementations, the antennas include two identical IFA antennas. Both antennas are attached to the speaker 1106.

In some implementations, at least one of the antennas includes a second type of antenna having a first radiating element, a second radiating element, a first ground stub, and second ground stub. In some implementations, the size of the first radiating element is around quarter wavelength of 5 GHz. In some implementations, the resonance frequency at 2.4 GHz is determined by: (i) the size of the second radiating element, (ii) the position of the first ground stub, and (iii) the position of the second ground stub. In some implementations, the first ground stub is placed at a pistol end of the second radiating element. In some implementations, the second ground stub is between the first radiating element and the first ground stub. In some implementations, the position where second ground stub is attached to the second radiating element is adjusted to tune to the resonant frequency at 2.4 GHz. In some implementations, the first ground stub not only acts as part of the antenna, but also a shielding element that can reduce coupling coming from the left-handed side of the first ground stub. In some implementations, the second ground stub is also a shielding element to further reduce the coupling coming from the left handed side of the antenna. In some implementations, the second type of antenna includes more than two ground stubs. By using more ground stubs the antenna's physical size can be enlarged while maintaining the same resonant frequency (e.g., 2.4 GHz). In some implementations, the first and second ground stubs are on the right-handed side of the first radiating element to reduce coupling coming from the right-handed side. In some implementations, the antennas include one or more antennas of a first type (e.g., IFAs) and one or more antennas of the second type.

By using a set of antennas including both a first type of antenna (e.g., an IFA) and the second type of antenna, two antennas can be positioned in a tight space while maintaining both good efficiency and good isolation between them. This enables the doorbell camera 106 to be compact without compromising the quality of wireless connectivity. In some implementations, both the first and second types of antennas are manufactured by conventional FPC technology with low cost. Unlike an antenna system relying on a decoupling system to achieve a similar isolation level, the IFA and second type antennas can be optimized and/or tuned independently.

In some implementations, the antennas are configured to enable the doorbell camera 106 to wirelessly communicate with one or more other electronic devices, such as a hub device 180, a smart device 204, a client device 220, and/or a server system 164.

Waterproof Button Assemblies

Figure 12A:
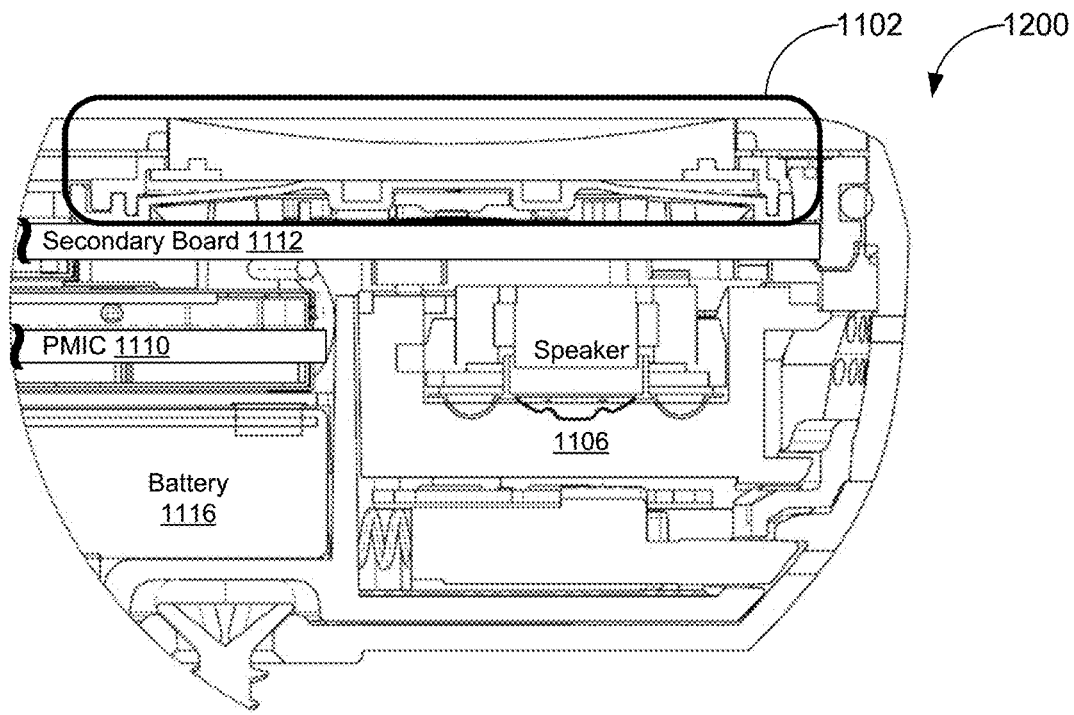
FIGS. 12A and 12B are cross sectional views of a waterproof button assembly and a waterproof reset button assembly disposed within a device housing of a doorbell camera in accordance with some implementations, respectively.
Figure 12B:
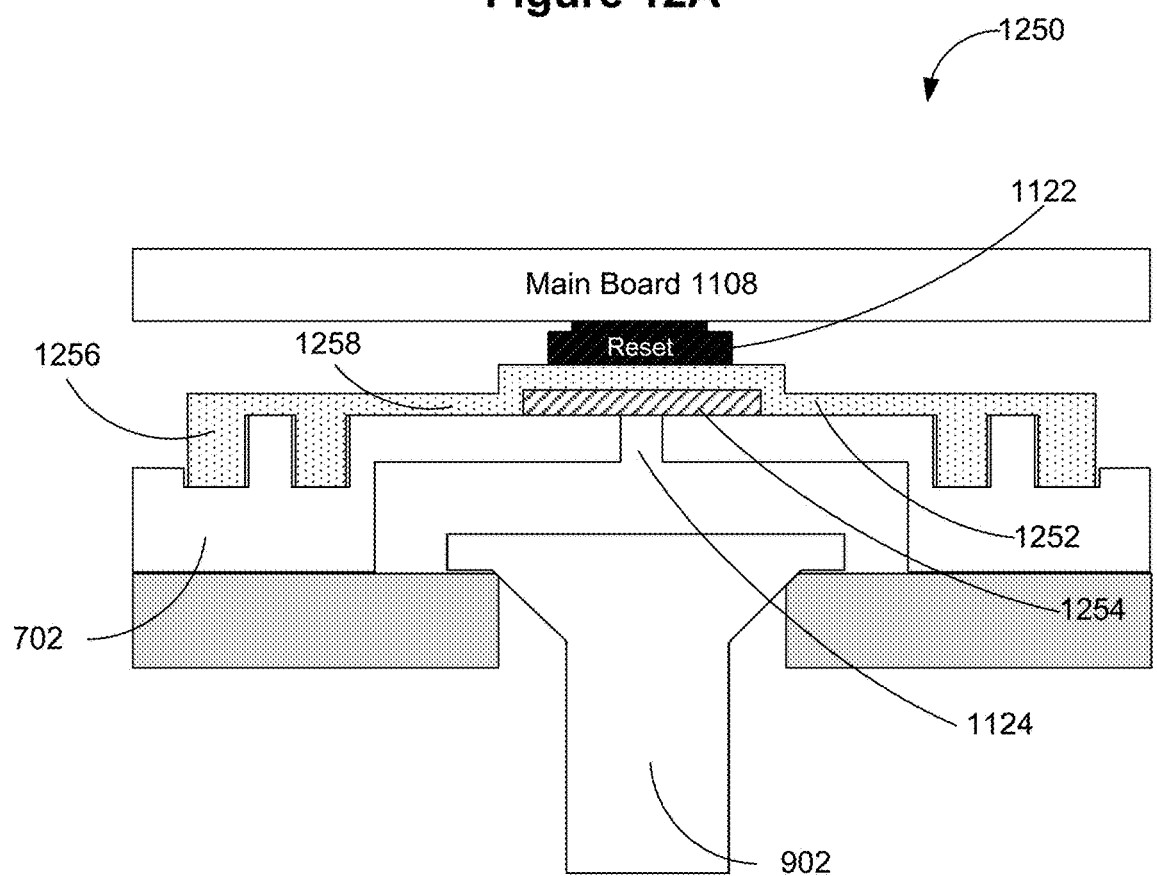

FIGS. 12A and 12B are cross sectional views of a waterproof button assembly 1102 and a waterproof reset button assembly 1250 disposed within a device housing 702 of a doorbell camera 106 in accordance with some implementations. The water button assembly 1102 is disposed in proximity to the front cover plate 708 with a button top exposed at a button opening 710 of the front cover plate 708. In an example, the waterproof button assembly 1102 sits on top of and straddles a board stack (including boards 1108-1112) and a speaker 1106. Alternatively, in some implementations shown in FIG. 12A, the waterproof button assembly 1102 sits on top of the secondary board 1112 that extends to the top of the speaker 1106. The secondary board 1112 further includes a button interface circuit coupled to the button assembly 1102 to detect a user press on the button assembly 1102. More details on an example of the waterproof button assembly 1102 are discussed below with reference to FIGS. 13A-13D.

Referring to FIG. 12B, the waterproof reset button assembly 1250 is formed between the sensor board 1108 and the device housing 702. The reset button assembly 1250 includes a reset button 1122, a flexible gasket 1252 and a button top 1254. The reset button 1122 is mounted on a rear surface of the sensor board 1108, and initiates resetting electrical functions of the doorbell camera 106 in response to a user press on the reset button 1122. The flexible gasket 1252 is mounted between the reset button 1122 and the button top 1254. Optionally, the button top 1254 is substantially rigid, and the flexible gasket 1252 deflects in response to a press on the button top 1254. The device housing 702 includes a reset opening 1124 that is aligned with and provides an access to the button top 1254 of the reset button assembly 1250. Optionally, the reset opening 1124 is located in one of the second recess 724B or the third recess 724C.

Figure 13A:
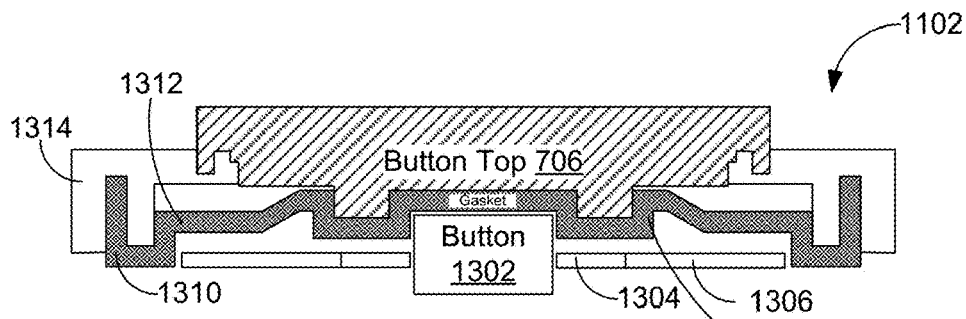
FIGS. 13A and 13B are a cross sectional view and a top view of a waterproof button assembly in accordance with some implementations, respectively.
Figure 13B:
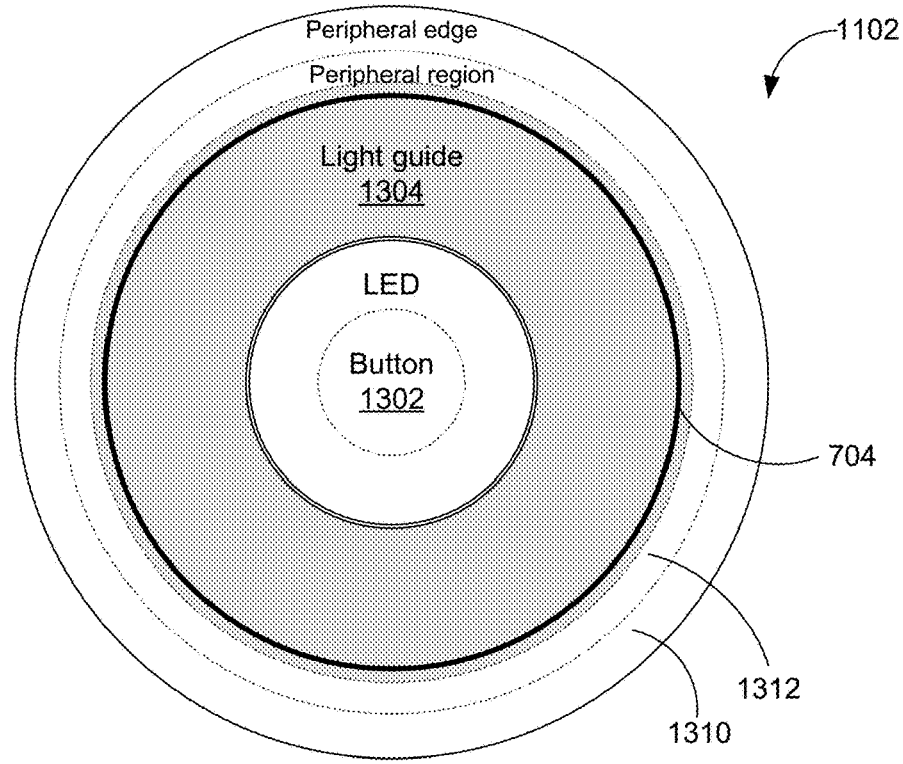

In some implementations as shown in FIG. 13B, the button top 1254 has an area that is substantially greater than that of the reset opening 1124. The flexible gasket 1254 has an area that is substantially greater than that of the button top 1254, such that the button top 1254 is wrapped between the flexible gasket 1254 and the device housing 702. A peripheral edge 1256 of the flexible gasket 1254 makes a watertight seal with a rear interior surface of the device housing 702. Specially, in an example, the peripheral edge 1256 interlocks with the rear interior surface of the device housing 702. For example, the peripheral edge 1256 of the flexible gasket 1258 has a first set of protrusions (e.g., having a first serrated cross section). The rear interior surface of the device housing 702 has a second set of protrusions (e.g., having a second serrated cross section) that are complementary to the first set of protrusions, such that when the flexible gasket 1252 is disposed onto and comes into contact with the rear interior surface of the device housing 702, the peripheral edge 1256 and the device housing interlock with each other to form the water tight seal for the reset button assembly 1250. In some implementations, the peripheral edge 1256 of the flexible gasket 1252 and the rear interior surface of the device housing 702 are sealed with waterproof adhesive independently of whether the first and second sets of protrusions are used. Additionally, in some implementations, a peripheral region 1258 of the flexible gasket 1254 that is adjacent to the peripheral edge 1254 may also make a watertight seal with the rear interior surface of the device housing 702.

In some implementations, the button top 1254 is aligned with the reset button 1122, i.e., located directly under the reset button 1122. Alternatively, in some implementations, the button top 1254 is offset from the reset button 1122, and a force transfer structure (e.g., a cantilever beam) is applied to transfer first force applied to the button top 1254 to second force applied onto the reset button 1122.

Figure 13C:
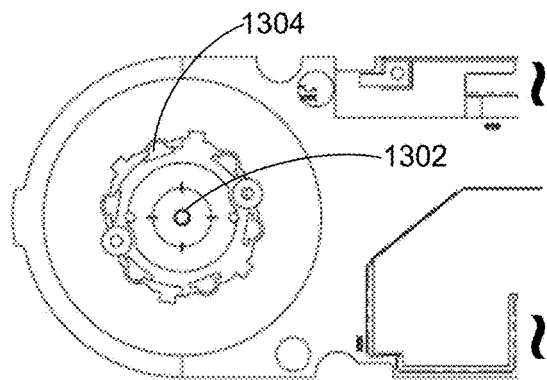
FIG. 13C is part of a waterproof button assembly that is pre-assembled onto a printed circuit board (e.g., the secondary board) configured to be disposed directly under a front cover plate of a doorbell camera in accordance with some implementations.
Figure 13D:
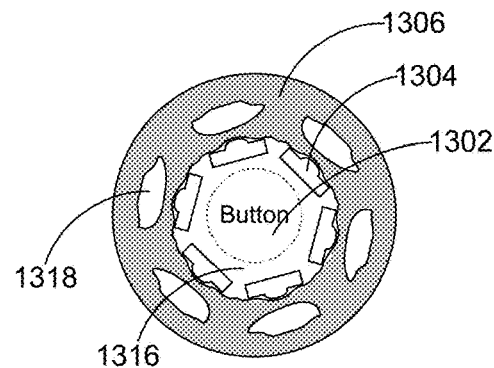
FIG. 13D is a button structure, a plurality of LEDs and a light guide component that are disposed in a concentric configuration within the button assembly in accordance with some implementations.

FIGS. 13A and 13B are a cross sectional view and a top view of a waterproof button assembly 1102 in accordance with some implementations, respectively. FIG. 13C is part of a waterproof button assembly 1102 that is pre-assembled onto a printed circuit board (e.g., the secondary board 1112) configured to be disposed directly under a front cover plate 708 of a doorbell camera 106 in accordance with some implementations. FIG. 13D is a button structure 1302, a plurality of LEDs 1304 and a light guide component 1306 that are disposed in a concentric configuration within the button assembly 1102 in accordance with some implementations. In some implementations, each of the plurality of LEDs 1304 includes a full color LED made of a set of LEDs having distinct colors (e.g., a green LED, a blue LED and a red LED). The waterproof button assembly 1102 includes a button top 706, a flexible gasket 1308, and the button structure 1302 (also called "switch"). The flexible gasket 1308 is mounted below the button top 706, and is configured to deflect (e.g., in a downward direction into the device housing 702) in response to a press on the button top 706 of the button assembly 1102. The button structure 1302 mounted below a center region of the flexible gasket 1308 and configured to be actuated in response to the press on the button top 706. The button structure 1302 is electrically coupled to a button interface circuit that generates a control signal in response to actuation of the button structure 1302 at a time of the user press on the button top 706. The button interface circuit is optionally integrated on the secondary board 1112. Optionally, the button structure 1302 is mounted on the secondary board 1112 that is configured to provide mechanical support to the button assembly 1102.

The flexible gasket 1308 has a top surface impermeable to water and one or more edges that extend beyond sides of the button top 706. The edges of the flexible gasket 1308 including a first peripheral edge 1310 and a peripheral region 1312 located in proximity to the first peripheral edge 1310. The first peripheral edge 1310 of the flexible gasket 1308 makes a water tight seal with a second edge 1314 of the button opening 710 of the front cover plate 708, thereby preventing water from entering the device housing 702 from an interface between the button assembly 1102 and the device housing 702. Specifically, in some implementations, the first peripheral edge 1310 of the flexible gasket 1308 interlocks with the second edge 1314 of the button opening 710 of the front cover plate 708. More specifically, in an example, the first peripheral edge 1310 of the flexible gasket 1308 has a first serrated cross section, and the second edge 1314 of the button opening 710 of the front cover plate 708 has a second serrated cross section that is complementary to the first serrated cross section. Alternatively, in another example, the first peripheral edge 1310 includes a first set of protrusions, and the second edge 1314 includes a set of protrusions that are offsets from the first set of protrusions and can be inter-crossed with the first set of protrusions like fingers. When the flexible gasket 1308 is disposed onto and comes into contact with the button opening 710 of the front cover plate 708, the first peripheral edge 1310 and the second edge 1314 interlock with each other to form the watertight seal for the button assembly 1102.

In some implementations, the front cover plate 708 is made of a single piece of material, and the second edge 1314 is part of the single piece of material. Alternatively, in some implementations, the second edge 1314 is formed from a separate piece of material from the front cover plate 708, but is securely coupled to the front cover plate 708 to create the button opening 710 on the front cover plate 708.

In some implementations, the first peripheral edge 1310 of the flexible gasket 1308 and the second edge 1314 of the button opening 710 of the front cover plate 708 are sealed with waterproof adhesive (e.g., glue). Optionally, the glue is used to seal the first peripheral edge 1310 and the second edge 1314 directly when these two edges do not have interlocking structures (e.g., protrusions and serrated edges). Optionally, the waterproof adhesive is used to seal the first peripheral edge 1310 and the second edge 1314 in addition to interlocking structures (e.g., protrusions and serrated edges).

Light Ring Display

Further, in some implementations, the waterproof button assembly 1102 is configured to display a color at the peripheral region 1312 of the flexible gasket. The peripheral region 1312 of the flexible gasket is substantially transparent to visible light. To display the color, the button assembly 1102 further includes the plurality of LEDs 1304 and the light guide component 1306. The plurality of LEDs 1304 are mounted below the flexible gasket and in proximity to the button structure 1302. The light guide component 1306 is mounted below the flexible gasket 1308 and in proximity to the plurality of LEDs 1304. The light guide component 1306 is configured to distribute light of the LEDs 1304 to the peripheral region 1312 of the flexible gasket 1308, such that the color of light of the LEDs 1304 is displayed at the peripheral region 1312 to a user who is near the doorbell camera 106. Specifically, in some implementations, each of the plurality of LEDs 1304 includes a full color LED. The light guide component 1306 may mix colored light from color LEDs (e.g., green, blue and red LEDs) of each full color LED 1304 while guiding the light of the full color LEDs 1304 to the peripheral region 1312 of the flexible gasket 1308, and a predetermined color (e.g., white color) is displayed substantially uniformly in the peripheral region 1312 of the flexible gasket 1308. In this example, the array of fully color LEDs 1304 and the light guide component 1306 are covered by and concealed under the flexible gasket 1308, and not visible from the exterior of the doorbell camera 106.

Referring to FIG. 13D, the button structure 1302, the plurality of LEDs 1304 and the light guide component 1306 are disposed in a concentric configuration. The button structure 1302 is surrounded by the plurality of LEDs 1304, and the plurality of LEDs 1304 are further surrounded by the light guide component 1306. In this implementation shown in FIG. 13D, the light guide component 1306 is made of a single piece of material that passes visible light. The light guide component 1306 includes a central opening 1316 that contains the button structure 1302 and the plurality of LEDs 1304. Further, the light guide component 1306 may further include one or more alternative openings 1318 surrounding the central opening 1316, and each alternative opening 1318 corresponds to at least one full color LED and has a shape configured according to locations of color LEDs of the at least one full color LED. Optionally, each of the one or more alternative openings 1318 has an asymmetric shape. In some implementations, each of the plurality of LEDs 1304 includes a full color LED, and the colors of the color LEDs of each full color LED 1304 are mixed by the respective asymmetric alternative opening 1318, such that a color (e.g., white color) is displayed at the peripheral region 1312 of the waterproof button assembly 1102. In some implementations, the peripheral region 1312 of the button assembly 1102 has a shape of a circular ring, thereby allowing the light of the full color LEDs to be displayed according to the shape of the circular ring.

In some implementations, the light guide component 1306 is partially transparent. In some implementations, the light guide component 1306 is substantially flat and thin, and has a thickness smaller than a predetermined guide thickness. For example, the predetermined guide thickness is 1 mm, and the light guide component 1306 is thinner than 1 mm. Optionally, the light guide component 1306 includes a single piece of material distributing light for each and every one of the plurality of LEDs 1304. Optionally, the light guide component 1306 includes a plurality of discrete light guide parts each of which is configured to distribute light for a subset of the LEDs 1304 (e.g., each light guide part is configured to distribute light for a single full color LED including a number of color LEDs).

It is noted that in some implementations, the waterproof button assembly 1102 further includes a support assembly coupled to the flexible gasket 1308 and configured to provide mechanical support to the flexible gasket 1308 and release stress on the waterproof button assembly 1102. Alternatively, in some implementations, no additional support assembly is used, and one or more of the button structure 1302, the LEDs 1304 and the light guide component 1306 provide the mechanical support to the flexible gasket 1308.

Examples of the predetermined color displayed at the peripheral region 1312 of the flexible gasket 1308 of the button assembly 1102 include, but are not limited to, white, yellow, green, blue and red. FIGS. 14A-14E are front views of a doorbell camera 106 that displays a light ring 1402 having a color of white, yellow, green, blue and red in accordance with some implementations, respectively. The light ring 1402 is formed in the peripheral region 1312 of the flexible gasket 1308, when the light guide component 1306 distributes light of the LEDs 1304 to the peripheral region 1312 of the flexible gasket 1308. The doorbell camera 106 is configured to detect user presses on the button assembly 1102, and collect audio and video inputs from an environment in proximity to the doorbell camera 106. The user presses and the audio/video inputs are processed to determine a state of the processing. The doorbell camera 106 then identifies a respective predetermined LED illumination specification association with the determined processing state. The illumination specification includes one or more of an LED illumination duration, pulse rate, duty cycle, color sequence and brightness. In accordance with the identified LED illumination specifications of the LEDs 1304, the doorbell camera 106 synchronizes illumination of the array of LEDs 1304 to provide a visual pattern on the light ring 1402 surrounding the button top 706, indicating the determined processing state. Specifically, the visual pattern displayed in the light ring 1402 includes a start segment, a loop segment and a termination segment, and the loop segment lasts for a length of time associated with the LED illumination durations of the LEDs and configured to match a length of the determined processing state of the doorbell camera 106.

In some implementations, the determined processing state is selected from a plurality of predefined doorbell processing states including, but not limited to, determining that a person is approaching the doorbell camera 106, detecting a press on the button assembly 1102, receiving a talkback from the speaker 1106, sending an audio message via the microphone 1104, and establishing communication with the doorbell camera 106. The illumination specifications of the LEDs 1304 are defined to uniquely represent each of the plurality of predefined doorbell processing states. In some implementations, the doorbell camera 106 does not include any display screen, and the visual pattern displayed at the peripheral region 1312 (i.e., the light ring 1402) provides to a person approaching the doorbell camera information concerning the determined processing state of the doorbell camera 106.

For example, the doorbell camera 106 determines that a person is approaching the camera 106 based on video images captured from a field of view of the camera 106, and the visual pattern is displayed at the peripheral region 1312 of the button assembly 1102 in accordance with the determination that the object is approaching the camera 106. Further, in some implementations, the visual pattern is displayed with a brightness that varies as the person is approaching the camera 106, and specifically, the brightness of the light ring 1402 is associated with a distance of the person to the doorbell camera 106. In some implementations, the visual pattern is displayed at the peripheral region 1312 in response to recognition of a predetermined gait of a person approaching or standing in front of the doorbell camera 106 (e.g., a lift of a hand to pressing the button top 706) from an image captured from the field of view by the doorbell camera 106.

Additionally, in some implementations, the visual pattern is displayed at the peripheral region 1312 in response to recognizing a predetermined face from an image captured from the field of view by the doorbell camera 106. Stated another way, it is determined that the processing state of the doorbell camera 106 is associated with one of a plurality of users, and at least one of the predetermined LED illumination specifications of the LEDs 1304 are customized according to an identity of the one of the plurality of users. Thus, the visual pattern displayed in the light ring 1402 indicates the identity of the one of the plurality of users.

In some implementations, an array of full color LEDs 1304 is divided into a plurality of diode groups that are alternately arranged and configured to be lit sequentially, and diodes in each of the plurality of diode groups are lit with different colors. Alternatively, in some implementations, in accordance with a determination that the determined processing state is a listening state that occurs when the doorbell camera 106 is actively receiving the voice inputs from the environment and providing received voice inputs to a remote server, all full color LEDs 1304 are lit up with a single color, and each full color LED 1304 illuminates with different and varying brightness.

In some implementations, in accordance with a determination that the processing state is a responding state that occurs when the doorbell camera 106 broadcasts a voice message in response to the voice inputs received from a remote user, the full color LEDs 1304 are lit up with a single color, and variation of the brightness of each of the subset of the fully color LEDs is consistent with a voice speed associated with the voice inputs from the remote user.

It is further noted that in some implementations, the visual pattern displayed in the light ring 1402 has more than one color concurrently displayed by different full color LEDs of the array of color LEDs. For example, the more than one color includes a predetermined set of colors, e.g., Google brand colors (blue, green, yellow and red). The array of full color LEDs is divided into four quadrants each associated with one of the Google brand colors, such that the Google brand colors are uniformly distributed and displayed at different portions of the light ring 1402.

In some implementations, light in the light ring 1402 is created by a plurality of visible light illuminators (e.g., a plurality of full color LEDs 1304) and circuitry for powering and/or operating the visible light illuminators. In some implementations, the light guide component 1306 is adapted to direct light from the visible light illuminators to a periphery of a button top and out the face of the doorbell camera 106. In some implementations, the light guide component 1306 is adapted to prevent light from the visible light illuminators from entering the image sensor array 1114. In some implementations, the light guide component 1306 is adapted to spread the light from the visible light illuminators in a substantially even manner. In some implementations, the light guide component 1306 is composed of a clear material. In some implementations, the light guide component 1306 is composed of a poly-carbonite material. In some implementations, the light guide component 1306 has a plurality of dimples to refract the light from the illuminators and prevent the light from entering the image sensor array 1114. In some implementations, the light guide component 1306 is adapted to provide more uniform color and light output to a user from the illuminators. In some implementations, the light guide component 1306 includes a plurality of discrete parts, each part corresponding to a visible light illuminator.

In some implementations, the light guide component 1306 is also adapted to diffuse the light from the visible light illuminators. In some implementations, the light ring 1402 (and corresponding elements such as the light guide component 1306) causes a circular colored (or white) light to be emitted from the front of the camera 118 (e.g., from the peripheral region 1312 surrounding the button top 704).

It is noted that in addition to the light ring 1402, a light ring can be formed around a periphery of the lens assembly 704 or around a periphery of the front cover plate 708 for displaying a visual pattern to a visitor approaching or standing close to the doorbell camera 106. Specifically, in some implementations, visible light illuminators, light guide and diffuser, and corresponding light are arranged around the periphery of the front cover plate 708. They may encircle all or substantially all elements of the doorbell camera 106, such as the image sensor array 1114, the IR illuminators 1105, the ambient light sensor 714, a status LED, and the microphone apertures 716. In other implementations, the light ring 1402 is arranged not around the periphery of the doorbell camera 106 but rather around only the periphery of a cover glass of the lens assembly 704. In yet other implementations, they do not surround any front-facing element of the doorbell camera 106. In some implementations, they are arranged in a non-circular shape, such as a square, oval, or polygonal shape. In some implementations, they are not arranged on the front of the device but rather a different surface of the device, such as the bottom, top, sides, or back. In some implementations, multiple such light rings and components are arranged onto the same or different surfaces of the doorbell camera 106.

The light ring 1402 (and corresponding elements) may operate to indicate a status of the doorbell camera 106, another device within or outside of the smart home environment 100 (e.g., another device communicatively coupled either directly or indirectly to the camera 118), and/or the entire connected smart home environment 100 (e.g., system status). The light ring 1402 (and corresponding elements) may cause different colors and/or animations to be displayed to a user that indicate such different statuses.

For example, in the context of communicating status, when the doorbell camera 106 is booting for the first time or after a factory reset, the ring 1402 may pulse blue once at a slow speed. When the doorbell camera 106 is ready to begin setup, the ring may breathe blue continually. When the doorbell camera 106 is connected to a remote cloud service and provisioning is complete (i.e., the camera is connected to a user's network and account), the ring may pulse green once. When there is a service connection and/or provisioning failure, the ring may blink yellow at a fast speed. When the doorbell camera 106 is being operated to facilitate two-way talk (i.e., audio is captured from the audio and communicated to a remote device for output by that remote device simultaneously with audio being captured from the remote device and communicated to the doorbell camera 106 for output by the doorbell camera 106), the ring may breathe blue continuously at a fast speed. When the doorbell camera 106 is counting down final seconds before a factory reset, the ring 1402 may close on itself at a rate equal to the time until reset (e.g., five seconds). When the doorbell camera 106 has been factory and while the setting are being erased, the ring 1402 may rotate blue continuously. When there is insufficient power for the doorbell camera 106, the ring 1402 may blink red continuously at a slow speed. The visual indications are optionally communicated simultaneously, concurrently, or separately from audio indications that signal to the user a same or supplemental message. For example, when the doorbell camera 106 is connected to a remote cloud service and provisioning is complete (i.e., the camera is connected to a user's network and account), the ring 1402 may pulse green once and output an audio message that "remote cloud service and provisioning is complete."

Additionally or alternatively, the doorbell camera 106 may communicate the status of another device in communication with the doorbell camera 106. For example, when a hazard detector 104 detects smoke or fire sufficient to alarm, the doorbell camera 106 may output a light ring that pulses red continuously at a fast speed. When a hazard detector 104 detects smoke or fire sufficient to warn a user but not alarm, the doorbell camera 106 may output a light ring that pulses yellow a number of times. When a visitor engages the doorbell camera 106, the doorbell camera 106 may output a light ring depending on the engagement; e.g., if the smart doorbell 106 detects motion, the doorbell camera 106 may output a yellow light ring, if a user presses the doorbell button on the doorbell, the doorbell camera 106 may output a green light ring. In some implementations, the doorbell camera 106 may enable audio communication between a user and a visitor, in which case an animation and/or color of the light ring may change depending on whether the user is speaking to the visitor or not through the doorbell camera 106 or another device.

Additionally or alternatively, the doorbell camera 106 may communicate the cumulative status of a number of network-connected devices in the smart home environment 100. For example, a smart alarm system 122 may include proximity sensors, window break sensors, door movement detectors, etc. A whole home state may be determined based on the status of such a plurality of sensors/detectors. For example, the whole home state may be secured (indicating the premises is secured and ready to alarm), alarming (indicating a determination that a break-in or emergency condition exists), or somewhere in between such as pre-alarming (indicating a determination that a break-in or emergency condition may exist soon or unless some condition is satisfied). For example, the doorbell camera 106 light ring may pulse red continuously when the whole home state is alarming, may pulse yellow when the whole home state is pre-alarming, and/or may be solid green when the whole home state is secured. In some implementations, such visual indications may be communicated simultaneously (or separately from) with audio indications that signal to the user the same or supplemental message. For example, when the whole home state is alarming, the ring may pulse red once and output an audio message that indicates the alarm "alarm". In some implementations, the audio message may provide supplemental information that cannot be conveyed via the light ring. For example, when the whole home state is alarming due to a basement window being broken, the audio message may be "alarm—your basement window has been broken." For another example, when a pre-alarm amount of smoke has been detected by a hazard detector 104 located in the kitchen, the audio message may be "warning—smoke is detected in your kitchen."

In some implementations, the doorbell camera 106 may also or alternatively have a status LED. Such a status LED may be used to less-instructively communicate doorbell camera 106, other device, or multiple device status information. For example, the status light may be solid green during initial setup, solid green when streaming video and/or audio data normally, breathing green when someone is watching remotely, solid green when someone is watching remotely and speaking through the doorbell camera 106, and off when the doorbell camera 106 is turned off or the status LED is disabled. It should be appreciated that the status LED may be displayed simultaneously with the light ring 1402. For example, the status LED may be solid green during setup while the light ring breathes blue, until the end of setup when the device is connected to the service and provisioning is complete whereby the status LED may continue to be solid green while the light ring switches to a single pulse green.

Additional Features on a Front of a Doorbell Camera

Figure 15:
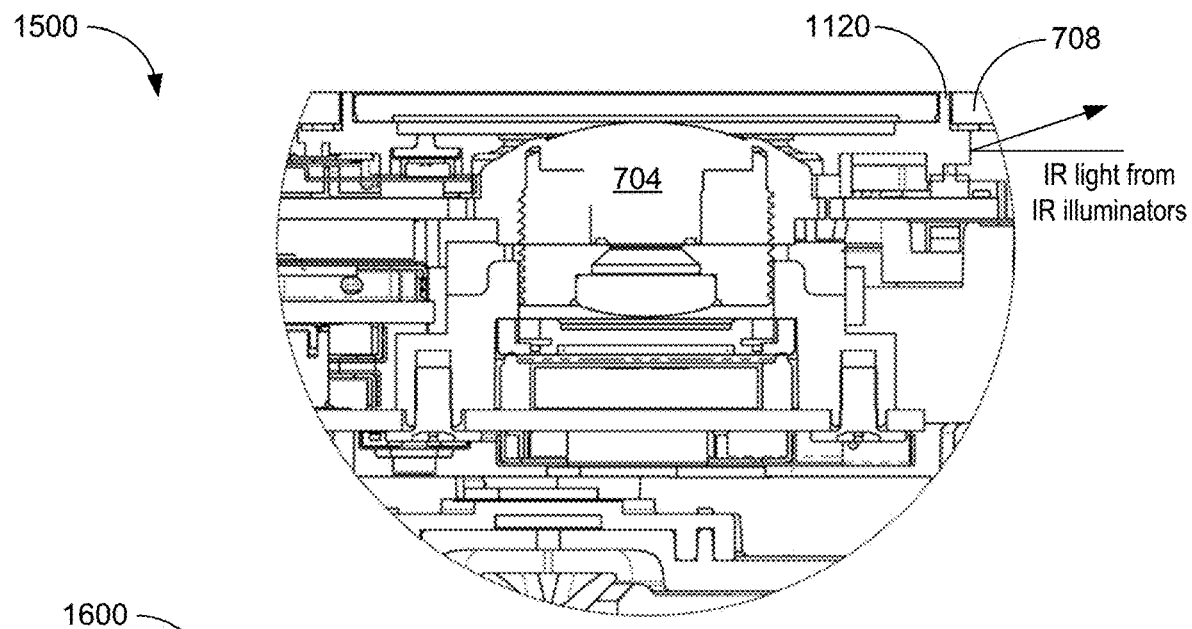
FIG. 15 is a cross sectional view of a lens assembly disposed within a device housing of a doorbell camera in accordance with some implementations.

FIG. 15 is a cross sectional view 1500 of a lens assembly 704 disposed within a device housing 702 of a doorbell camera 106 in accordance with some implementations. The lens assembly 704 is disposed in a camera opening 712 of a front cover plate 708, and configured to collect light from a field of view of the doorbell camera 106. Another array of IR illuminators 1105 are also disposed under the front cover plate 708, and configured to face the field of view, such that the IR illuminators 1105 can illuminate the field of view when an ambient light level is substantially low. Image sensors of the doorbell camera 106 are inherently sensitive to light, and components for manipulating the light from the camera's illuminators are applied to keep light from the camera's illuminators, visible or infrared, from entering the camera image sensors and thereby prevent wash out or anomalies in the captured images. Specifically, the lens assembly 704 is supported by a lens holder 1120 within the device housing 702, and the lens holder 1120 has a top edge raised towards the front cover plate 708 for blocking the infrared light generated by the array of IR illuminators 1105 from entering the lens assembly 704 directly.

In addition, a support structure is optionally coupled between an interior rear surface of the front cover plate and an interior bottom surface of the device housing and configured to maintain a separation therebetween. Electronic components and the lens assembly 704 enclosed in the device housing 702 are protected from mechanical pressure when movement of the button top 706 exceeds a predetermined displacement or when the front cover plate 708 is inadvertently pressed. In some implementations, the support structure includes the lens holder 1120 configured to protect the electronic components and the lens assembly 704 from unexpected or excessive forces on the doorbell camera 106.

Figure 16:
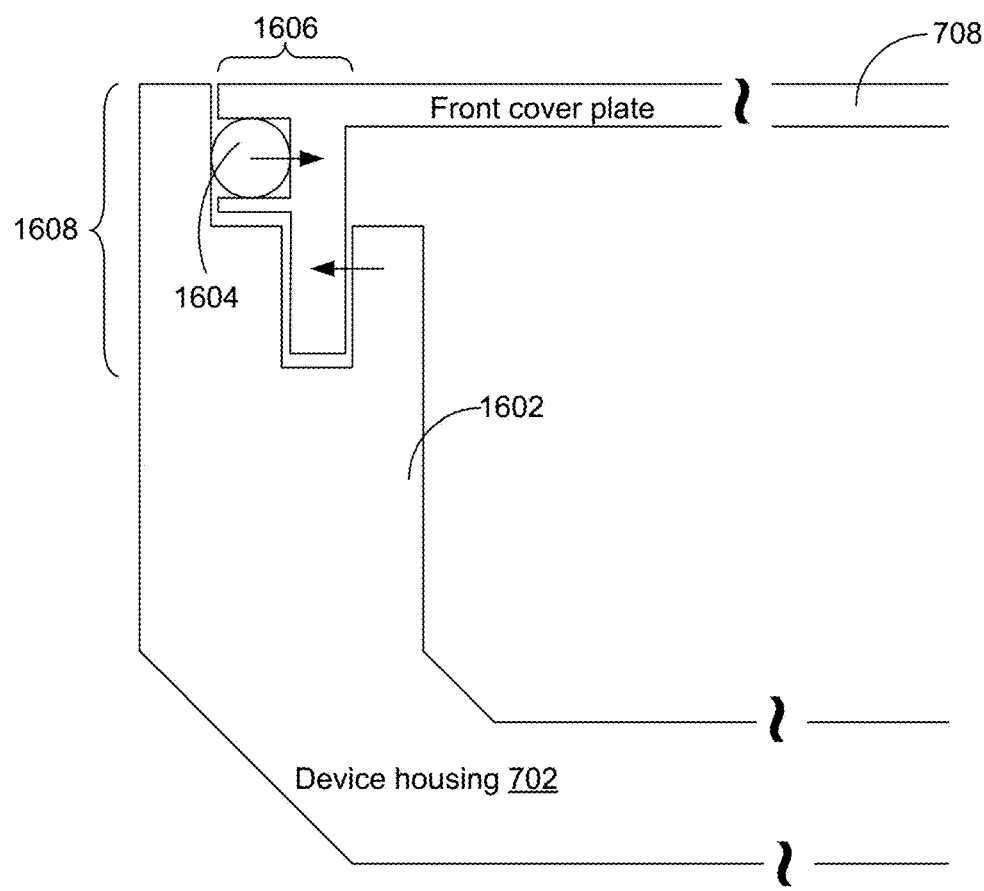
FIG. 16 is a cross sectional view of a waterproof interface formed between a front cover plate and a body of a device housing of a doorbell camera in accordance with some implementations.

FIG. 16 is a cross sectional view 1600 of a waterproof interface formed between a front cover plate 708 and a body of a device housing 702 of a doorbell camera 106 in accordance with some implementations. The front cover plate 708 and the body 1602 of the device housing 702 are mechanically coupled to each other via an elastic sealing structure 1604. The front cover plate 708 may further include a flexible edge structure 1606 that extends in a direction perpendicular to a planar surface of the front cover plate 708. The flexible edge structure 1606 is configured to hold the elastic sealing structure 1604. The body 1602 of the device housing 702 may include a complementary edge structure 1608 configured to mate with the flexible edge structure 1606. In a specific example, the elastic sealing structure 1604 includes an O-ring (i.e., a mechanical gasket in the shape of a torus). The O-ring includes a loop of elastomer with a round cross-section, and fits into the flexible edge structure 1606. The O-ring may wrap around the periphery of the front cover plate 708. When the front cover plate 708 is compressed onto the body 1602 of the device housing, the complementary edge structure 1608 creates a first force squeezing the O-ring and the flexible edge structure 1606 towards a center of the front cover plate until the flexible edge structure 1606 bumps onto the complementary edge structure 1608 of the body 1602 of the device housing. The complementary edge structure 1608 applies a second force pushing the flexible edge structure 1606 away from the center of the front cover plate 708, thereby balancing off the first force. By these means, a water tight seal is formed between the front cover plate 708 and the body 1602 of the device housing 702 due to the use of the elastic sealing structure 1604 (e.g., the O-ring).

Although the implementations are described as including particular numbers of components (e.g., 1 microphone, 2 antennas, 12 IR illuminators, 6 full color LEDs etc.), these numbers are not intended to be limiting. The number of these components is optionally varied, from zero or one to many (e.g., 4, 6, or 10) in different implementations, as would be apparent to one skilled in the art based on technical, aesthetic, and/or budgetary requirements and/or preferences.

For situations in which the systems discussed above collect information about users, the users may be provided with an opportunity to opt in/out of programs or features that may collect personal information (e.g., information about a user's preferences or usage of a smart device). In addition, in some implementations, certain data may be anonymized in one or more ways before it is stored or used, so that personally identifiable information is removed. For example, a user's identity may be anonymized so that the personally identifiable information cannot be determined for or associated with the user, and so that user preferences or user interactions are generalized (for example, generalized based on user demographics) rather than associated with a particular user.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, mechanical structures, circuits, and networks have not been described in detail so as not to unnecessarily obscure aspects of the implementations.

It will also be understood that, although the terms first, second, etc. are, in some instances, used herein to describe various elements, these elements should not be limited by these terms. These terms are only used to distinguish one element from another. For example, a first fastener structure can be termed a second fastener structure, and, similarly, a second fastener structure can be termed a first fastener structure, without departing from the scope of the various described implementations. The first fastener structure and the second fastener structure are both fastener structures, but they are not the same fastener structure.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, components, structures and/or groups, but do not preclude the presence or addition of one or more other features, integers, steps, operations, elements, components, structures, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is noted that the camera doorbells described herein are exemplary and are not intended to be limiting. For example, any dimensions, shapes, styles, and/or materials described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

What is claimed:

1. A doorbell device, comprising:
   a device housing having an elongated shape with a first rounded end and a second rounded end opposite the first rounded end, wherein the device housing further includes a top half portion having the first rounded end and a bottom half portion extending from the top half portion and having the second rounded end;
   a button assembly positioned in the bottom half portion of the device housing and near the second rounded end, wherein the button assembly includes a button top and a light ring assembly, and the light ring assembly is configured to display a light ring surrounding the button top, and wherein the button assembly is configured to initiate at least one of a chime and a wireless notification message in response to a press on the button top;
   a camera module positioned in the top half portion of the device housing and near the first rounded end; and
   a mounting plate having a first open slot and a second open slot that are perpendicular to each other, each of the first and second open slots being configured to receive a body of a fastener and block an enlarged head of the fastener, wherein when the mounting plate is being mounted to a surface, the respective fasteners are fastened onto the surface, thereby holding the mounting plate to the surface, and a position of the mounting plate is adjustable by moving the mounting plate, including the first and second open slots, with respect to the respective fasteners,
   wherein the doorbell device is configured to activate a first camera mode when the doorbell device does not detect any press on the button top, and the doorbell device is coupled to a bypass unit configured to electrically couple the doorbell device to a remote transformer and bypass a remote chime device at the first camera mode.

2. The doorbell device of claim 1, wherein the device housing includes a front cover plate having a bottom opening located near the second rounded end, and the button top is exposed from the bottom opening, and wherein the device housing has a preferred mounting orientation in which a lens assembly of the camera module is located above the button assembly such that a field of view of the camera module remains clear when a user press is applied on the button top of the button assembly.

3. The doorbell device of claim 2, wherein the front cover plate further includes a top opening located near the first rounded end, and the lens assembly is exposed from the top opening, and the top opening has a dimension that is substantially equal to that of the bottom opening.

4. The doorbell device of claim 3, wherein:
   the button assembly includes a flexible gasket mounted below the button top;
   the flexible gasket is configured to deflect in response to a press on the button top of the button assembly;
   the flexible gasket has a top surface impermeable to water and edges that extend beyond sides of the button top to form a first generally watertight seal with a second edge of the bottom opening of the front cover plate; and
   the lens assembly includes a cover glass and edges that form a second generally watertight seal with a third edge of the top opening of the front cover plate.

5. The doorbell device of claim 1, wherein each of the first and second rounded ends has a semicircular shape with a diameter, and the elongated shape of the device house has a width that is substantially equal to the diameter of the first and second rounded ends.

6. The doorbell device of claim 5, wherein:
   the button assembly is concentric with the semicircular shape of the second rounded end;
   a lens assembly of the camera module is concentric with the semicircular shape of the first rounded end; and
   the camera module and button assembly are separated by a distance to provide a field of view of the camera module that remains clear when a user press is applied on the button top.

7. The doorbell device of claim 1, wherein the doorbell device is configured to activate a second doorbell mode when the doorbell device detects a press on the button top, wherein the bypass unit is configured to electrically couple both the remote chime device and the doorbell device to the remote transformer at the second doorbell mode.

8. The doorbell device of claim 1, wherein:
   the doorbell device is configured to stream images captured by the camera module to a server;
   the server is configured to in accordance with detection of a user press on the button top, push the wireless notification message to a user mobile application executed on a client device communicatively coupled to the server; and the user mobile application is configured to be activated automatically to display a user interface to receive a user response in response to receiving the wireless notification message pushed into the client device.

9. The doorbell device of claim 1, wherein the device housing encloses a plurality of electronic components including a plurality of printed circuit boards (PCBs), and the plurality of PCB are arranged in parallel between an interior surface of a front cover plate and an interior bottom surface of the device housing.

10. The doorbell device of claim 1, further comprising a rechargeable battery electrically coupled to a main logic board, wherein the rechargeable battery is disposed between the main logic board and an interior bottom surface of the device housing.

11. The doorbell device of claim 10, further comprising a secondary board, wherein the secondary board is disposed under the button assembly and above the main logic board, and recessed near the first rounded end of the device housing to accommodate a lens assembly of the camera module.

12. The doorbell device of claim 10, wherein:
a rechargeable battery enclosed within the device housing, wherein the rechargeable battery is disabled from being charged in accordance with a determination that a temperature of the rechargeable battery is greater than a first threshold temperature; and
a heater disposed in proximity to the rechargeable battery, the heater being enabled to heat the rechargeable battery in accordance with a determination that the temperature of the rechargeable battery is less than a second threshold temperature, the heater being disabled from heating the rechargeable battery in accordance with a determination that the temperature of the rechargeable battery is not less than the second threshold temperature.

13. An electronic device, comprising:
a device housing having a first end and a second end opposite the first end, wherein the device housing further includes a top half portion having the first end and a bottom half portion extending from the top half portion and having the second end;
a button assembly positioned in the bottom half portion of the device housing and near the second end, wherein the button assembly includes a button top and a light ring assembly, and the light ring assembly is configured to display a light ring surrounding the button top, and wherein the button assembly is configured to initiate at least one of a chime and a wireless notification message in response to a press on the button top;
a camera module positioned in the top half portion of the device housing and near the first end; and
a mounting plate having a first open slot and a second open slot that are perpendicular to each other, each of the first and second open slots being configured to receive a body of a fastener and block an enlarged head of the fastener, wherein when the mounting plate is being mounted to a surface, the respective fasteners are fastened onto the surface, thereby holding the mounting plate to the surface, and a position of the mounting plate is adjustable by moving the mounting plate, including the first and second open slots, with respect to the respective fasteners.

14. The doorbell device of claim 1, comprising a mounting plate having an access opening, wherein the mounting plate is mechanically coupled to a rear exterior surface of the device housing via one or more fastener structures, and the access opening is configured to let through one or more electrical wires and allow the one or more electrical wires to be electrically coupled to a plurality of wire terminals of the doorbell device.

15. The electronic device of claim 13, further comprising an array of IR illuminators covered by a substantially opaque area and configured to illuminate a field of view of a lens assembly of the camera module with infrared light in a night mode.

16. A camera device, comprising:
a device housing having an elongated shape with a first end and a second end opposite the first end, wherein the device housing further includes a top half portion having the first end and a bottom half portion extending from the top half portion and having the second end;
a button assembly positioned in the bottom half portion of the device housing and near the second end, wherein the button assembly includes a button top and a light ring assembly, and the light ring assembly is configured to display a light ring surrounding the button top, and wherein the button assembly is configured to initiate at least one of a chime and a wireless notification message in response to a press on the button top;
a camera module positioned in the top half portion of the device housing and near the first end; and
a mounting plate having a first open slot and a second open slot that are perpendicular to each other, each of the first and second open slots being configured to receive a body of a fastener and block an enlarged head of the fastener, wherein when the mounting plate is being mounted to a surface, the respective fasteners are fastened onto the surface, thereby holding the mounting plate to the surface, and a position of the mounting plate is adjustable by moving the mounting plate, including the first and second open slots, with respect to the respective fasteners,
wherein the camera device is configured to activate a first camera mode when the camera device does not detect any press on the button top, and the camera device is coupled to a bypass unit configured to electrically couple the camera device to a remote transformer and bypass a remote chime device at the first camera mode.

17. The camera device of claim 16, wherein the light ring assembly includes a plurality of LEDs configured to generate the light ring surrounding the button top, and the plurality of LEDs is distributed to surround the button assembly.

18. The camera device of claim 17, wherein each LED includes a full color LED, and the light ring assembly is configured to mix colored light from color LEDs of the full color LED while guiding the light of the full color LED to a peripheral region of a flexible gasket of the button assembly, and a predetermined color is displayed substantially uniformly around the button top.

19. The camera device of claim 16, wherein the light ring has a predetermined color displayed around the button top in accordance with a determination that an object is approaching the camera device.

* * * * *